(12) United States Patent
Shah et al.

(10) Patent No.: US 9,111,658 B2
(45) Date of Patent: Aug. 18, 2015

(54) CNS-SHIELDED WIRES

(75) Inventors: Tushar K. Shah, Fulton, MD (US);
John J. Morber, Taneytown, MD (US)

(73) Assignee: Applied NanoStructured Solutions, LLC, Baltimore, MD (US)

(*) Notice: Subject to any disclaimer, the term of this patent is extended or adjusted under 35 U.S.C. 154(b) by 452 days.

(21) Appl. No.: 13/447,081

(22) Filed: Apr. 13, 2012

(65) Prior Publication Data
US 2012/0247800 A1    Oct. 4, 2012

Related U.S. Application Data

(63) Continuation-in-part of application No. 12/766,812, filed on Apr. 23, 2010.

(60) Provisional application No. 61/172,503, filed on Apr. 24, 2009, provisional application No. 61/173,435, filed on Apr. 28, 2009.

(51) Int. Cl.
| | |
|---|---|
| *H01B 7/00* | (2006.01) |
| *H01B 3/00* | (2006.01) |
| *H01B 1/24* | (2006.01) |
| *H05K 9/00* | (2006.01) |

(52) U.S. Cl.
CPC ............... *H01B 3/004* (2013.01); *H01B 1/24* (2013.01); *H05K 9/009* (2013.01)

(58) Field of Classification Search
USPC .................................. 174/36, 102 SC, 106 R
See application file for complete search history.

(56) References Cited

U.S. PATENT DOCUMENTS

| | | | |
|---|---|---|---|
| 2,883,306 A | 4/1959 | Cotter | |
| 2,883,396 A | 4/1959 | Cotter | |
| 3,580,731 A * | 5/1971 | Milewski et al. | ............... 7/249.3 |
| 4,065,592 A | 12/1977 | McAllister | |
| 4,104,083 A | 8/1978 | Hirano | |
| 4,313,084 A | 1/1982 | Hosokawa et al. | |
| 4,488,203 A | 12/1984 | Muranaka et al. | |
| 4,515,107 A | 5/1985 | Fournier et al. | |

(Continued)

FOREIGN PATENT DOCUMENTS

| | | |
|---|---|---|
| CN | 1363123 A | 8/2002 |
| CN | 1838999 A | 9/2006 |

(Continued)

OTHER PUBLICATIONS

Ago, et al., "Colloidal Solution of Metal Nanoparticles as a Catalyst for Carbon Nanotube Growth", Proceedings Materials Research Society, Fall 2000, pp. A13.18.1-A13.18.5, vol. 633, Materials Research Society.

(Continued)

*Primary Examiner* — Chau N Nguyen
(74) *Attorney, Agent, or Firm* — McDermott Will & Emery LLP

(57) ABSTRACT

A shielded wire includes a carbon nanostructure (CNS)-shielding layer including a CNS material in a matrix material, the CNS-shielding layer being monolithic and disposed about a dielectric layer and a conducting wire, wherein the dielectric layer is disposed between the CNS-shielding layer and the conducting wire. An extruded thermoplastic jacket includes a CNS material, the extruded thermoplastic jacket being configured to protect at least one wire. A thermoplastic article includes a CNS-infused fiber material and a flexible thermoplastic.

11 Claims, 20 Drawing Sheets

(56) References Cited

U.S. PATENT DOCUMENTS

| | | | |
|---|---|---|---|
| 4,530,750 A | 7/1985 | Aisenberg et al. | |
| 4,581,284 A | 4/1986 | Eggert et al. | |
| 4,707,349 A | 11/1987 | Hjersted | |
| 4,920,917 A | 5/1990 | Nakatani et al. | |
| 5,093,155 A | 3/1992 | Miyazaki et al. | |
| 5,103,067 A | 4/1992 | Aldissi | |
| 5,130,194 A | 7/1992 | Baker et al. | |
| 5,156,225 A | 10/1992 | Murrin | |
| 5,173,367 A | 12/1992 | Liimatta et al. | |
| 5,175,224 A | 12/1992 | Horacek | |
| 5,187,021 A * | 2/1993 | Vydra et al. | 428/607 |
| 5,221,605 A | 6/1993 | Bard et al. | |
| 5,238,808 A | 8/1993 | Bard et al. | |
| 5,246,794 A | 9/1993 | Blomgren et al. | |
| 5,310,687 A | 5/1994 | Bard et al. | |
| 5,449,574 A | 9/1995 | Higley | |
| 5,470,408 A | 11/1995 | Nielson et al. | |
| 5,514,217 A | 5/1996 | Niino et al. | |
| 5,547,525 A | 8/1996 | Bennett et al. | |
| 5,571,749 A | 11/1996 | Matsuda et al. | |
| 5,581,438 A | 12/1996 | Halliop | |
| 5,583,318 A | 12/1996 | Powell | |
| 5,639,984 A | 6/1997 | Nielson | |
| 5,707,758 A | 1/1998 | Iwatsu et al. | |
| 5,714,089 A | 2/1998 | Bard et al. | |
| 5,731,147 A | 3/1998 | Bard et al. | |
| 5,908,585 A | 6/1999 | Shibuta | |
| 5,949,018 A * | 9/1999 | Esker | 174/23 R |
| 5,968,274 A | 10/1999 | Fujioka et al. | |
| 5,997,832 A | 12/1999 | Lieber et al. | |
| 6,139,956 A | 10/2000 | Endoh et al. | |
| 6,140,138 A | 10/2000 | Bard et al. | |
| 6,146,783 A | 11/2000 | Brohm et al. | |
| 6,180,281 B1 | 1/2001 | Schneider et al. | |
| 6,184,280 B1 | 2/2001 | Shibuta | |
| 6,194,685 B1 | 2/2001 | Rutherford | |
| 6,221,154 B1 | 4/2001 | Lee et al. | |
| 6,225,565 B1 | 5/2001 | Prysner | |
| 6,232,706 B1 | 5/2001 | Dai et al. | |
| 6,233,135 B1 | 5/2001 | Farahmandi et al. | |
| 6,251,520 B1 | 6/2001 | Blizzard et al. | |
| 6,265,466 B1 | 7/2001 | Glatkowski et al. | |
| 6,331,209 B1 | 12/2001 | Jang et al. | |
| 6,333,016 B1 | 12/2001 | Resasco et al. | |
| 6,361,861 B2 | 3/2002 | Gao et al. | |
| 6,413,487 B1 | 7/2002 | Resasco et al. | |
| 6,420,293 B1 | 7/2002 | Chang et al. | |
| 6,430,031 B1 | 8/2002 | Dispennette et al. | |
| 6,454,816 B1 | 9/2002 | Lee et al. | |
| 6,455,021 B1 | 9/2002 | Saito | |
| 6,465,057 B1 | 10/2002 | Nakahigashi et al. | |
| 6,479,028 B1 | 11/2002 | Kaner et al. | |
| 6,479,030 B1 | 11/2002 | Firsich | |
| 6,491,789 B2 | 12/2002 | Niu | |
| 6,495,258 B1 | 12/2002 | Chen et al. | |
| 6,528,572 B1 | 3/2003 | Patel et al. | |
| 6,564,744 B2 | 5/2003 | Nakahigashi et al. | |
| 6,585,152 B2 | 7/2003 | Farahmandi et al. | |
| 6,602,742 B2 | 8/2003 | Maletin et al. | |
| 6,639,786 B2 | 10/2003 | Noguchi et al. | |
| 6,650,531 B2 | 11/2003 | Ikeda et al. | |
| 6,653,619 B2 | 11/2003 | Chin et al. | |
| 6,673,392 B2 | 1/2004 | Lee et al. | |
| 6,686,537 B1 | 2/2004 | Gareis et al. | |
| 6,692,717 B1 | 2/2004 | Smalley et al. | |
| 6,765,949 B2 | 7/2004 | Chang | |
| 6,773,466 B1 | 8/2004 | Hiratsuka et al. | |
| 6,790,425 B1 | 9/2004 | Smalley et al. | |
| 6,818,821 B2 | 11/2004 | Fujieda et al. | |
| 6,831,826 B2 | 12/2004 | Iwaida et al. | |
| 6,837,928 B1 | 1/2005 | Zhang et al. | |
| 6,852,410 B2 | 2/2005 | Veedu et al. | |
| 6,863,942 B2 | 3/2005 | Ren et al. | |
| 6,887,365 B2 * | 5/2005 | Naughton | 205/104 |
| 6,887,451 B2 | 5/2005 | Dodelet et al. | |
| 6,900,264 B2 | 5/2005 | Kumar et al. | |
| 6,900,580 B2 | 5/2005 | Dai et al. | |
| 6,908,572 B1 | 6/2005 | Derbyshire et al. | |
| 6,913,075 B1 | 7/2005 | Knowles et al. | |
| 6,934,600 B2 | 8/2005 | Jang et al. | |
| 6,936,653 B2 | 8/2005 | McElrath et al. | |
| 6,949,237 B2 | 9/2005 | Smalley et al. | |
| 6,955,800 B2 | 10/2005 | Resasco et al. | |
| 6,962,892 B2 | 11/2005 | Resasco et al. | |
| 6,967,013 B2 | 11/2005 | Someya et al. | |
| 6,979,709 B2 | 12/2005 | Smalley et al. | |
| 6,986,853 B2 | 1/2006 | Glatkowski et al. | |
| 6,986,877 B2 | 1/2006 | Takikawa et al. | |
| 6,994,907 B2 | 2/2006 | Resasco et al. | |
| 7,011,760 B2 | 3/2006 | Wang et al. | |
| 7,018,600 B2 | 3/2006 | Yanagisawa et al. | |
| 7,022,776 B2 | 4/2006 | Bastiaens et al. | |
| 7,045,108 B2 | 5/2006 | Jiang et al. | |
| 7,056,452 B2 | 6/2006 | Niu et al. | |
| 7,060,326 B2 | 6/2006 | Hiel et al. | |
| 7,061,749 B2 | 6/2006 | Liu et al. | |
| 7,074,294 B2 | 7/2006 | Dubrow | |
| 7,085,125 B2 | 8/2006 | Sung | |
| 7,094,386 B2 | 8/2006 | Resasco et al. | |
| 7,105,596 B2 | 9/2006 | Smalley et al. | |
| 7,108,841 B2 | 9/2006 | Smalley et al. | |
| 7,118,693 B2 | 10/2006 | Glatkowski et al. | |
| 7,125,502 B2 | 10/2006 | Smalley et al. | |
| 7,125,534 B1 | 10/2006 | Smalley et al. | |
| 7,132,621 B2 | 11/2006 | Kumar et al. | |
| 7,144,563 B2 | 12/2006 | Rao et al. | |
| 7,147,966 B2 | 12/2006 | Ren et al. | |
| 7,148,619 B2 | 12/2006 | Ken et al. | |
| 7,151,129 B2 | 12/2006 | Ishikawa et al. | |
| 7,153,452 B2 | 12/2006 | Ogale et al. | |
| 7,157,068 B2 | 1/2007 | Li et al. | |
| 7,160,532 B2 | 1/2007 | Liu et al. | |
| 7,189,959 B1 | 3/2007 | Morison et al. | |
| 7,211,320 B1 | 5/2007 | Cooper et | |
| 7,226,643 B2 | 6/2007 | Juang et al. | |
| 7,235,159 B2 | 6/2007 | Gu et al. | |
| 7,253,442 B2 | 8/2007 | Huang et al. | |
| 7,261,779 B2 | 8/2007 | Gardner | |
| 7,265,174 B2 | 9/2007 | Carroll et al. | |
| 7,265,175 B2 | 9/2007 | Winey et al. | |
| 7,278,324 B2 | 10/2007 | Smits et al. | |
| 7,282,260 B2 | 10/2007 | LeGrande | |
| 7,289,312 B2 | 10/2007 | Duff, Jr. | |
| 7,294,302 B2 | 11/2007 | Kolde et al. | |
| 7,312,608 B2 | 12/2007 | Georgeson et al. | |
| 7,329,698 B2 | 2/2008 | Noguchi et al. | |
| 7,338,684 B1 | 3/2008 | Curliss et al. | |
| 7,340,134 B1 | 3/2008 | Hudson, II et al. | |
| 7,352,559 B2 | 4/2008 | Sung | |
| 7,354,877 B2 | 4/2008 | Rosenberger et al. | |
| 7,354,881 B2 | 4/2008 | Resasco et al. | |
| 7,354,988 B2 | 4/2008 | Charati et al. | |
| 7,372,880 B2 | 5/2008 | Jablonski et al. | |
| 7,384,663 B2 | 6/2008 | Olry et al. | |
| 7,399,794 B2 | 7/2008 | Harmon et al. | |
| 7,407,640 B2 | 8/2008 | Barrera et al. | |
| 7,407,901 B2 | 8/2008 | Bystricky et al. | |
| 7,410,628 B2 | 8/2008 | Bening et al. | |
| 7,419,601 B2 | 9/2008 | Cooper et al. | |
| 7,431,965 B2 | 10/2008 | Grigorian et al. | |
| 7,435,476 B2 | 10/2008 | Viswanathan et al. | |
| 7,442,284 B2 | 10/2008 | Ren et al. | |
| 7,445,817 B2 | 11/2008 | Kumar et al. | |
| 7,448,441 B2 | 11/2008 | Hendricks et al. | |
| 7,448,931 B2 | 11/2008 | Liu et al. | |
| 7,449,631 B2 | 11/2008 | Lee et al. | |
| 7,459,627 B2 | 12/2008 | Lee et al. | |
| 7,465,605 B2 | 12/2008 | Raravikar et al. | |
| 7,466,539 B2 | 12/2008 | Dementiev et al. | |
| 7,473,466 B1 | 1/2009 | Muradov | |
| 7,479,052 B2 | 1/2009 | Kim et al. | |
| 7,488,455 B2 | 2/2009 | Dai et al. | |
| 7,504,078 B1 | 3/2009 | Jacques et al. | |
| 7,510,695 B2 | 3/2009 | Smalley et al. | |

(56) References Cited

U.S. PATENT DOCUMENTS

| | | |
|---|---|---|
| 7,531,267 B2 | 5/2009 | Kim |
| 7,532,454 B2 | 5/2009 | Plee et al. |
| 7,534,486 B2 | 5/2009 | Boerstoel et al. |
| 7,553,341 B2 | 6/2009 | Pan et al. |
| 7,563,411 B2 | 7/2009 | Jiang et al. |
| 7,563,428 B2 | 7/2009 | Resasco et al. |
| 7,569,425 B2 | 8/2009 | Huang et al. |
| 7,579,112 B2 | 8/2009 | Chiang et al. |
| 7,588,700 B2 | 9/2009 | Kwon et al. |
| 7,592,248 B2 | 9/2009 | Ventzek et al. |
| 7,597,869 B2 | 10/2009 | Hsiao |
| 7,608,798 B2 | 10/2009 | Kumar et al. |
| 7,611,579 B2 | 11/2009 | Lashmore et al. |
| 7,612,985 B2 | 11/2009 | Dementiev et al. |
| 7,615,204 B2 | 11/2009 | Ajayan et al. |
| 7,615,205 B2 | 11/2009 | Jiang et al. |
| 7,632,550 B2 | 12/2009 | Mizuno et al. |
| 7,632,569 B2 | 12/2009 | Smalley et al. |
| 7,700,943 B2 | 4/2010 | Raravikar et al. |
| 7,709,087 B2 | 5/2010 | Majidi et al. |
| 7,718,220 B2 | 5/2010 | D'Silva et al. |
| 7,771,798 B1 | 8/2010 | Grosse et al. |
| 7,776,777 B2 | 8/2010 | Kim et al. |
| 7,793,653 B2 | 9/2010 | Kuckelkorn et al. |
| 7,811,632 B2 | 10/2010 | Eres |
| 7,815,820 B2 | 10/2010 | Tan et al. |
| 7,816,709 B2 | 10/2010 | Balzano et al. |
| 7,820,329 B2 | 10/2010 | Boulton et al. |
| 7,862,795 B2 | 1/2011 | Zhang et al. |
| 7,871,591 B2 | 1/2011 | Harutyunyan et al. |
| 7,880,376 B2 | 2/2011 | Takai et al. |
| 7,927,701 B2 | 4/2011 | Curliss et al. |
| 8,373,971 B2 | 2/2013 | Young |
| 2002/0035170 A1 | 3/2002 | Glatkowski et al. |
| 2002/0048143 A1 | 4/2002 | Lee et al. |
| 2002/0085968 A1 | 7/2002 | Smalley et al. |
| 2002/0090330 A1 | 7/2002 | Smalley et al. |
| 2002/0098135 A1 | 7/2002 | Smalley et al. |
| 2002/0136683 A1 | 9/2002 | Smalley et al. |
| 2003/0042147 A1 | 3/2003 | Talin et al. |
| 2003/0044678 A1 | 3/2003 | ESq. |
| 2003/0055153 A1 | 3/2003 | Luippold et al. |
| 2003/0102585 A1 | 6/2003 | Poulin et al. |
| 2003/0111333 A1 | 6/2003 | Montgomery et al. |
| 2003/0143453 A1 | 7/2003 | Ren et al. |
| 2004/0007955 A1 | 1/2004 | Yaniv et al. |
| 2004/0018375 A1 | 1/2004 | Banno et al. |
| 2004/0020681 A1* | 2/2004 | Hjortstam et al. ...... 174/102 SC |
| 2004/0026234 A1 | 2/2004 | Vanden Brande et al. |
| 2004/0029019 A1 | 2/2004 | Clarke et al. |
| 2004/0055631 A1 | 3/2004 | Szymocha et al. |
| 2004/0071870 A1 | 4/2004 | Knowles et al. |
| 2004/0082247 A1 | 4/2004 | Desai et al. |
| 2004/0096389 A1 | 5/2004 | Lobovsky et al. |
| 2004/0105807 A1 | 6/2004 | Fan et al. |
| 2004/0111141 A1 | 6/2004 | Brabec et al. |
| 2004/0166417 A1 | 8/2004 | Nishio et al. |
| 2004/0184981 A1 | 9/2004 | Liu et al. |
| 2004/0197546 A1 | 10/2004 | Rinzler et al. |
| 2004/0210289 A1 | 10/2004 | Wang et al. |
| 2004/0241532 A1 | 12/2004 | Kim |
| 2004/0245088 A1 | 12/2004 | Gardner |
| 2004/0253167 A1 | 12/2004 | Silva et al. |
| 2005/0090176 A1 | 4/2005 | Dean et al. |
| 2005/0100501 A1 | 5/2005 | Veedu et al. |
| 2005/0112052 A1 | 5/2005 | Gu et al. |
| 2005/0113876 A1 | 5/2005 | Weiner et al. |
| 2005/0119371 A1 | 6/2005 | Drzal et al. |
| 2005/0170177 A1 | 8/2005 | Crawford et al. |
| 2005/0172370 A1 | 8/2005 | Haq et al. |
| 2005/0176329 A1 | 8/2005 | Olry et al. |
| 2005/0188727 A1 | 9/2005 | Greywall |
| 2005/0214648 A1 | 9/2005 | Boulton et al. |
| 2005/0231893 A1 | 10/2005 | Harvey |
| 2005/0238810 A1 | 10/2005 | Scaringe et al. |
| 2005/0260412 A1 | 11/2005 | Gardner |
| 2005/0263456 A1 | 12/2005 | Cooper et al. |
| 2005/0287064 A1 | 12/2005 | Mayne et al. |
| 2006/0052509 A1 | 3/2006 | Saitoh |
| 2006/0054866 A1 | 3/2006 | Ait-Haddou et al. |
| 2006/0063065 A1 | 3/2006 | Clarke et al. |
| 2006/0110599 A1 | 5/2006 | Honma et al. |
| 2006/0121275 A1 | 6/2006 | Poulin et al. |
| 2006/0126268 A1 | 6/2006 | Sung |
| 2006/0159916 A1 | 7/2006 | Dubrow et al. |
| 2006/0177602 A1 | 8/2006 | Dijon et al. |
| 2006/0198956 A1 | 9/2006 | Eres |
| 2006/0233692 A1 | 10/2006 | Scaringe et al. |
| 2006/0241236 A1 | 10/2006 | Kuznetsov et al. |
| 2006/0249203 A1 | 11/2006 | Li et al. |
| 2006/0253942 A1 | 11/2006 | Barrera et al. |
| 2007/0020167 A1 | 1/2007 | Han et al. |
| 2007/0036709 A1 | 2/2007 | Lashmore et al. |
| 2007/0048521 A1 | 3/2007 | Istvan |
| 2007/0054105 A1 | 3/2007 | Hsiao |
| 2007/0062799 A1 | 3/2007 | Lee |
| 2007/0070579 A1 | 3/2007 | Sung |
| 2007/0076349 A1 | 4/2007 | Dementiev et al. |
| 2007/0092431 A1 | 4/2007 | Resasco et al. |
| 2007/0110977 A1 | 5/2007 | Al-Haik et al. |
| 2007/0128960 A1 | 6/2007 | Ghasemi Nejhad et al. |
| 2007/0134555 A1 | 6/2007 | Ren et al. |
| 2007/0135588 A1 | 6/2007 | Diakoumakos et al. |
| 2007/0166603 A1 | 7/2007 | Nakanishi et al. |
| 2007/0189953 A1 | 8/2007 | Bai et al. |
| 2007/0237990 A1 | 10/2007 | Kim |
| 2007/0241962 A1 | 10/2007 | Shinoda et al. |
| 2007/0259128 A1 | 11/2007 | Parsapour |
| 2007/0293086 A1* | 12/2007 | Liu et al. ...... 439/578 |
| 2008/0010796 A1 | 1/2008 | Pan et al. |
| 2008/0014431 A1 | 1/2008 | Lashmore et al. |
| 2008/0020193 A1 | 1/2008 | Jang et al. |
| 2008/0048364 A1 | 2/2008 | Armenlades et al. |
| 2008/0049380 A1 | 2/2008 | Miyahara et al. |
| 2008/0053922 A1 | 3/2008 | Honsinger, Jr. et al. |
| 2008/0057265 A1 | 3/2008 | Liang et al. |
| 2008/0063585 A1 | 3/2008 | Smalley |
| 2008/0075954 A1 | 3/2008 | Wardle et al. |
| 2008/0102371 A1 | 5/2008 | Mitchell et al. |
| 2008/0117562 A1 | 5/2008 | Maruyama et al. |
| 2008/0118753 A1 | 5/2008 | Poulin et al. |
| 2008/0137890 A1 | 6/2008 | Petersen et al. |
| 2008/0146440 A1 | 6/2008 | Westin et al. |
| 2008/0160286 A1 | 7/2008 | Asrar et al. |
| 2008/0170982 A1 | 7/2008 | Zhang et al. |
| 2008/0173111 A1 | 7/2008 | Thostenson et al. |
| 2008/0182108 A1 | 7/2008 | Curliss et al. |
| 2008/0187482 A1 | 8/2008 | Chen et al. |
| 2008/0187648 A1 | 8/2008 | Hart et al. |
| 2008/0195187 A1 | 8/2008 | Li et al. |
| 2008/0212261 A1 | 9/2008 | Ajayan et al. |
| 2008/0247938 A1 | 10/2008 | Tsai et al. |
| 2008/0248192 A1 | 10/2008 | Long et al. |
| 2008/0248362 A1 | 10/2008 | Sayre et al. |
| 2008/0251971 A1 | 10/2008 | Kim et al. |
| 2008/0254675 A1* | 10/2008 | Lee et al. ...... 439/578 |
| 2008/0273290 A1 | 11/2008 | Dementiev et al. |
| 2008/0279753 A1 | 11/2008 | Harutyunyan |
| 2008/0286564 A1 | 11/2008 | Tsotsis |
| 2008/0296558 A1* | 12/2008 | Choi et al. ...... 257/24 |
| 2008/0297980 A1 | 12/2008 | Bourcier et al. |
| 2008/0299019 A1* | 12/2008 | Luo et al. ...... 427/249.1 |
| 2009/0017301 A1 | 1/2009 | Moireau |
| 2009/0020734 A1 | 1/2009 | Jang et al. |
| 2009/0029127 A1 | 1/2009 | Watanabe et al. |
| 2009/0047453 A1 | 2/2009 | Folaron et al. |
| 2009/0047502 A1 | 2/2009 | Folaron et al. |
| 2009/0053512 A1 | 2/2009 | Pyun et al. |
| 2009/0059474 A1 | 3/2009 | Zhamu et al. |
| 2009/0068387 A1 | 3/2009 | Panzer et al. |
| 2009/0068461 A1 | 3/2009 | Reneker et al. |
| 2009/0072222 A1 | 3/2009 | Radisic et al. |
| 2009/0081383 A1 | 3/2009 | Alberding et al. |
| 2009/0081441 A1 | 3/2009 | Shah et al. |

(56) References Cited

U.S. PATENT DOCUMENTS

| | | |
|---|---|---|
| 2009/0087743 A1 | 4/2009 | Kim et al. |
| 2009/0092832 A1 | 4/2009 | Moireau |
| 2009/0095051 A1 | 4/2009 | Suzuki et al. |
| 2009/0098453 A1 | 4/2009 | Liu et al. |
| 2009/0099016 A1 | 4/2009 | Carruthers et al. |
| 2009/0117269 A1 | 5/2009 | Hansen et al. |
| 2009/0121219 A1 | 5/2009 | Song et al. |
| 2009/0126783 A1 | 5/2009 | Lin et al. |
| 2009/0136707 A1 | 5/2009 | Ueno |
| 2009/0140098 A1 | 6/2009 | Lengsfeld et al. |
| 2009/0176100 A1 | 7/2009 | Higashi et al. |
| 2009/0176112 A1 | 7/2009 | Kruckenberg et al. |
| 2009/0181309 A1 | 7/2009 | Kwon et al. |
| 2009/0185327 A1 | 7/2009 | Seymour |
| 2009/0186214 A1 | 7/2009 | Lafdi et al. |
| 2009/0186276 A1 | 7/2009 | Zhamu et al. |
| 2009/0191352 A1 | 7/2009 | DuFaux et al. |
| 2009/0192241 A1 | 7/2009 | Raravikar et al. |
| 2009/0194313 A1* | 8/2009 | Jiang et al. ................ 174/102 R |
| 2009/0208743 A1 | 8/2009 | Pettit |
| 2009/0212430 A1 | 8/2009 | Wyland |
| 2009/0214800 A1 | 8/2009 | Saito |
| 2009/0214944 A1 | 8/2009 | Rojeski |
| 2009/0220409 A1 | 9/2009 | Curliss et al. |
| 2009/0226673 A1 | 9/2009 | Friedersdorf et al. |
| 2009/0244810 A1 | 10/2009 | Reynolds |
| 2009/0255706 A1 | 10/2009 | Jiang et al. |
| 2009/0258164 A1 | 10/2009 | Nakai et al. |
| 2009/0262484 A1 | 10/2009 | Miyagi |
| 2009/0272946 A1 | 11/2009 | Lu |
| 2009/0282671 A1 | 11/2009 | Tao et al. |
| 2009/0286079 A1 | 11/2009 | Barker et al. |
| 2009/0294022 A1 | 12/2009 | Hayes et al. |
| 2009/0294753 A1 | 12/2009 | Hauge et al. |
| 2009/0305135 A1 | 12/2009 | Shi et al. |
| 2009/0311166 A1 | 12/2009 | Hart et al. |
| 2009/0314510 A1 | 12/2009 | Kukowski et al. |
| 2009/0325076 A1 | 12/2009 | Matsui et al. |
| 2010/0000520 A1 | 1/2010 | Vachon |
| 2010/0000754 A1 | 1/2010 | Mann et al. |
| 2010/0000770 A1 | 1/2010 | Gupta et al. |
| 2010/0035124 A1 | 2/2010 | Thompson et al. |
| 2010/0059243 A1 | 3/2010 | Chang |
| 2010/0074834 A1 | 3/2010 | Kim |
| 2010/0087042 A1 | 4/2010 | Kim et al. |
| 2010/0098931 A1 | 4/2010 | Daniel et al. |
| 2010/0099319 A1 | 4/2010 | Lashmore et al. |
| 2010/0159240 A1 | 6/2010 | Shah et al. |
| 2010/0173228 A1 | 7/2010 | Wallace et al. |
| 2010/0178531 A1 | 7/2010 | Amaratunga et al. |
| 2010/0178825 A1 | 7/2010 | Shah et al. |
| 2010/0188833 A1 | 7/2010 | Liang et al. |
| 2010/0192851 A1 | 8/2010 | Shah et al. |
| 2010/0196695 A1 | 8/2010 | Garcia et al. |
| 2010/0196697 A1 | 8/2010 | D'Silva et al. |
| 2010/0197848 A1 | 8/2010 | Verghese et al. |
| 2010/0203362 A1 | 8/2010 | Lam et al. |
| 2010/0206504 A1 | 8/2010 | Akiyama et al. |
| 2010/0210159 A1 | 8/2010 | Zhu |
| 2010/0221424 A1 | 9/2010 | Malecki et al. |
| 2010/0224129 A1 | 9/2010 | Malecki et al. |
| 2010/0227134 A1 | 9/2010 | Shah et al. |
| 2010/0227155 A1 | 9/2010 | Bao et al. |
| 2010/0254885 A1 | 10/2010 | Menchhofer et al. |
| 2010/0258111 A1 | 10/2010 | Shah et al. |
| 2010/0270069 A1 | 10/2010 | Shar et al. |
| 2010/0270513 A1 | 10/2010 | Haylock et al. |
| 2010/0271253 A1 | 10/2010 | Shah et al. |
| 2010/0272891 A1 | 10/2010 | Malecki et al. |
| 2010/0276072 A1 | 11/2010 | Shah et al. |
| 2010/0279569 A1 | 11/2010 | Shah et al. |
| 2010/0286395 A1* | 11/2010 | Newkome et al. ................ 546/2 |
| 2010/0311866 A1 | 12/2010 | Huang et al. |
| 2010/0330421 A1 | 12/2010 | Cui et al. |
| 2011/0024409 A1 | 2/2011 | Shah et al. |
| 2011/0024694 A1 | 2/2011 | Shah et al. |
| 2011/0036829 A1 | 2/2011 | Fugetsu et al. |
| 2011/0089958 A1 | 4/2011 | Malecki et al. |
| 2011/0104571 A1 | 5/2011 | Zhamu et al. |
| 2011/0123735 A1 | 5/2011 | Shah et al. |
| 2011/0124253 A1 | 5/2011 | Shah et al. |
| 2011/0124483 A1 | 5/2011 | Shah et al. |
| 2011/0143087 A1 | 6/2011 | Alberding et al. |
| 2011/0159365 A1 | 6/2011 | Loveness et al. |
| 2011/0159381 A1 | 6/2011 | Doe et al. |
| 2011/0163274 A1 | 7/2011 | Plee et al. |
| 2011/0171469 A1 | 7/2011 | Shah et al. |
| 2011/0174519 A1 | 7/2011 | Shah et al. |
| 2011/0186775 A1 | 8/2011 | Shah et al. |
| 2011/0216476 A1 | 9/2011 | Fleischer et al. |
| 2011/0235240 A1 | 9/2011 | Lu et al. |
| 2011/0242731 A1 | 10/2011 | Fleischer et al. |
| 2011/0281068 A1 | 11/2011 | David et al. |
| 2011/0287318 A1 | 11/2011 | Loveness et al. |
| 2011/0297892 A1 | 12/2011 | Shah et al. |
| 2011/0304964 A1 | 12/2011 | Fleischer et al. |
| 2012/0000691 A1 | 1/2012 | Shah et al. |
| 2012/0052363 A1 | 3/2012 | Fleischer |

FOREIGN PATENT DOCUMENTS

| | | |
|---|---|---|
| CN | 1970612 A | 5/2007 |
| CN | 101189930 A | 5/2008 |
| CN | 101365740 A | 2/2009 |
| CN | 101654555 A | 2/2010 |
| CN | 101698975 | 4/2010 |
| IN | 1900DE2008 A | 3/2010 |
| JP | S 61-157495 | 7/1986 |
| JP | H-05-269874 A | 10/1993 |
| JP | H 07-134911 | 5/1995 |
| JP | H 11-134949 | 5/1999 |
| JP | 2001-517583 A | 10/2001 |
| JP | 2002-515847 A | 5/2002 |
| JP | 2003-239171 A | 8/2003 |
| JP | 2004-039668 | 2/2004 |
| JP | 2004/247064 A | 9/2004 |
| JP | 2005-353493 | 12/2005 |
| JP | 2005-538026 | 12/2005 |
| JP | 2007-070593 A | 3/2007 |
| JP | 2007-515364 | 6/2007 |
| JP | 2007-194354 A | 8/2007 |
| JP | 2007-220841 | 8/2007 |
| JP | 2007-246317 A | 9/2007 |
| JP | 2008-010329 | 1/2008 |
| JP | 2008-270807 | 11/2008 |
| JP | 2008-296338 A | 12/2008 |
| JP | 2009-173476 | 8/2009 |
| JP | 2009-190948 | 8/2009 |
| JP | 2009-533831 | 9/2009 |
| JP | 2009-252745 | 10/2009 |
| JP | 2009-535530 A | 10/2009 |
| JP | 2009-537339 | 10/2009 |
| KR | 100829001 | 5/2008 |
| TW | 200833861 | 8/2008 |
| WO | WO 03082733 | 10/2003 |
| WO | WO 2006/048531 | 5/2006 |
| WO | WO-2006/080702 A1 | 8/2006 |
| WO | WO 2006/115486 | 11/2006 |
| WO | WO 2007/015710 | 2/2007 |
| WO | WO 2007/061854 | 5/2007 |
| WO | WO 2007/089118 | 8/2007 |
| WO | WO 2007/149109 | 12/2007 |
| WO | WO 2008/012196 | 1/2008 |
| WO | WO-2008/035730 A1 | 3/2008 |
| WO | WO 2008/041183 | 4/2008 |
| WO | WO-2008/054409 A2 | 5/2008 |
| WO | WO 2008/054541 | 5/2008 |
| WO | WO 2008/085634 | 7/2008 |
| WO | WO-2008085550 A2 | 7/2008 |
| WO | WO 2008/115168 | 9/2008 |
| WO | WO 2008/115640 | 9/2008 |
| WO | WO-2008/133299 A1 | 11/2008 |
| WO | WO 2008/145787 | 12/2008 |

(56) References Cited

FOREIGN PATENT DOCUMENTS

| WO | WO 2009/004346 | 1/2009 |
|---|---|---|
| WO | WO 2009110885 | 9/2009 |
| WO | WO-2009/125421 A1 | 10/2009 |

OTHER PUBLICATIONS

Andrews, et al., "Nanotube Composite Carbon Fibers," Applied Physics Letters, Aug. 1999, vol. 75, No. 9, pp. 1329-1331.
Arepalli, et al., "Carbon-Nanotube-Based Electrochemical Double-Layer Capacitor Technologies for Spaceflight Applications,"JOM, Dec. 2005, pp. 26-31.
Bradford, et al., "Electrical Conductivity Study of Carbon nanotube Yarns, 3-D Hybrid Braids and their Composites", Jouranl of Composite Materials, pp. 1533-1545, vol. 42, No. 15, SAGE Productions, Los Angeles, London, New Delhi and Singapore.
Bubert, et al., "Basic analytical investigation of plasma-chemically modified carbon fibers", Spectrochimica Acta Part B., 2002, pp. 1601-1610, vol. 57, Elsevier Science B.V.
Chae, et al., "A comparison of reinforcement efficiency of various types of carbon nanotubes in polyacrylonitrile fiber", Polymer, Nov. 21, 2005, pp. 10925-10935, vol. 46, No. 24, Elsevier Ltd.
Che, et al., "Chemical Vapor Deposition Based Synthesis of Carbon Nanotubes and Nanofibers Using a Template Method", Chem. Mater., 1998, pp. 260-267, vol. 10, American Chemical Society.
Chen, et al., "Basalt fiber-epoxy laminates with functionalized multi-walled carbon nanotubes", Composites, Part A, 2009, pp. 1082-1089, vol. 40, Elsevier Ltd.
Chen, et al., "Pulsed electrodeposition of Pt nanoclusters on carbon nanotubes modified carbon materials using diffusion restricting viscous electroyles", Electrochemistry Communications, Jun. 2007, pp. 1348-1354, vol. 9, Elsevier B.V.
Ci, et al., "Direct Growth of Carbon Nanotubes on the Surface of Ceramic Fibers", Carbon, 2005, pp. 883-886, vol. 43, No. 4, Elsevier Ltd.
Cui, et al., "Carbon-Silicon Core-Shell Nanowires as High Capacity Electrode for Lithium Ion Batteries," American Chemical Society. vol., No.
Franz, et al., "Carbon Single-Wall Nanotube Growth in a Volumetrically Confined Arc Discharge System", U.S. Departement of Energy Journal of Undergraduate Research, pp. 66-69, publication date unknown.
Garcia, et al., "Aligned Carbon Nanotube Reinforcement of Advanced Composite Ply Interfaces," 49th AIAA/ASCE/AHS/ASC Structures, Structural Dynamics, and Materials Conference, Apr. 7-10, 2008, Schaumburg, IL, MIT, American Institute of Aeronautics and Astronautics, Inc.
Hsieh, et al., "Synthesis of Carbon Nanotubes on Carbon Fabric for Use as electrochemical Capacitor," Microporous and Mesoporous Materials, (2009), pp. 155-159, vol. 122.
Hsu, et al., "Optical Absorption and Thermal Transport of Individual Suspended Carbon Nanotube Bundles", Nano Lett., 2009, pp. 590-594, vol. 9, No. 2, American Chemical Society, Publication Date (Web): Jan. 13, 2009.
Jiang, et al., "Carbon nanotube-coated solid-phase microextraction metal fiber based on sol-gel technique", Journal of Chromatography A., May 29, 2009, pp. 4641-4647, vol. 1216, Elsevier B.V.
Jiang, et al., "Plasma-Enhanced Deposition of Silver Nanoparticles onto Polymer and Metal Surfaces for the Generation of Antimicrobial Characteristics", Journal of Applied_Polymer Science, 2004, pp. 1411-1422, vol. 93, Wiley Periodicals, Inc.
Jo, et al., "Field Emission of Carbon Nanotubes Grown on Carbon Cloth," Applied Physics Letters, Aug. 2, 2004, pp. 810-812, vol. 85, No. 5.
Jung, et al., "Fabrication of radar absorbing structure (RAS) using GFR-nano composite and spring-back compensation of hybrid composite RAS shells", Composite Structures, 2006, pp. 571-576, vol. 75, Elsevier Ltd.
Kim, et al., "Processing, characterization, and modeling of carbon nanotube-reinforced multiscale composites," Composites Science and Technology, 2009, pp. 335,342, vol. 69, Elsevier Ltd.
Kind, et al., "Patterned Films of Nanotubes Using Microcontact Printing of Catalysts", Adv. Mater., 1999, pp. 1285-1289, vol. 11, No. 15, Wiley-VCH Verlag GmbH, D-69469 Weinheim.
Kramer, et al., Constrained Iron Catalysts for Single-Walled Carbon Nanotube Growth?, Langmuir 2005, 21, 8466-8470 [http://pubs.acs.org/dol/abs/10.1021/la0506729].
Laachachi, et al., "A chemical method to graft carbon nanotubes onto a carbon fiber", Materials Letters, 2008, pp. 394-397, vol. 62, Elsevier B.V.
Lee, "Syntheses and properties of fluorinated carbon materials", Journal of Fluorine Chemistry, 2007, pp. 392-403, vol. 128, Elsevier B.V.
Lee, et al., "Fabrication and design of multi-layered radar absorbing structures of MWNT-filled glass/epoxy plain-weave composites", Composite Structures, 2006, pp. 397-405, vol. 76, Elsevier Ltd.
Li, et al., "A Miniature glucose/$O_2$ biofuel cell with single-walled carbon nanotubes-modified carbon fiber microelectrodes as the substrate", Electrochemistry Communications, Jun. 2008, pp. 851-854, vol. 10, Elsevier B.V.
Li, et al., "Electromagnetic Interference (EMI) Shielding of Single-Walled Carbon Nanotube Epoxy Composites", Nano Lett., 2006, pp. 1141-1145, vol. 6, No. 6, American Chemical Society.
Makris, et al., "Carbon Nanotubes Growth and Anchorage to Carbon Fibres", Carbon Nanotubes, 2006, pp. 57-58, vol. 222, Springer, the Netherlands.
Meyyappan, et al., "Carbon nanotube growth by PECVD: a review", Plasma Sources Sci. Technol., 2003, pp. 205-216, vol. 12, IOP Publishing Ltd, UK.
Mylvaganam, "Fabrication and Application of Polymer Composites Comprising Carbon Nanotubes", Recent Pat Nanotechnol., 2007, pp. 59-65, vol. 1, Bentham Science Publishers, Ltd.
Panhuis, et al., "Carbon Nanotube Mediated Reduction in Optical Activity in Polyaniline Composite Materials", J. Phys. Chem. C, 2008, pp. 1441-1445, vol. 112, American Chemical Society.
Parrish, "Carbon Nanotubes and Carbon Layer Nanostructured Composites Grown in Improved Process," Capella University, Before It's News, Jul. 9, 2010.
Pisco, et al., "Hollow fibers integrated with single walled carbon nanotubes: Bandgap modification and chemical sensing capability", Sensors and Actuators B, 2008, pp. 163-170, vol. 129, Elsevier B.V.
Račkauskas "Carbon nanotube growth and use in energy sector", Energetika, 2006, pp. 43-46, vol. 2.
Satishkumar, et al., "Bundles of aligned carbon nanotubes obtained by the pyrolysis of ferrocene-hydrocarbon mixtures: role of the metal nanoparticles produced in situ", Chemical Physics Letters, 1999, pp. 158-162, vol. 307, Elsevier Science B.V.
Suh, et al., "Highly ordered two-dimensional carbon nanotube arrays", Applied Physics Letters, Oct. 4, 2002, pp. 2047-2049, vol. 75, No. 14, American Institute of Physics.
Thostenson et al., "Carbon Nanotube Networks: Sensing of distributed Strain and Damage for Life Prediction and Self Healing," Advanced Materials, Oct. 2, 1006, vol. 18, Iss. 21, pp. 2837-2841.
Wang, et al., "Penetration depth of atmospheric pressure plasma surface modification into multiple layers of polyester fabrics", Surface and Coatings Technology, 2007, pp. 77-83, vol. 202, Elsevier B.V.
Wang, et al., "Processing and property investigation of single-walled carbon nanotube (SWNT) buckypaper/epoxy resin matrix nanocomposites", Composites: Part A, 2004, pp. 1225-1232, vol. 35, Elsevier Ltd.
Wichmann, et al., "Glass-fibre-reinforced composites with enhanced mechanical and electrical properties—Benefits and limitations of a nanoparticle modified matrix", Engineering Fracture Mechanics, 2006, pp. 2346-2359, vol. 73, Elsevier Ltd.
Xu, et al., "Bone-Shaped Nanomaterials for Nanocomposite Applications", Nano Lett., 2003, pp. 1135-1139, vol. 3, No. 8, American Chemical Society.
Yabe, et al., Synthesis of well-aligned carbon nanotubes by radio frequency plasma enhanced CVD method, Diamond and Related Materials, 2004, pp. 1292-1295, vol. 13, Elsevier B.V.

(56) References Cited

OTHER PUBLICATIONS

Yanagishita, et al., "Carbon Nanotubes with a Triangular Cross-section, Fabricated Using Anodic Porous Alumina as the Temple", Adv. Mater., 204, pp. 429-432, vol. 16, No. 5, Wiley-VCH Verlag GmbH & Co. KGaA, Weinheim.

Yang, et al., "Electrical Conductivity and Electromagnetic Interference Shielding of Multi-walled Carbon Nanotube Filled Polymer Composites" Mater. Res. Soc. Symp. Proc., 2005, pp. HH5.3.1-HH.5.3.5, vol. 858E, Materials Research Society.

Yeh, et al., "Mechanical properties of phenolic-based nanocomposites reinforced by multi-walled carbon nanotubes and carbon fibers", Composites: Part A, 2008, pp. 677-684, vol. 39, No. 4.

Zhang et al., "Integration and characterization of aligned carbon nanotubes on metal/silicon substrates and effects of water", Applied Surface Science 255 (2009) 5003-5008, entire document.

Zhang, et al., "In situ growth of carbon nanotubes on inorganic fibers with different surface properties," Materials Chemistry and Physics, 2008, pp. 317-321, vol. 107, Science Direct.

Zhao et al., "The Use of Carbon Nanotubes to Sense Matrix Stresses Around a Single Glass Fiber," Composites Science and Technology, Nov. 2001, vol. 61, No. 14, pp. 2139-2143.

Zhao, et al., "Carbon Nanosheets as the Electrode Material in Supercapacitors," Journal of Power Sources 194 (2009 pp. 1208-1212.

Zhao, et al., "Growth of carbon nanotubes on the surface of carbon fibers", Carbon, 2007, pp. 380-383, vol. 46, No. 2, Elsevier Ltd.

Zhao, et al., "The growth of multi-walled carbon nanotubes with different morphologies on carbon fibers", Carbon, 2005, pp. 651-673, vol. 43, Elsevier Ltd.

Zhu, et al., "Carbon nanotube growth on carbon fibers", Diamond and Related Materials, 2003, pp. 1825-1825, vol. 12, Elsevier B.V.

Zhu, et al., "Synthesis of single-walled carbon nanotubes by the vertical floating catalyst method," Chinese Science Bulletin, 2002, pp. 159-162, vol. 47, No. 2.

Park, et al., "Strain-dependent electrical resistance of multi-walled carbon nanotube/polymer composite films," Nanotechnology, 2008, vol. 19, 055705, 7 pages.

Rebouillat, et al., "Measuring the Electrical Conductivity of Single Fibres," Int J Electrochem Sci, 2011, vol. 6, pp. 5731-5740.

Buehler GmbH, Safety Data Sheet 1907/2006/EC (GB) Buehler EpoThin Hardener, revised Apr. 21, 2008, 5 pages.

Buehler GmbH, Safety Data Sheet 1907/2006/EC (GB) Buehler EpoThin Resin, revised Apr. 21, 2008, 5 pages.

CRC Handbook of Chemistry and Physics, $95^{th}$ Edition, 2014-2015, Physical Constants of Inorganic Compounds, p. 4-45.

The University of Edinburgh School of GeoSciences, Sample Preparation Procedures, revised Aug. 23, 2008, 6 pages.

Garcia, et al., "Fabrication and multifunctional properties of a hybrid laminate with aligned carbon nanotubes grown In Situ", Composites Science and Technology, Jul. 1, 2008, pp. 2034-2041, vol. 68, No. 9.

Hou et al., "A resistance-based damage location sensor for carbon-fibre composites", Smart Materials and Structures, Nov. 4, 2002, vol. 11, pp. 966-969.

Thostenson et al., "Real-time in situ sensing of damage evolution in advanced fiber composites using carbon nanotube networks", Nanotechnology, Apr. 23, 2008, vol. 19.

Fiedler et al, "Can Carbon Nanotubes Be Used to Sense Damage in Composites?", Annales de Chimie—Science des Materiaux, 2004, vol. 29, No. 6, pp. 81-94.

vanSchalkwijk, et al., "Advances in Lithium-Ion Batteries," Kluwer Academic Plenum Publishers, 2002, p. 499.

CRC Handbook of Chemistry and Physics, 95th Edition, 2014-2015, Physical Constants of Inorganic Compounds, p. 4-88.

Ma, et al., "Electrochemical properties of manganese oxide coated onto carbon nanotubes for energy-storage applications," Dec. 2007, Journal of Power Sources, pp. 483-489, vol. 178, No. 1.

Lee, et al., "Fabrication of polypyrrole (PPy)/carbon nanotube (CNT) composite electrode on ceramic fabric for supercapacitor applications," Jun. 2011, Electrochimica ACTA, pp. 7460-7466, vol. 56, No. 22.

Stoller, et al., "Best practice methods for determining an electrode material's performance for ultracapacitors," Jan. 2010, Energy & Environmental Science, pp. 1294-1301, vol. 3, No. 9.

\* cited by examiner

| Test Frequency (GHz) | Radar Band | Aluminum Reference (dB) | Panel #156 Baseline Carbon/Epoxy (dB) | Panel #132 Autoclave Cure (dB) | Panel #182 Cavity Press Cure (dB) |
|---|---|---|---|---|---|
| 2 | L-Band | 85 | 52 | 58 | 56 |
| 4 | S-Band | 99 | 69 | 81 | 67 |
| 6 | C-Band | 86 | 58 | 72 | 64 |
| 8 | | 85 | 66 | 79 | 74 |
| 10 | X-Band | 81 | 59 | 90 | 70 |
| 12 | | 82 | 63 | 94 | 73 |
| 14 | K-Band | 83 | 61 | 99 | 68 |
| 16 | | 94 | 69 | 96 | 76 |
| 18 | | 73 | 61 | 74 | 77 |
| Average EMI Shielding Effectiveness | | | 62.0 | 82.6 | 69.4 |

Figure 14

| Test Frequency (GHz) | Radar Band | Aluminum Reference (dB) | Panel #218 Baseline Glass/Epoxy (dB) | Panel #70 Autoclave Cure (dB) | Panel #134 Autoclave Cure (dB) | Panel #165 Cavity Press Cure (dB) | Panel #220 Cavity Press Cure (dB) |
|---|---|---|---|---|---|---|---|
| 2 | L-Band | 85 | 0 | 61 | 60 | 61 | 60 |
| 4 | S-Band | 99 | 0 | 66 | 80 | 77 | 81 |
| 6 | C-Band | 86 | 0 | 69 | 72 | 72 | 78 |
| 8 | | 85 | 0 | 78 | 87 | 87 | 91 |
| 10 | X-Band | 81 | 0 | 74 | 92 | 89 | 96 |
| 12 | | 82 | 0 | 71 | 98 | 95 | 101 |
| 14 | | 83 | 0 | 68 | 95 | 97 | 106 |
| 16 | K-Band | 94 | 0 | 82 | 109 | 92 | 112 |
| 18 | | 73 | 2 | 87 | 95 | 76 | 105 |
| Average EMI Shielding Effectiveness | | | 0.2 | 72.9 | 87.6 | 82.9 | 92.2 |
| Weight % Fiber in Composite | | | 74.41% | 11.45% | 19.25% | 34.53% | 24.41% |
| Average CNT Weight % on Fiber | | | 0% | 14.62% | 22.69% | 9.26% | 27.8% |
| CNT Weight % in Composite | | | 0% | 1.67% | 4.37% | 3.20% | 6.78% |

Figure 15

CNS-SHIELDED WIRES

STATEMENT OF RELATED APPLICATIONS

This application is a continuation-in-part of U.S. application Ser. No. 12/766,812, filed Apr. 23, 2010, which in turn claims the benefit of U.S. Provisional Application No. 61/172,503, filed Apr. 24, 2009, and U.S. Provisional Application No. 61/173,435, filed Apr. 28, 2009, both of which are incorporated herein by reference in their entirety.

FIELD OF INVENTION

The present invention relates to generally to materials that absorb electromagnetic (EM) radiation.

BACKGROUND

The performance of electric and electronic circuits can be adversely affected by unwanted disturbances due to electromagnetic conduction or electromagnetic radiation emitted from an external source. Such unwanted disturbances can interrupt, obstruct or otherwise degrade the effective performance of the electric and electronic circuits. Housing structures for shielding electric and electronic circuits from external electromagnetic interference (EMI) have been developed. EMI shielding is generally achieved by having the housing structures configured to limit the penetration of electromagnetic fields into the enclosed spaces within. The housing structures, fabricated using conductive materials are known as "Faraday cages," which operate as barriers to block the electromagnetic fields. More particularly, and as is known in the art, a Faraday cage is an enclosure formed by a conducting material and can be used to block external electromagnetic interference. When the housing structures are subjected to external electromagnetic forces, electric currents are generated in the conductive housing structures, which electric currents, in turn, produce electromagnetic forces opposing and cancelling the external electromagnetic fields.

Likewise, lightning protection systems utilize conductive housings to provide a low-impedance path for lightning currents while reducing the heating effect of the currents flowing through the conductive housing structures. These reduced heating effects mitigate fire hazards due to lightning strikes.

Generally, conductive materials used for fabricating such EMI shielded housing structures and/or lightning protection applications include highly conductive metals such as copper and aluminum. These metals, however, are relatively heavy. Lighter materials such as composites or "composites," even those made from conductive fibers such as carbon, are typically insulating and therefore have poor EMI shielding and lightning protection characteristics, due to the presence of the matrix material (e.g. resin). Such composites, although desirable for their given characteristics, are not suitable for applications which require good EMI shielding and/or lightning protection characteristics.

To improve the EMI shielding and the lightning protection characteristics of composites, metal fillers, metal coating, metal meshes, or other metal components have been incorporated in composites. However, such incorporation results in heavier and more complex composites. Alternative composites suitable for use in EMI shielding and/or lightning protection applications are desirable. The present invention satisfies this need and provides related advantages as well.

SUMMARY OF THE INVENTION

In some aspects, embodiments disclosed herein relate to a composite for use in electromagnetic interference (EMI) shielding applications that includes a carbon nanotube (CNT)-infused fiber material disposed in at least a portion of a matrix material. The composite is capable of absorbing electromagnetic (EM) radiation, reflecting EM radiation, or combinations thereof in a frequency range from between about 0.01 MHz to about 18 GHz. The EM shielding capacity of the composite, measured as electromagnetic interference (EMI) shielding effectiveness (SE), is in a range from between about 40 decibels (dB) to about 130 dB.

In some aspects, embodiments disclosed herein relate to a method of manufacturing the aforementioned composite, the method including disposing a CNT-infused fiber material in a portion of a matrix material with a controlled orientation of the CNT-infused fiber material within the matrix material, and curing the matrix material. The controlled orientation of the CNT-infused fiber material controls the relative orientation of CNTs infused thereon within the overall composite structure.

In some aspects, embodiments disclosed herein relate to a panel that includes the aforementioned composite. The panel is adaptable to interface with a device for use in EMI shielding applications. The panel is further equipped with an electrical ground.

In some aspects, embodiments disclosed herein provide a shielded wire comprising a carbon nanostructure (CNS)-shielding layer comprising a CNS material in a matrix material, the CNS-shielding layer being monolithic and disposed about a conducting wire and an optional dielectric layer and, when present the dielectric layer is disposed between the CNS-shielding layer and the conducting wire.

In some aspects, embodiments disclosed herein provide an extruded thermoplastic jacket comprising a CNS material, the extruded thermoplastic jacket being configured to protect at least one wire.

In some aspects, embodiments disclosed herein provide a thermoplastic article comprising a CNS-infused fiber material and a flexible thermoplastic resin comprising at least one selected from the group consisting of polyethylene terephthalate (PET, Mylar), polytetrafluoroethylene (PTFE), and polyvinyl chloride (PVC).

BRIEF DESCRIPTION OF THE DRAWINGS

FIG. 14 shows EMI shielding effectiveness of CNT-infused glass fiber-epoxy composites.

FIG. 15 shows EMI shielding effectiveness of CNT-infused carbon fiber-epoxy composites.

DETAILED DESCRIPTION

Figure 1:
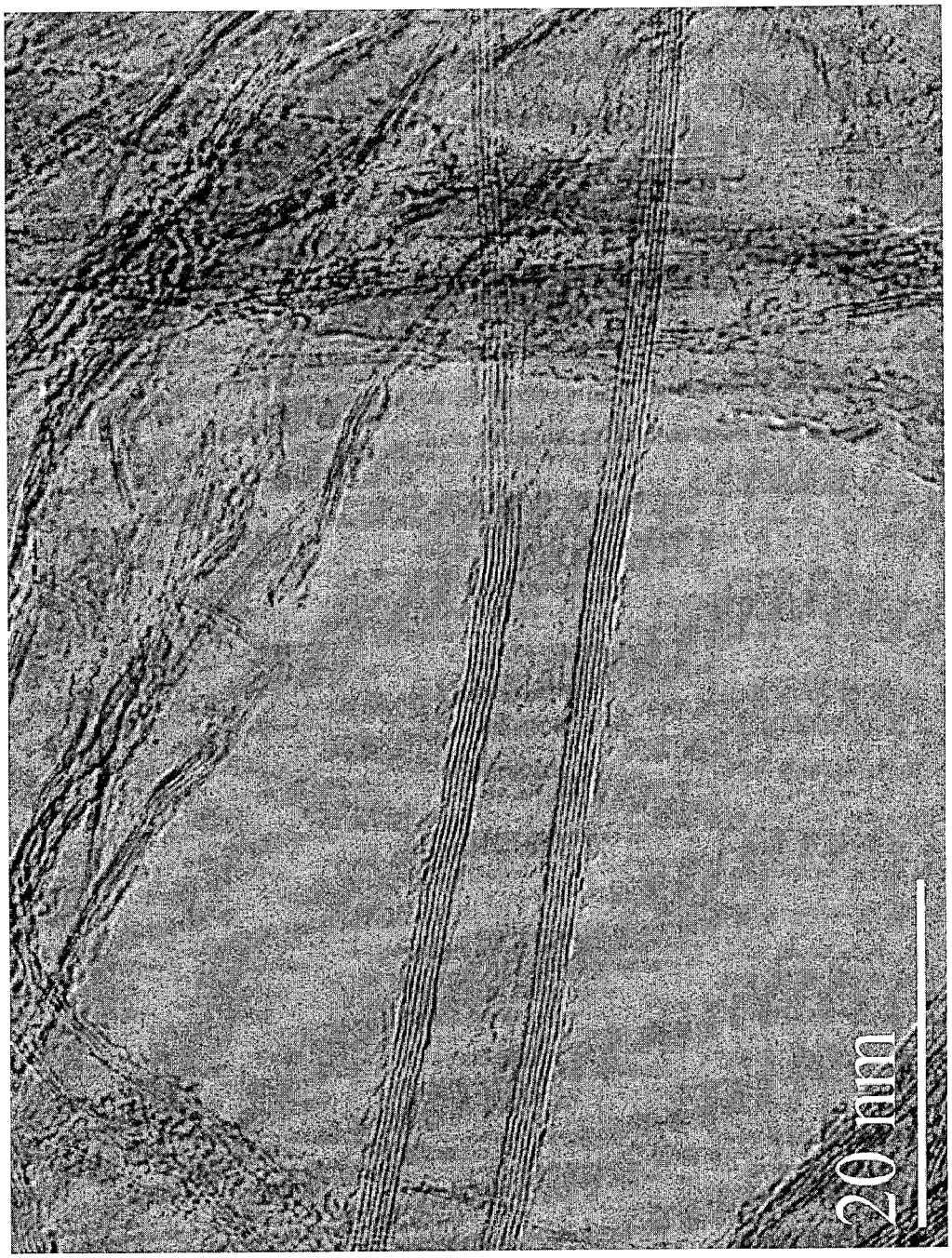
FIG. 1 shows a transmission electron microscope (TEM) image of a multi-walled CNT (MWNT) grown on AS4 carbon fiber via a continuous CVD process.

The present invention is directed, in part, to composites that provide EMI shielding. The EMI shielding composites disclosed herein have carbon nanotube (CNT)-infused fiber materials disposed in a portion of a matrix material. CNTs have desirable electromagnetic absorption properties due to their high aspect ratio. The CNTs in the composites of the present invention are capable of absorbing a broad range of EM radiation frequencies, and dissipating the absorbed energy to an electrical ground and/or as heat, for example. Mechanistically, the CNTs can also reflect EM radiation. Moreover, for EMI shielding applications, any combination of absorption and reflectance is useful as long as transmittance of the electromagnetic radiation is minimized. Regardless of the actual operable mechanism, and without being bound by theory, composites of the present invention can operate by reducing and/or preventing substantial electromagnetic interference.

The EMI shielding composites of the invention can improve the shielding characteristics of materials already employed in EMI shielding applications. In some embodiments, the CNT-infused fibers impart improved EMI shielding of dielectric as well as conductive composites, resulting in the ability to use low weight, high strength composites. Some such composites may have been previously limited in application due to their inherently poor EMI shielding capabilities.

EMI shielding composites of the invention can provide an absorbent surface that is nearly a black body across different sections of the electromagnetic spectrum including visible, infrared (IR) and other portions of various radar bands. In order to achieve black body-like behavior, the CNT density on the fiber material can be controlled. Thus, for example, the refractive index of the CNT-infused fiber material can be tuned to closely match the refractive index of air. According to Fresnel's law this is when reflectance would be minimized. Although minimizing reflection can be useful to optimize EM absorption, the composites of the invention can also be designed to minimize transmittance through the EMI shielding layer. In other words, absorption is useful to the extent that it can provide EMI shielding. For a particular wavelength that is not effectively absorbed by the CNT-infused fiber material, it is beneficial to provide reflectance or provide a secondary structure capable absorbing the radiation not absorbed by the CNT-infused fiber material. In this regard, it can be beneficial to provide progressive layering of different CNT-infused fiber materials to provide alternate absorption characteristics. Alternatively, or in addition to multiple-layered materials, it can also be useful to incorporate a reflecting material, which can also be a CNT-infused fiber material. Thus, for example, a composite of the present invention can have multiple absorbing and/or reflecting layers comprising CNT-infused fiber materials.

The fiber material itself is a scaffold that organizes the CNTs in an array that provides an overall composite with sufficient CNT density to create effective percolation pathways for dissipation of the energy upon EM radiation absorption. The infused CNTs can be tailored to have a uniform length, density, and controlled orientation on the fiber material and in the overall composite to maximize EM radiation absorption.

By relying on CNTs for EM shielding properties, the composites can utilize fiber materials and/or matrices that are either conducting or insulating. Moreover, the EMI shielding composites can be integrated as part of the surface structure of the article in which it is used. In some embodiments, an entire article can function as an EMI shield, not just the surface. In some embodiments, CNT-infused fiber materials can be employed as a coating for a pre-fabricated composites for use in EMI shielding applications.

The manufacturing process to create CNT-infused fibers for the aforementioned EM shielding materials is described herein further below. The process is amenable to large scale continuous processing. In the process, CNTs are grown directly on carbon, glass, ceramic, or similar fiber materials of spoolable dimensions, such as tows or rovings. The nature of the CNT growth is such that a dense forest is deposited at lengths that can be tuned between about 5 microns to about 500 microns long, the length being controlled by various factors as described below. This forest can be oriented such that the CNTs are perpendicular to the surface of each individual filament of a fiber material thus providing radial coverage. In some embodiments, the CNTs can be further processed to provide an orientation that is parallel to the axis of the fiber material. The resulting CNT-infused fiber materials can be wound as manufactured or can be woven into fabric goods for use in producing the EMI shielding composites used in EMI shielding applications.

As used herein, the term "EMI shielding composite" refers to any composite that has at least a CNT-infused fiber material disposed in a matrix material capable of any combination of absorbing or reflecting electromagnetic radiation, while minimizing transmittance. The EMI shielding composites of the invention have at least three components, CNTs, a fiber material, and a matrix material. These components create an organized hierarchy wherein the CNTs are organized by the fiber material to which they are infused. The CNT-infused fiber material is, in turn, organized by the matrix material in which it is disposed. This is in contrast to composites that utilize loose carbon nanotubes, which are typically prepared by various blending, mixing, extrusion, and/or pultrusion techniques. The CNTs of the EMI shielding composites of the invention can absorb or reflect electromagnetic radiation associated with a transmitting source. Any absorbed electromagnetic radiation can be converted to an electrical signal, channeled to an electrical ground, and/or converted to heat, for example.

As used herein, the term "electromagnetic radiation," or "EM radiation" refers to any EM frequency ranging from about 0.01 megahertz to about 300 gigahertz. EMI shielding composites of the present invention are particularly effective, for example, in the low frequency (LF- through UHF-) and high frequency (L- through K-band) radar bands as described herein further below.

As used herein, the term "electromagnetic interference," or "EMI" refers to the disruption of operation of an electronic device when it is in the vicinity of an electromagnetic field (EM field) from another source. "EMI shielding" is a process that employs a material that can protect against such interference. Such materials are capable of absorbing and/or reflecting the interfering electromagnetic radiation. "EMI shielding effectiveness," or "EMI-SE," "shielding effectiveness" or "SE," or grammatical equivalents thereof, refers to a standardized measurement of the ability of a material to attenuate/protect an electronic device from interference by an EM field of another source. EMI-SE is measured as a function of the difference between an interfering electromagnetic signal's intensity before shielding and its intensity after shielding and is typically measured in decibels (dB) at a particular frequency measured in hertz (Hz), such as megahertz (MHz), gigahertz (GHz), or the like.

As used herein, the term "EM shielding capacity" refers to the ability of composites of the invention to absorb or reflect electromagnetic radiation of any frequency. It can be measured by standardized EMI-SE measurements.

As used herein, the term "fiber material" refers to any material which has fiber as its elementary structural component. The term encompasses fibers, filaments, yarns, tows, tows, tapes, woven and non-woven fabrics, plies, mats, 3D woven structures and the like. The fiber material can be any organic or inorganic material including carbon, glass, ceramic, metal, and organic fibers such as aramids or natural organic fibers such as silks, celluloses fibers, and the like.

As used herein, the term "spoolable dimensions" refers to fiber materials having at least one dimension that is not limited in length, allowing for the material to be stored on a spool or mandrel. Fiber materials of "spoolable dimensions" have at least one dimension that indicates the use of either batch or continuous processing for CNT infusion as described herein. Fiber materials of "spoolable dimensions" can be obtained commercially as glass, carbon, ceramic, and similar products. An exemplary carbon fiber material of spoolable dimensions that is commercially available is exemplified by AS4 12 k carbon fiber tow with a tex value of 800 (1 tex=1 g/1,000 m) or 620 yard/lb (Grafil, Inc., Sacramento, Calif.). Commercial carbon fiber tow, in particular, can be obtained in 5, 10, 20, 50, and 100 lb. (for spools having high weight, usually a 3 k/12 K tow) spools, for example, although larger spools may require special order. Processes of the invention operate readily with 5 to 20 lb. spools, although larger spools are usable. Moreover, a pre-process operation can be incorporated that divides very large spoolable lengths, for example 100 lb. or more, into easy to handle dimensions, such as two 50 lb spools.

As used herein, the term "carbon nanotube" (CNT, plural CNTs) refers to any of a number of cylindrically-shaped allotropes of carbon of the fullerene family including single-walled carbon nanotubes (SWNTs), double-walled carbon nanotubes (DWNTs), and multi-walled carbon nanotubes (MWNTs). CNTs can be capped by a fullerene-like structure or open-ended. CNTs include those that encapsulate other materials. The CNTs which are infused to the various fiber substrates disclosed herein appear in an array with a complex morphology which can include individual CNTs, shared-wall CNTs, branched CNTs, crosslinked CNTs, and the like in a random distribution. Taken together the complex CNT morphology is referred to herein as a "carbon nanostructure," or "CNS" (plural "CNSs"). CNSs are distinct from arrays of individual CNTs due to this complex morphology.

As used herein "uniform in length" refers to the length of CNTs grown in a reactor. "Uniform length" means that the CNTs have lengths with tolerances of plus or minus about 20% of the total CNT length or less, for CNT lengths varying from between about 1 micron to about 500 microns. At very short lengths, such as 1-4 microns, this error may be in a range from between about plus or minus 20% of the total CNT length up to about plus or minus 1 micron, that is, somewhat more than about 20% of the total CNT length. In applications to EMI shielding the lengths (as well as density of coverage) of the CNTs can be used to modulate EM radiation absorption and/or reflection and can be optimized for absorption maxima or reflection in a targeted EM frequency band.

As used herein "uniform in distribution" refers to the consistency of density of CNTs on a carbon fiber material. "Uniform distribution" means that the CNTs have a density on the carbon fiber material with tolerances of plus or minus about 10% coverage defined as the percentage of the surface area of the fiber covered by CNTs. This is equivalent to ±1500 CNTs/$\mu m^2$ for an 8 nm diameter CNT with 5 walls. Such a figure assumes the space inside the CNTs as fillable.

Figure 16:
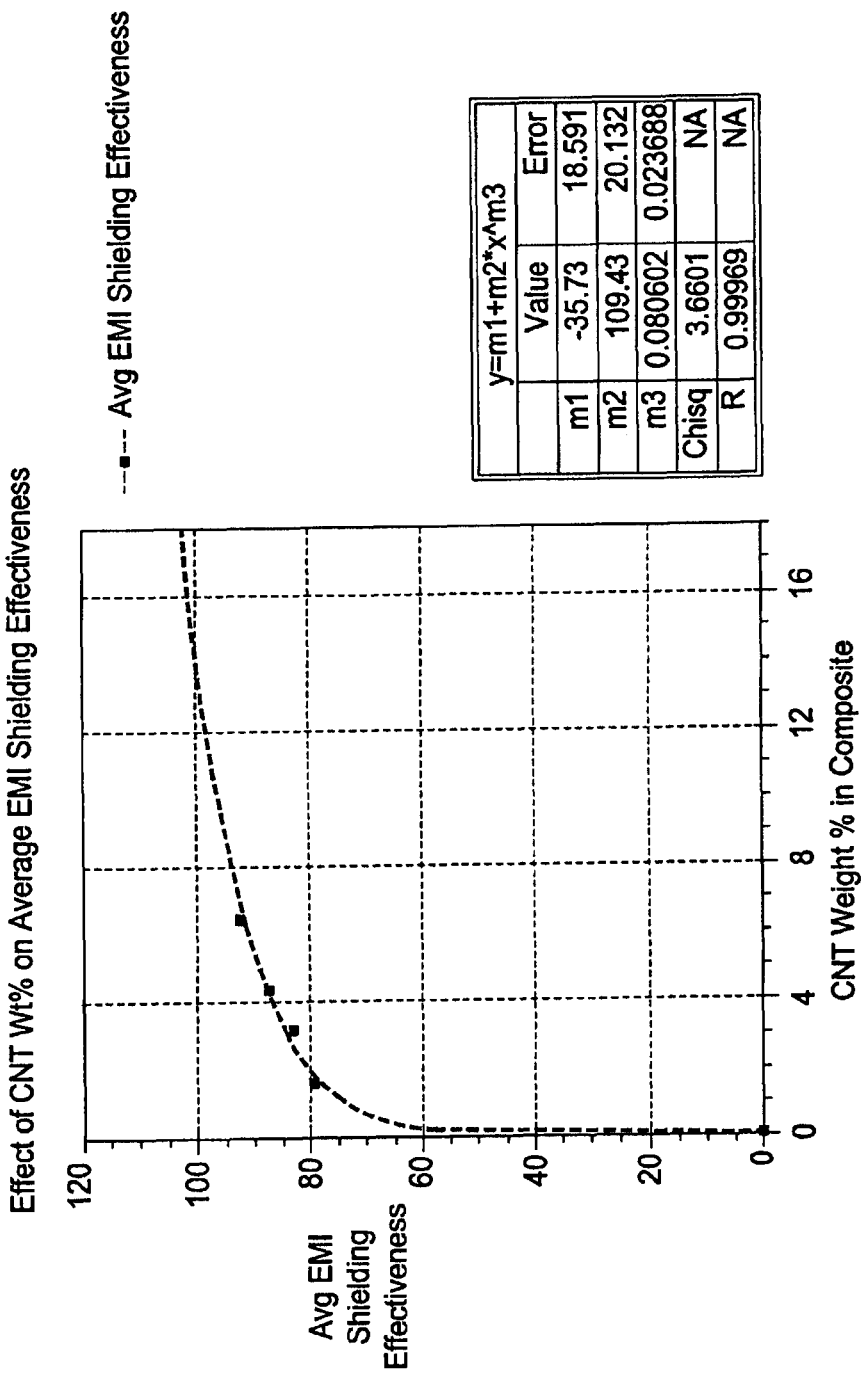
FIG. 16 shows a graph of the average EMI shielding effectiveness of CNT-infused composites as a function of CNT weight % in composite.

As used herein, the term "CNT weight %" means the weight or mass percentage of CNTs present in the final composite. This percentage represents the ratio of the total weight of the CNTs in the composite divided by the total weight of the final composite structure times 100%. "CNT weight %" is a material property which combines the CNT distribution and CNT length. As a result, "CNT weight %" is used to describe the effect of CNTs in composites on the average EMI SE. For example, as shown in FIG. 16, for an average EMI SE of 0-60 dB a CNT weight % of <1% is employed, for an average EMI SE of 60-80 dB a CNT weight % of between 0.5-2% is employed, and for an average EMI SE of >80 dB a CNT weight % of >2% is employed.

As used herein, the term "infused" means bonded and "infusion" means the process of bonding. Such bonding can involve direct covalent bonding, ionic bonding, pi-pi, and/or van der Waals force-mediated physisorption. For example, in some embodiments, the CNTs can be directly bonded to the carbon fiber material. Bonding can be indirect, such as the CNT infusion to the carbon fiber material via a barrier coating and/or an intervening transition metal nanoparticle disposed between the CNTs and carbon fiber material. In the CNT-infused carbon fiber materials disclosed herein, the carbon nanotubes can be "infused" to the carbon fiber material directly or indirectly as described above. The particular manner in which a CNT is "infused" to a carbon fiber materials is referred to as a "bonding motif."

As used herein, the term "transition metal" refers to any element or alloy of elements in the d-block of the periodic table. The term "transition metal" also includes salt forms of the base transition metal element such as oxides, carbides, nitrides, and the like.

As used herein, the term "nanoparticle" or NP (plural NPs), or grammatical equivalents thereof refers to particles sized between about 0.1 to about 100 nanometers in equivalent spherical diameter, although the NPs need not be spherical in shape. Transition metal NPs, in particular, serve as catalysts for CNT growth on the carbon fiber materials.

As used herein, the term "sizing agent," "fiber sizing agent," or just "sizing," refers collectively to materials used in the manufacture of carbon and glass fibers (or any other fiber that might require a protective coating) as a coating to protect the integrity of fibers, provide enhanced interfacial interactions between the fiber and a matrix material in a composite, and/or alter and/or enhance particular physical properties of the fiber. In some embodiments, CNTs infused to fiber materials behave as a sized fiber. That is, the CNTs provide a degree of protection of the fiber such that CNT behaves as a sizing material.

As used herein, the term "matrix material" refers to a bulk material than can serve to organize sized CNT-infused carbon fiber materials in particular orientations, including random orientation. The matrix material can benefit from the presence of the CNT-infused fiber material by imparting some aspects of the physical and/or chemical properties of the CNT-infused fiber material to the matrix material. In EMI shielding applications, the matrix material, in conjunction fiber material, provide better CNT densities and control of CNT orientation than would be available by simple mixing of CNTs with the matrix alone. The densities and "packing" of the CNT-infused fiber material can provide percolation pathways that improve EMI shielding effectiveness by providing a means to more efficiently dissipate absorbed electromagnetic radiation or provide effective reflection.

As used herein, the term "material residence time" refers to the amount of time a discrete point along a fiber material of spoolable dimensions is exposed to CNT growth conditions during the CNT infusion processes described herein. This definition includes the residence time when employing multiple CNT growth chambers.

As used herein, the term "linespeed" refers to the speed at which a fiber material of spoolable dimensions can be fed through the CNT infusion processes described herein, where linespeed is a velocity determined by dividing CNT chamber (s) length by the material residence time.

Figure 17:
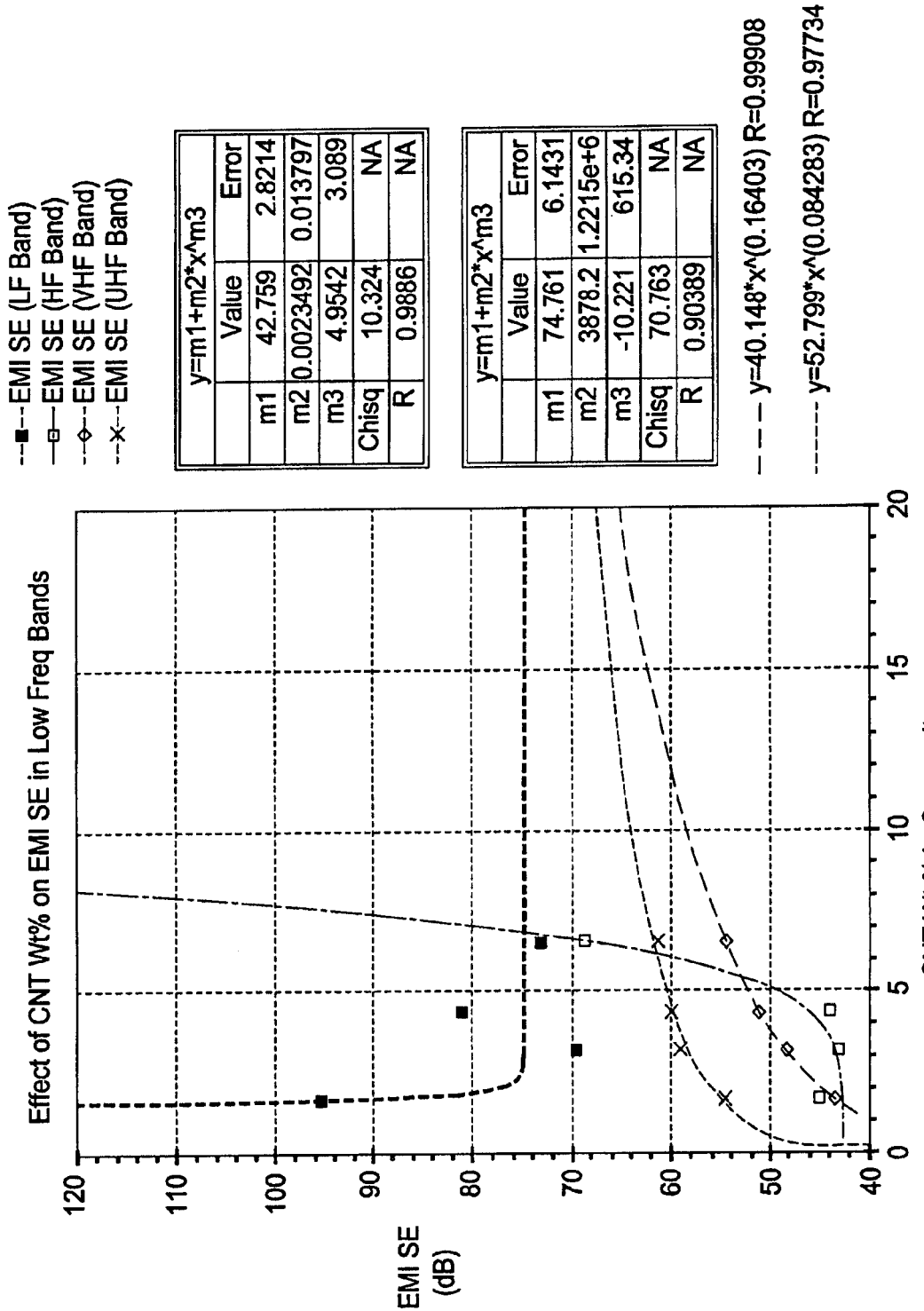
FIG. 17 shows a graph of the average EMI shielding effectiveness in the Low Frequency Bands for CNT-infused composites as a function of CNT weight % in composite.
Figure 18:
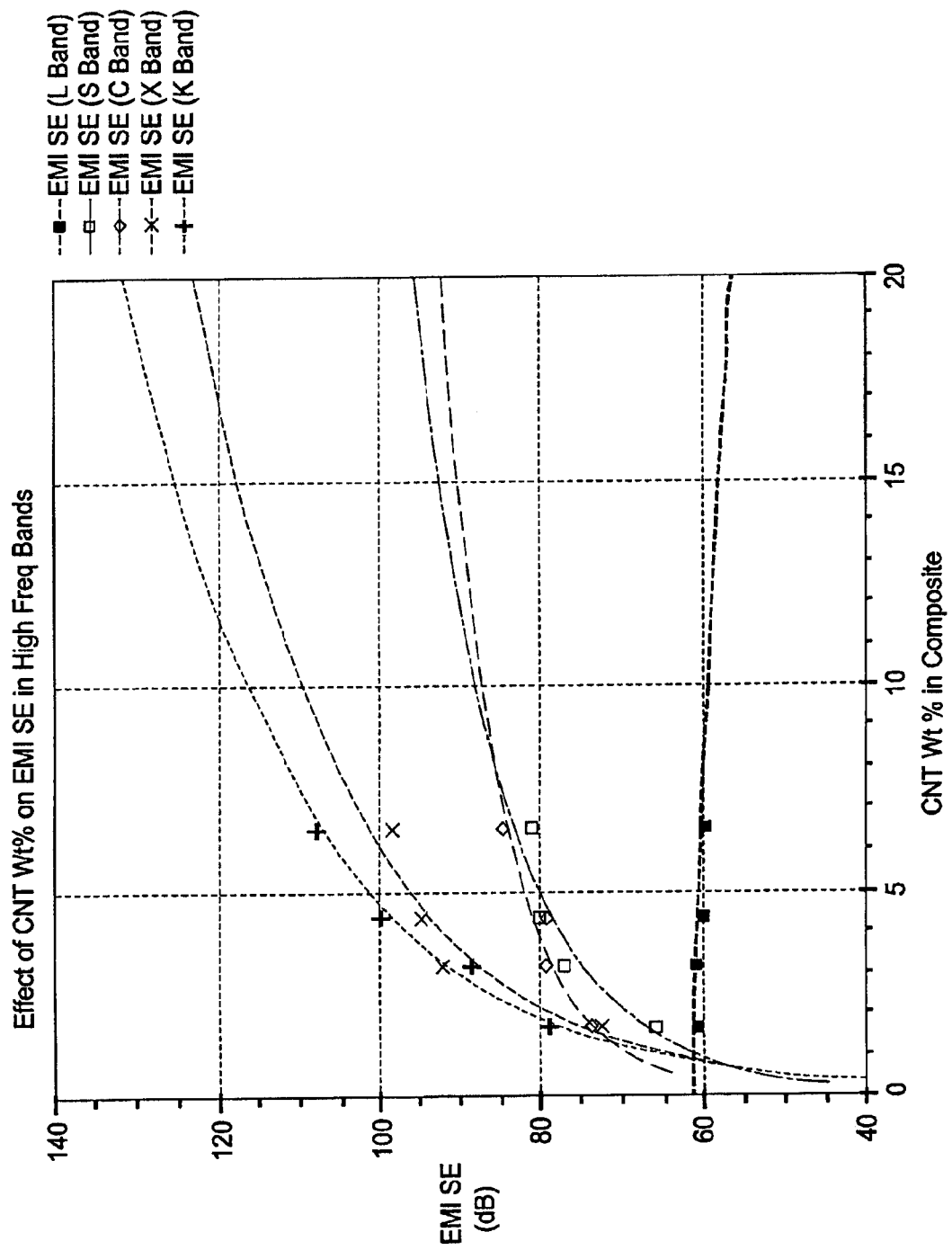
FIG. 18 shows a graph of the average EMI shielding effectiveness in the High Frequency Bands for CNT-infused composites as a function of CNT weight % in composite.

In some embodiments, the present invention provides an EMI shielding composite that includes a (CNT)-infused fiber material disposed in at least a portion of a matrix material. The composite is capable of absorbing or reflecting EM radiation in a frequency range from between about 0.01 MHz to about 18 GHz. The EMI shielding capacity can be measured as electromagnetic interference (EMI) shielding effectiveness (SE) and can be in a range from between about 40 decibels (dB) to about 130 dB. For example, in FIG. 17, for the HF-, VHF-, and UHF-bands increasing CNT weight % improves EMI SE from as low as 40 dB to as high as 70 dB at CNT weight % of nearly 20% in composite. According to FIG. 17, EMI SE of the LF-band is generally not significantly affected by increasing CNT weight % and remains constant at around 75 dB. With regard to FIG. 18, L-band EMI SE is also relatively constant with the presence of CNTs consistently providing about 60 dB of EMI SE. The S- and C-bands have a nearly identical response, as EMI SE can range from 70 dB at 1 wt % CNT to as high as 90 dB at 20 wt % CNT. Finally, the EMI SE of the X- and K-bands show a similar response with as little as 1 wt % CNT resulting in a 60 dB EMI SE and as high as 20 wt % CNT resulting in between 120 and 130 dB EMI SE. These shielding materials are merely exemplary. One skilled in the art will recognize that further shielding effectiveness can be achieved using multiple layers of CNT infused fiber materials, for example, and that CNT density, length, and orientation can be modified to tune the shielding effectiveness through a combination of altering the absorption or reflecting properties of the CNT-infused fiber materials.

One skilled in the art will also recognize that the SE is a function of the EM radiation frequency. Thus, the SE at 2 GHz can be different than the SE at 18 GHz. One skilled in the art will also recognize that in applications related to EMI shielding, it is desirable to either absorb EM radiation or reflect it. By contrast, in radar absorption for signature control in stealth applications, for example, it is desirable to manufacture materials that absorb and/or transmit EM radiation. From a mechanistic standpoint, both EMI shielding and radar absorbing applications benefit from any absorption characteristics provided by the presence of a CNT-infused fiber material. Transmittance or reflectance of non-absorbed radiation can be determined by other parameters such as the inherent properties of the bulk matrix, for example. In some embodiments, maximized CNT loadings on fiber materials can provide a composite that behaves like a reflecting metal which is particularly useful for EMI shielding applications.

The EMI shielding composites include CNT-infused fiber materials that are typically constructed by infusing CNTs on "continuous" or "spoolable" lengths of a fiber material such as a tow, roving, fabric, or the like. The SE, and hence the EM radiation absorption capacity can vary depending on, for example, CNT length, CNT density, and CNT orientation. The processes by which CNT-infused fiber materials are made allow for the construction of EMI shielding composites with well-defined absorption and/or reflecting capability. The CNT length and orientation on the fiber material is controlled in the CNT growth process described herein below. CNT orientation about the fiber from the growth process provides CNTs that are generally radially grown about the fiber axis. Post-growth reorienting of the CNTs infused to the fiber can be achieved by mechanical or chemical means or by use of an electrical field. In some such embodiments, the CNTs can be re-oriented to lay along the fiber axis. The relative orientation of the CNTs in the composite are in turn controlled by the composite manufacturing process which orients the CNT-infused fiber.

The EMI shielding composites of the invention can be constructed to absorb and/or reflect one or more EM radiation frequency bands. In some embodiments, a single spoolable length of CNT-infused fiber can be provided that has differing CNT lengths and orientations of CNTs along different sections of the single spoolable length in order to maximize absorption and/or reflection of different EM radiation frequency bands. Alternatively, multiple spoolable lengths of fiber material with differing CNT lengths and/or orientations can be disposed in the composite for the same effect. Either strategy provides layers within a composite with differing EM radiation absorption and/or reflecting characteristics. The multiple orientations for the CNTs also allow the EMI shielding composite to absorb and/or reflect electromagnetic radiation from multiple EM radiation sources impinging at different incident angles on the composite.

One skilled in the art will recognize that any one particular section of CNT-infused fiber material can display both EM absorbing and reflecting properties, even at a single wavelength of EM radiation. Thus, EM shielding effectiveness of a given CNT-infused fiber material represents its combined ability to absorb and reflect EM radiation and it need not be solely an absorbing or reflecting material. In the context of multi-layered constructs, different layers can be designed to be predominantly reflecting, while other layers can be designed to be predominantly absorbing.

The packing of CNTs in a composite structure can provide percolation pathways to dissipate the energy of any absorbed EM radiation. Without being bound by theory, this can be the result of CNT-to-CNT point contact or CNT-to-CNT interdigitation as exemplified in FIGS. 7-9. In some embodiments, any absorbed EM energy in the CNTs can be transformed into electrical signals that can be integrated with a computer system to modulate the orientation of an article that incorporates the EMI shielding composite, such as a panel, to maximize EM radiation absorption in response to a EM radiation transmitting source or in a reflected EM signal in detection applications, for example. Similarly, the ability to reflect EM radiation can also be tied to CNT density and orientation. For example, at high CNT densities, including greater than about 1%, the CNTs can behave, in part, as a metal that reflects EM radiation.

In some embodiments, the EMI shielding composite is provided as an integral part of an entire article or structure for use in stealth applications. In such embodiments, the EMI shielding character can be provided by a predominantly absorbing mechanism, while minimizing a reflecting mechanism. In some such embodiments, the density of CNTs on the CNT-infused fiber material can be tuned to provide a material with an index of refraction close to that of air to minimize reflectance and maximize EM radiation absorption.

The EMI shielding CNT-infused fiber material can be provided in a portion of the overall composite structure. For example a composite structure can have a surface "skin" that incorporates CNT-infused fiber material to absorb and/or reflect EM radiation. In other embodiments, the EMI shielding composite can be applied as a coating on an already existing surface of another composite or other article. In some embodiments, a coating employs long lengths of fiber material which helps prevent chipping and the like as might occur with conventional coatings. Moreover, when employed as a coating an overcoating can be used to further protect the EMI shielding composite. Also when used as a coating, the matrix of a CNT-infused fiber composite can closely match or be identical to the bulk matrix of the overall structure to provide superior bonding between the coating and the structure.

CNT-infused fiber materials of the EMI shielding composites are provided in which sections of the infused CNTs are substantially uniform in length. This provides an overall composite product with reliable absorption properties across large cross-sectional areas. In the continuous process described herein for the production of CNT-infused fiber materials, the residence time of the fiber material in a CNT growth chamber can be modulated to control CNT growth and ultimately, CNT length. This provides a means to control specific properties of the CNTs grown. CNT length can also be controlled through modulation of the carbon feedstock and carrier gas flow rates and reaction temperature. Additional control of the CNT properties can be obtained by controlling, for example, the size of the catalyst used to prepare the CNTs. For example, 1 nm transition metal nanoparticle catalysts can be used to provide SWNTs in particular. Larger catalysts can be used to prepare predominantly MWNTs.

Additionally, the CNT growth processes employed are useful for providing a CNT-infused fiber material with uniformly distributed CNTs on the fiber materials while avoiding bundling and/or aggregation of the CNTs that can occur in processes in which pre-formed CNTs are suspended or dispersed in a solvent solution and applied by hand to the fiber material. Such aggregated CNTs tend to adhere weakly to a fiber material and the characteristic CNT properties are weakly expressed, if at all. In some embodiments, the maximum distribution density, expressed as percent coverage, that is, the surface area of fiber covered, can be as high as about 55% assuming about 8 nm diameter CNTs with 5 walls. This coverage is calculated by considering the space inside the CNTs as being "fillable" space. Various distribution/density values can be achieved by varying catalyst dispersion on the surface as well as controlling gas composition and process speed. Typically for a given set of parameters, a percent coverage within about 10% can be achieved across a fiber surface. Higher density and shorter CNTs are useful for improving mechanical properties, while longer CNTs with lower density are useful for improving thermal and electrical properties, including EMI shielding and radar absorption, although increased density is still favorable. A lower density can result when longer CNTs are grown. This can be the result of the higher temperatures and more rapid growth causing lower catalyst particle yields.

CNTs useful for infusion to the fiber materials include single-walled CNTs, double-walled CNTs, multi-walled CNTs, and mixtures thereof. The exact amount of CNTs to be used depends on the end-use application of the EMI shielding composite. CNTs can be used for thermal and/or electrical conductivity applications, in addition to EMI shielding and radar absorption. In some embodiments, the infused carbon nanotubes are single-wall nanotubes. In some embodiments, the infused carbon nanotubes are multi-wall nanotubes. In some embodiments, the infused carbon nanotubes are a combination of single-wall and multi-wall nanotubes. There are some differences in the characteristic properties of single-wall and multi-wall nanotubes that, for some end uses of the fiber, dictate the synthesis of one or the other type of nanotube. For example, single-walled nanotubes can be semi-conducting or metallic, while multi-walled nanotubes are metallic. Thus, it can be desirable to control the CNT type if the absorbed EM radiation is to be converted into, for example, and electrical signal that can integrate with a computer system.

CNTs lend their characteristic properties such as mechanical strength, low to moderate electrical resistivity, high thermal conductivity, and the like to the CNT-infused fiber material. For example, in some embodiments, the electrical resistivity of a carbon nanotube-infused fiber material can be lower than the electrical resistivity of the parent fiber material alone. More generally, the extent to which the resulting CNT-infused fiber expresses these characteristics can be a function of the extent and density of coverage of the carbon fiber by the carbon nanotubes. These properties can also be transferred to the overall EMI shielding composite in which they are incorporated. Any amount of the fiber surface area, from 0-55% of the fiber can be covered assuming an 8 nm diameter, 5-walled MWNT (again this calculation counts the space inside the CNTs as fillable). This number is lower for smaller diameter CNTs and more for greater diameter CNTs. 55% surface area coverage is equivalent to about 15,000 CNTs/micron$^2$. Further CNT properties can be imparted to the carbon fiber material in a manner dependent on CNT length. Infused CNTs can vary in length ranging from between about 1 micron to about 500 microns, including 1 micron, 2 microns, 3 microns, 4 micron, 5, microns, 6, microns, 7 microns, 8 microns, 9 microns, 10 microns, 15 microns, 20 microns, 25 microns, 30 microns, 35 microns, 40 microns, 45 microns, 50 microns, 60 microns, 70 microns, 80 microns, 90 microns, 100 microns, 150 microns, 200 microns, 250 microns, 300 microns, 350 microns, 400 microns, 450 microns, 500 microns, and all values in between. CNTs can also be less than about 1 micron in length, including about 0.5 microns, for example. CNTs can also be greater than 500 microns, including for example, 510 microns, 520 microns, 550 microns, 600 microns, 700 microns and all values in between. For some EMI shielding applications, the CNTs can vary in length from between about 100 nm to about 25 microns. For purely EMI shielding applications, CNTs can vary in length from between about 100 nm to about 500 μm. EM shielding composites of the invention can incorporate CNTs have a length from about 1 micron to about 10 microns. Such CNT lengths can be useful in application to increase shear strength as well. CNTs can also have a length from about 5 to about 70 microns. Such CNT lengths can be useful in applications for increased tensile strength if the CNTs are aligned in the fiber direction. CNTs can also have a length from about 10 microns to about 100 microns. Such CNT lengths can be useful to increase electrical/thermal properties as well as mechanical properties. The process used for CNT infusion can also provide CNTs having a length from about 100 microns to about 500 microns, which can also be beneficial to increase electrical and thermal properties, including radar absorption and EMI shielding. Thus, the CNT-infused fiber material is multifunctional and can enhance many other properties of the overall EMI shielding composite. Thus, in some embodiments, composites that include spoolable lengths of CNT-infused fiber materials can have various uniform regions with different lengths of CNTs to address different targeted properties. For example, it can be desirable to have a first portion of CNT-infused carbon fiber material with uniformly shorter CNT lengths to enhance shear strength properties, and a second portion of the same spoolable material with a uniform longer CNT length to enhance EMI shielding effectiveness and/or radar absorption properties. Mechanical enhancement can be achieved, for example, by providing at least a portion of the EMI shielding composite with shorter CNTs, as described above, in a CNT-infused fiber material. The composite can take the form of a skin having longer CNTs at the surface of the EMI shielding composite for EM radiation shielding and shorter CNTs disposed below the surface for mechanical strengthening. The control of CNT length is readily achieved through modulation of carbon feedstock and inert gas flow rates coupled with varying linespeeds and growth temperature. This can vary the CNT length in different sections of the same spoolable length of fiber material or different spools can be employed and the different spools incorporated in the appropriate portion of the composite structure.

EMI shielding composites of the present invention include a matrix material to form the composite with the CNT-infused fiber material. Such matrix materials can include, for example, an epoxy, a polyester, a vinylester, a polyetherimide, a polyetherketoneketone, a polyphthalamide, a polyetherketone, a polytheretherketone, a polyimide, a phenol-formaldehyde, and a bismaleimide. Matrix materials useful in the present invention can include any of the known matrix materials (see Mel M. Schwartz, Composites Handbook (2d ed. 1992)). Matrix materials more generally can include resins (polymers), both thermosetting and thermoplastic, metals, ceramics, and cements.

Thermosetting resins useful as matrix materials include phthalic/maelic type polyesters, vinyl esters, epoxies, phenolics, cyanates, bismaleimides, and nadic end-capped polyimides (e.g., PMR-15). Thermoplastic resins include polysulfones, polyamides, polycarbonates, polyphenylene oxides, polysulfides, polyether ether ketones, polyether sulfones, polyamide-imides, polyetherimides, polyethylenes, polypropylenes, polyimides, polyarylates, and liquid crystalline polyester.

Metals useful as matrix materials include alloys of aluminum such as aluminum 6061, 2024, and 713 aluminum braze. Ceramics useful as matrix materials include carbon ceramics, such as lithium aluminosilicate, oxides such as alumina and mullite, nitrides such as silicon nitride, and carbides such as silicon carbide. Cements useful as matrix materials include carbide-base cermets (tungsten carbide, chromium carbide, and titanium carbide), refractory cements (tungsten-thoria and barium-carbonate-nickel), chromium-alumina, nickel-magnesia iron-zirconium carbide. Any of the above-described matrix materials can be used alone or in combination. Ceramic and metal matrix composites can be used, for example, in thrust vector control surfaces or other high temperature applications that use EMI shielding characteristics such as electronics boxes employed in high temp applications.

In some embodiments, the EMI shielding composite can further include a plurality of transition metal nanoparticles. These transition metal nanoparticles can be present as latent catalyst from the CNT growth procedure in some embodiments. Without being bound by theory, transition metal NPs, which serve as a CNT-forming catalyst, can catalyze CNT growth by forming a CNT growth seed structure. The CNT-forming catalyst can remain at the base of the fiber material, locked by an optional barrier coating (barrier coating presence depends on the fiber material type employed and is generally used for carbon and metal fibers for example), if present, and infused to the surface of the fiber material. In such a case, the seed structure initially formed by the transition metal nanoparticle catalyst is sufficient for continued non-catalyzed seeded CNT growth without allowing the catalyst to move along the leading edge of CNT growth, as often observed in the art. In such a case, the NP serves as a point of attachment for the CNT to the fiber material. The presence of a barrier coating can also lead to further indirect bonding motifs for CNT infusion. For example, the CNT forming catalyst can be locked into a barrier coating, as described above, but not in surface contact with fiber material. In such a case a stacked structure with the barrier coating disposed between the CNT forming catalyst and fiber material results. In either case, the CNTs formed are infused to the fiber material. In some embodiments, some barrier coatings will allow the CNT growth catalyst to follow the leading edge of the growing nanotube. In such cases, this can result in direct bonding of the CNTs to the fiber material or, optionally, to a barrier coating. Regardless of the nature of the actual bonding motif formed between the carbon nanotubes and the fiber material, the infused CNT is robust and allows the CNT-infused fiber material to exhibit carbon nanotube properties and/or characteristics.

In the absence of a barrier coating the latent CNT growth particles can appear at the base of the carbon nanotube, at the tip of the nanotube, anywhere in between, and mixtures thereof. Again, the infusion of the CNT to the fiber material can be either direct or indirect via the intervening transition metal nanoparticle. In some embodiments, the latent CNT growth catalyst includes iron nanoparticles. These may be of varying oxidation state including, for example, zero-valent iron, iron (II), iron (III), and mixtures thereof. The presence of latent iron based nanoparticles from CNT growth can further aid the EMI shielding property of the overall composite.

In some embodiments, the CNT-infused fiber can be passed through an iron, ferrite, or iron-based nanoparticle solution post growth. CNTs can absorb large quantities of iron nanoparticles which can further aid in EMI shielding. Thus, this additional processing step provides supplemental iron nanoparticles for improved EM radiation absorption.

EM shielding composites of the invention can absorb and/or reflect EM radiation across a wide spectrum, including across the spectrum of radar frequency bands. In some embodiments, the composites can absorb and/or reflect high frequency radar. High frequency (HF) radar bands have frequencies in a range from between about 3 to about 30 MHz (10-100 m). This radar band is useful in coastal radar and over-the-horizon radar (OTH) radar applications. In some embodiments, the composites can absorb and/or reflect radar in the P-band. This includes radar frequencies less than about 300 MHz. In some embodiments, the composites can absorb and/or reflect radar in the very high frequency band (VHF). VHF radar bands have frequencies in a range from between about 30 to about 330 MHz. The VHF band is useful in applications that are very long range, including, ground penetrating applications. In some embodiments, the composites can absorb radar in the ultra high frequency (UHF) band. The UHF band includes frequencies in a range from between about 300 to about 1000 MHz. Applications of the UHF band include very long range applications, such as ballistic missile early warning systems, ground penetrating and foliage penetrating applications. In some embodiments, the composites can absorb and/or reflect radar in the long (L) band. The L-band includes frequencies in a range from between about 1 to about 2 GHz. The L-band can be useful in long range applications including, for example, air traffic control and surveillance. In some embodiments, the composites can absorb and/or reflect radar in the short (S)-band. The S-band includes frequencies in a range from between about 2 to about 4 GHz. The S-band can be useful in applications such as terminal air traffic control, long-range weather, and marine radar. In some embodiments, the composite can absorb and/or reflect radar in the C-band which has frequencies in a range from between about 4 to about 8 GHz. The C-band has been used in satellite transponders and in weather applications. In some embodiments, the composite can absorb and/or reflect radar in the X-band which has frequencies that range from between about 8 to about 12 GHz 2. The X-band is useful in applications such as missile guidance, marine radar, weather, medium-resolution mapping and ground surveillance. In some embodiments, the composite can absorb and/or reflect radar in the K-band which includes frequencies between about 12 to about 18 GHz. The K-band can be used for detecting clouds by meteorologists, and used by police for detecting speeding motorists employing K-band radar guns. In some embodiments, the composites absorbs and/or reflects radar in the $K_a$-band which includes frequencies from between about 24 to about 40 GHz. The $K_a$-band can be used in photo radar, such as those used to trigger cameras at traffic signals.

In some embodiments, the composite absorbs and/or reflects radar in the millimeter (mm) band which is broadly between about 40 to about 300 GHz. The mm-band includes the Q-band from between about 40 to about 60 GHz which is used in military communication, the V-band from between about 50 to about 75 GHz, which is strongly absorbed by atmospheric oxygen, the E-band from between about 60 to about 90 GHz, the W-band from between about 75 to about 110 GHz, which is used as a visual sensor for experimental autonomous vehicles, high-resolution meteorological observation, and imaging, and the UWB-band from between about 1.6 to about 10.5 GHz, which is used for through-the-wall radar and imaging systems.

In some embodiments, the composite has an SE between about 90 dB to about 110 dB in the K-band. In some embodiments, the composite has an SE between about 90 dB to about 100 dB in the X-band. In some embodiments, the composite has an SE between about 80 dB to about 90 dB in the C-band. In some embodiments, the composite has an SE between about 70 dB to about 80 dB in the S-band. In some embodiments, the composite has an SE between about 50 dB to about 60 dB in the L-band. FIGS. 15 through 18 show EMI shielding results for exemplary panels constructed for EMI shielding applications in accordance with the present invention. For example, panel 220 (FIG. 15) was tested in a range is between 0.1 MHz to 18 GHz.

As described above, shielding effectiveness (SE) is one means for assessing the EM radiation absorption and/or reflection capacity of the EMI shielding composites of the present invention. SE measures the degree of attenuation of an electromagnetic field by an EM absorbing and/or reflecting material. SE is the difference between an electromagnetic signal's intensity before shielding and its intensity after shielding. Attenuation/SE is measured in decibels (dB) that correspond to the ratio between field strength with and without the presence of an absorbing/reflecting material. The decrease in a signal's intensity, or amplitude, is usually exponential with distance, while the decibel range follows a logarithmic scale. Thus, an attenuation rating of 50 dB indicates a shielding strength ten times that of 40 dB. In general, a shielding range from between about 10 to about 30 dB provides a low level of shielding. Shielding between 60 and 90 dB is considered a high level of shielding, while 90 to 120 dB is considered "exceptional."

Determining the level of attenuation for an EMI shield can depend on the particular shielding application, however, the common techniques for testing shielding strength include the open field test, the coaxial transmission line test, the shielded box test, and the shielded room test. The open field test is designed to simulate the normal usage conditions for an electronic device as closely as possible. Antennae are placed at varying distances from the device in an area with no metallic materials other than the testing equipment. This usually occurs in an open site to allow for free space measurements of radiated field strength and conductive emissions. The results are recorded by a noise level meter, which detects the level of EMI produced. The open field test is typically used for finished electronic products.

The coaxial transmission line test is a method that measures plane-wave field electromagnetic wave radiation to determine the shielding effectiveness of a planar material, and it is commonly employed for comparative testing. A reference testing device is positioned in a specialized holding unit and the voltage it receives at multiple frequencies is recorded. The first subject is then replaced by a load device, which undergoes the same series of tests. A comparison between the reference and the load devices establishes the ratio between power received with and without a shielding material.

The shielded box test employs a sealed box with a cut-out portion. A conductively coated shielding unit is placed over the box's opening, and all transmitted and received emissions are measured. The electromagnetic signals from both inside and outside the box are recorded and compared, with the ratio between the signals representing shielding effectiveness.

In some situations, it can be challenging to reduce the amount of ambient noise in an area. In such situations a shielded room test can be employed. This test typically involves at least two shielded rooms with a wall between them, through which sensors can be run. The testing device and testing equipment are placed in one room, and sensor arrays in the other. Shielding leads can be included to reduce the potential for measuring errors caused by external signals. The shield room test is well-suited for evaluating a device's susceptibility.

In some embodiments, the test method for assessing shielding effectiveness can be the standardized method set forth in IEEE-STD-299, using a modified open reference technique. Testing is conducted in a partitioned chamber with one side providing EM transmitting source and the other portion of the partitioned chamber providing receiving equipment.

In some embodiments, the composite includes CNTs present in a range between about 1% by weight to about 7% by weight of the EM radiation shielding composite. In some embodiments, CNT loading can be between about 1% to about 20% by weight of the EMI shielding composite. In some embodiments, CNT loading in the EMI shielding composite can be 1%, 2%, 3%, 4%, 5%, 6%, 7%, 8%, 9%, 10%, 11%, 12%, 13%, 14%, 15%, 16%, 17%, 18%, 19%, and 20% by weight of the EMI shielding composite, including any fraction in between these values. CNT loading in the EMI shielding composite can also be less than 1% including for example between about 0.1% to about 1%. CNT loading of the EMI shielding composite can also be greater than 20% including, for example, 25%, 30%, 40%, and so on up to about 50% and all values in between.

In some embodiments, a EMI shielding composite includes a carbon nanotube (CNT)-infused carbon fiber material. The CNT-infused carbon fiber material can include a carbon fiber material of spoolable dimensions, a barrier coating conformally disposed about the carbon fiber material, and carbon nanotubes (CNTs) infused to the carbon fiber material. The infusion of CNTs to the carbon fiber material can include a bonding motif of direct bonding of individual CNTs to the carbon fiber material or indirect bonding via a transition metal NP, barrier coating, or both.

CNT-infused carbon fiber materials of the invention can include a barrier coating. Barrier coatings can include for example an alkoxysilane, methylsiloxane, an alumoxane, alumina nanoparticles, spin on glass and glass nanoparticles. The CNT-forming catalyst can be added to the uncured barrier coating material and then applied to the carbon fiber material together. In other embodiments the barrier coating material can be added to the carbon fiber material prior to deposition of the CNT-forming catalyst. The barrier coating material can be of a thickness sufficiently thin to allow exposure of the CNT-forming catalyst to the carbon feedstock for subsequent CVD growth. In some embodiments, the thickness is less than or about equal to the effective diameter of the CNT-forming catalyst. In some embodiments, the thickness of the barrier coating is in a range from between about 10 nm to about 100 nm. The barrier coating can also be less than 10 nm, including 1 nm, 2 nm, 3 nm, 4 nm, 5 nm, 6 nm, 7 nm, 8 nm, 9 nm, 10 nm, and any value in between.

Without being bound by theory, the barrier coating can serve as an intermediate layer between the carbon fiber material and the CNTs and can provide mechanical infusion of the CNTs to the carbon fiber material. Such mechanical infusion still provides a robust system in which the carbon fiber material serves as a platform for organizing the CNTs while still imparting properties of the CNTs to the carbon fiber material. Moreover, the benefit of including a barrier coating is the immediate protection it provides the carbon fiber material from chemical damage due to exposure to moisture and/or any thermal damage due to heating of the carbon fiber material at the temperatures used to promote CNT growth.

When growing CNTs on carbon fiber materials, the elevated temperatures and/or any residual oxygen and/or moisture that can be present in the reaction chamber can damage the carbon fiber material. Moreover, the carbon fiber material itself can be damaged by reaction with the CNT-forming catalyst itself. That is the carbon fiber material can behave as a carbon feedstock to the catalyst at the reaction temperatures employed for CNT synthesis. Such excess carbon can disturb the controlled introduction of the carbon feedstock gas and can even serve to poison the catalyst by overloading it with carbon. The barrier coating employed in the invention is designed to facilitate CNT synthesis on carbon fiber materials. Without being bound by theory, the coating can provide a thermal barrier to heat degradation and/or can be a physical barrier preventing exposure of the carbon fiber material to the environment at the elevated temperatures. Alternatively or additionally, it can minimize the surface area contact between the CNT-forming catalyst and the carbon fiber material and/or it can mitigate the exposure of the carbon fiber material to the CNT-forming catalyst at CNT growth temperatures.

There are three types of carbon fiber which are categorized based on the precursors used to generate the fibers, any of which can be used in the invention: Rayon, Polyacrylonitrile (PAN) and Pitch. Carbon fiber from rayon precursors, which are cellulosic materials, has relatively low carbon content at about 20% and the fibers tend to have low strength and stiffness. Polyacrylonitrile (PAN) precursors provide a carbon fiber with a carbon content of about 55%. Carbon fiber based on a PAN precursor generally has a higher tensile strength than carbon fiber based on other carbon fiber precursors due to a minimum of surface defects.

Pitch precursors based on petroleum asphalt, coal tar, and polyvinyl chloride can also be used to produce carbon fiber. Although pitches are relatively low in cost and high in carbon yield, there can be issues of non-uniformity in a given batch.

In some embodiments, the CNT-infused fiber material includes a glass fiber material. CNT-infused glass fiber materials need not incorporate a barrier coating as described above, although one can be optionally employed. The glass-type used in the glass fiber material can be any type, including for example, E-glass, A-glass, E-CR-glass, C-glass, D-glass, R-glass, and S-glass. E-glass includes alumino-borosilicate glass with less than 1% by weight alkali oxides and is mainly used for glass-reinforced plastics. A-glass includes alkali-lime glass with little or no boron oxide. E-CR-glass includes alumino-lime silicate with less than 1% by weight alkali oxides and has high acid resistance. C-glass includes alkali-lime glass with high boron oxide content and is used, for example, for glass staple fibers. D-glass includes borosilicate glass and possesses a high dielectric constant. R-glass includes alumino silicate glass without MgO and CaO and possesses high mechanical strength. S-glass includes alumino silicate glass without CaO but with high MgO content and possesses high tensile strength. One or more of these glass types can be processed into the glass fiber materials described above. In particular embodiments, the glass is E-glass. In other embodiments, the glass is S-glass.

In some embodiments, if the CNT-infused fiber material includes a ceramic fiber material. Like glass, the use of a barrier coating is optional when using ceramic fiber materials.

The ceramic-type used in a ceramic fiber material can be any type, including for example, oxides such as alumina and zirconia, carbides, such as boron carbide, silicon carbide, and tungsten carbide, and nitrides, such as boron nitride and silicon nitride. Other ceramic fiber materials include, for example, borides and silicides. Ceramic fibers can also include basalt fiber materials. Ceramic fiber materials may occur as composites with other fiber types. It is common to find fabric-like ceramic fiber materials that also incorporate glass fiber, for example.

In some embodiments, the CNT-infused fiber material includes a metal fiber material, while in still further embodiments, the CNT-infused fiber material includes an organic fiber material. One skilled in the art will recognize that any fiber material can be employed in EMI shielding applications and that the choice exact fiber material can depend on the end application of the overall structure. For example, one can employ a ceramic fiber material for EMI shielding used in connection with high temperature applications.

The CNT-infused fiber materials can include a fiber material based on a filament, a yarn, a tow, a tape, a fiber-braid, a woven fabric, a non-woven fiber mat, a fiber ply, and other 3D woven structures. Filaments include high aspect ratio fibers having diameters ranging in size from between about 1 micron to about 100 microns. Fiber tows are generally compactly associated bundles of filaments and are usually twisted together to give yarns.

Yarns include closely associated bundles of twisted filaments. Each filament diameter in a yarn is relatively uniform. Yarns have varying weights described by their 'tex,' expressed as weight in grams of 1000 linear meters, or denier, expressed as weight in pounds of 10,000 yards, with a typical tex range usually being between about 200 tex to about 2000 tex, although this value will depend on the exact fiber material being used.

Tows include loosely associated bundles of untwisted filaments. As in yarns, filament diameter in a tow is generally uniform. Tows also have varying weights and the tex range is usually between 200 tex and 2000 tex. They are frequently characterized by the number of thousands of filaments in the tow, for example 12K tow, 24K tow, 48K tow, and the like. Again these values vary depending on the type of fiber material being employed.

Tapes are materials that can be assembled as weaves or can represent non-woven flattened tows. Tapes can vary in width and are generally two-sided structures similar to ribbon. Processes of the present invention are compatible with CNT infusion on one or both sides of a tape. CNT-infused tapes can resemble a "carpet" or "forest" on a flat substrate surface. Again, processes of the invention can be performed in a continuous mode to functionalize spools of tape.

Fiber-braids represent rope-like structures of densely packed carbon fibers. Such structures can be assembled from yarns, for example. Braided structures can include a hollow portion or a braided structure can be assembled about another core material.

In some embodiments a number of primary fiber material structures can be organized into fabric or sheet-like structures. These include, for example, woven fabrics, non-woven fiber mat and fiber ply, in addition to the tapes described above. Such higher ordered structures can be assembled from parent tows, yarns, filaments or the like, with CNTs already infused in the parent fiber. Alternatively such structures can serve as the substrate for the CNT infusion processes described herein.

Figure 2:
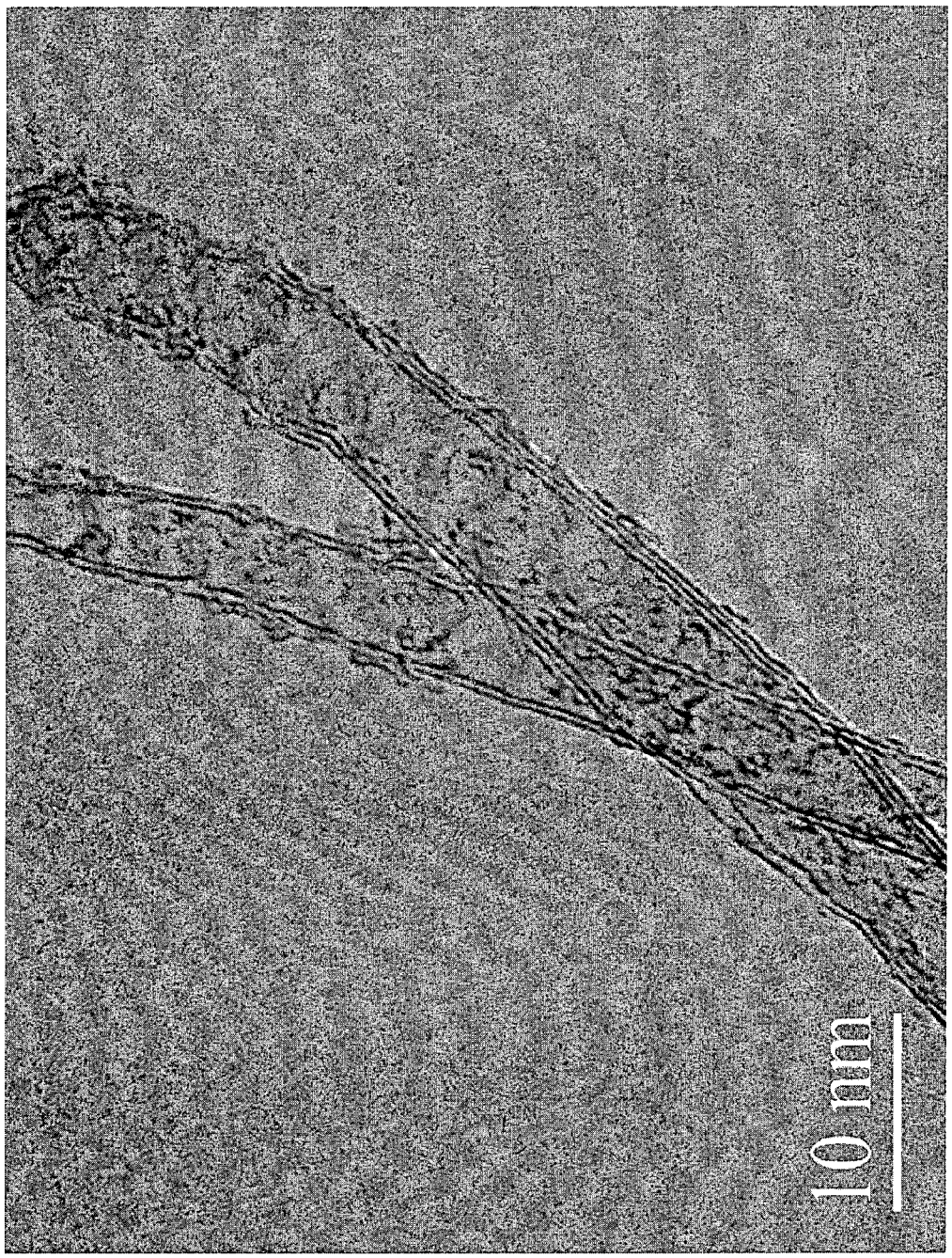
FIG. 2 shows a TEM image of a double-walled CNT (DWNT) grown on AS4 carbon fiber via a continuous CVD process.
Figure 3:
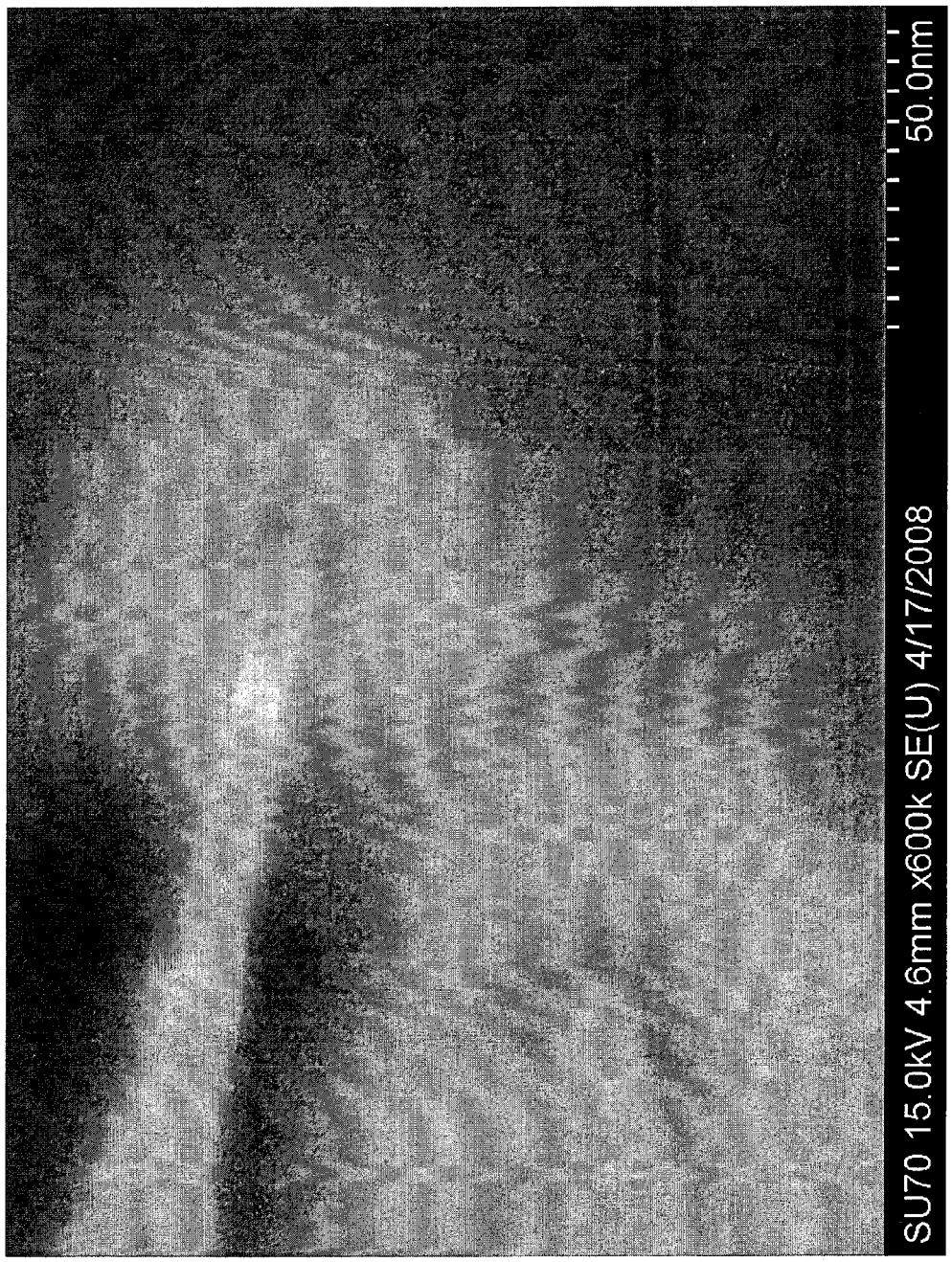
FIG. 3 shows a scanning electron microscope (SEM) image of CNTs growing from within the barrier coating where the CNT-forming nanoparticle catalyst was mechanically infused to the carbon fiber material surface.
Figure 4:
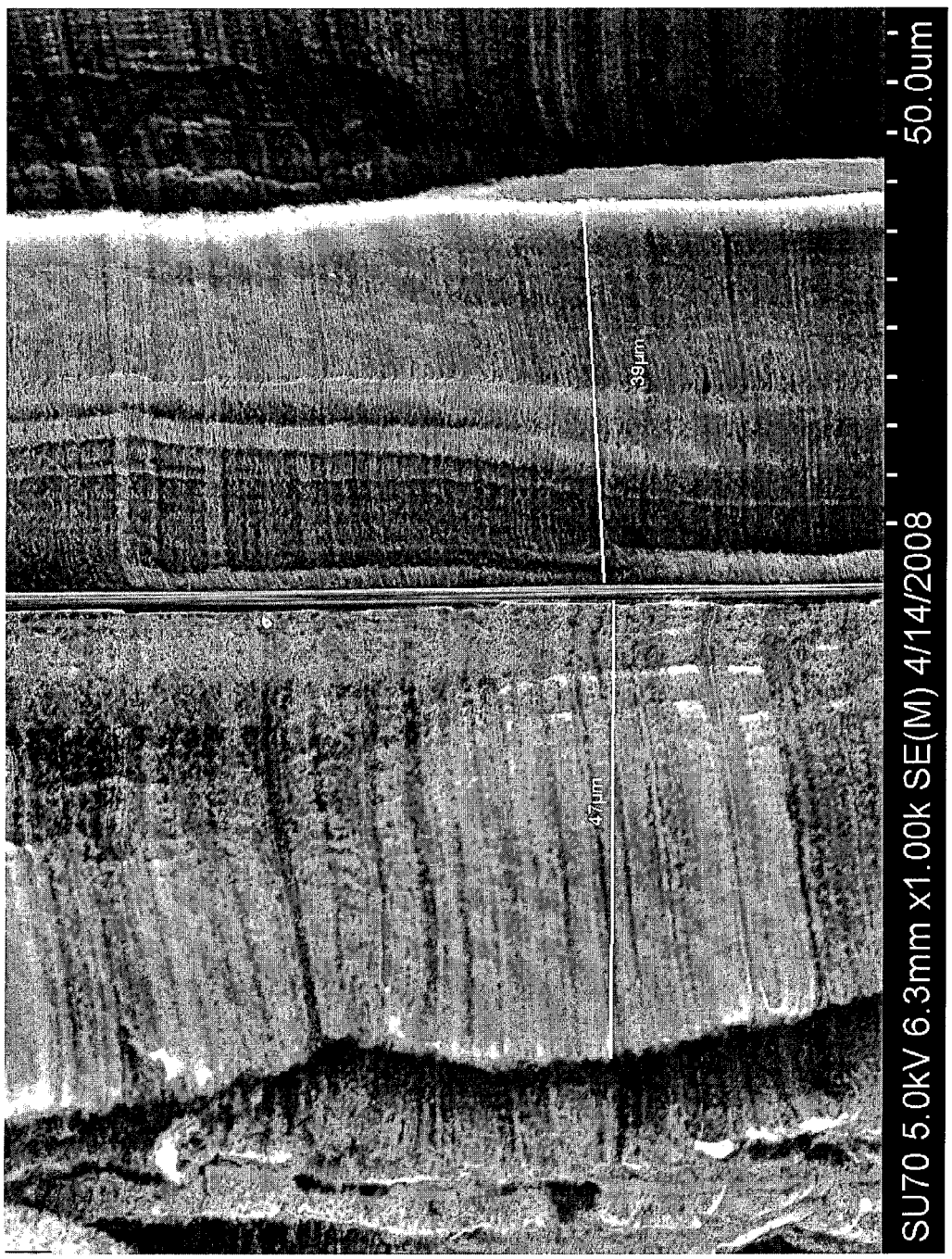
FIG. 4 shows a SEM image demonstrating the consistency in length distribution of CNTs grown on a carbon fiber material to within 20% of a targeted length of about 40 microns.
Figure 5:
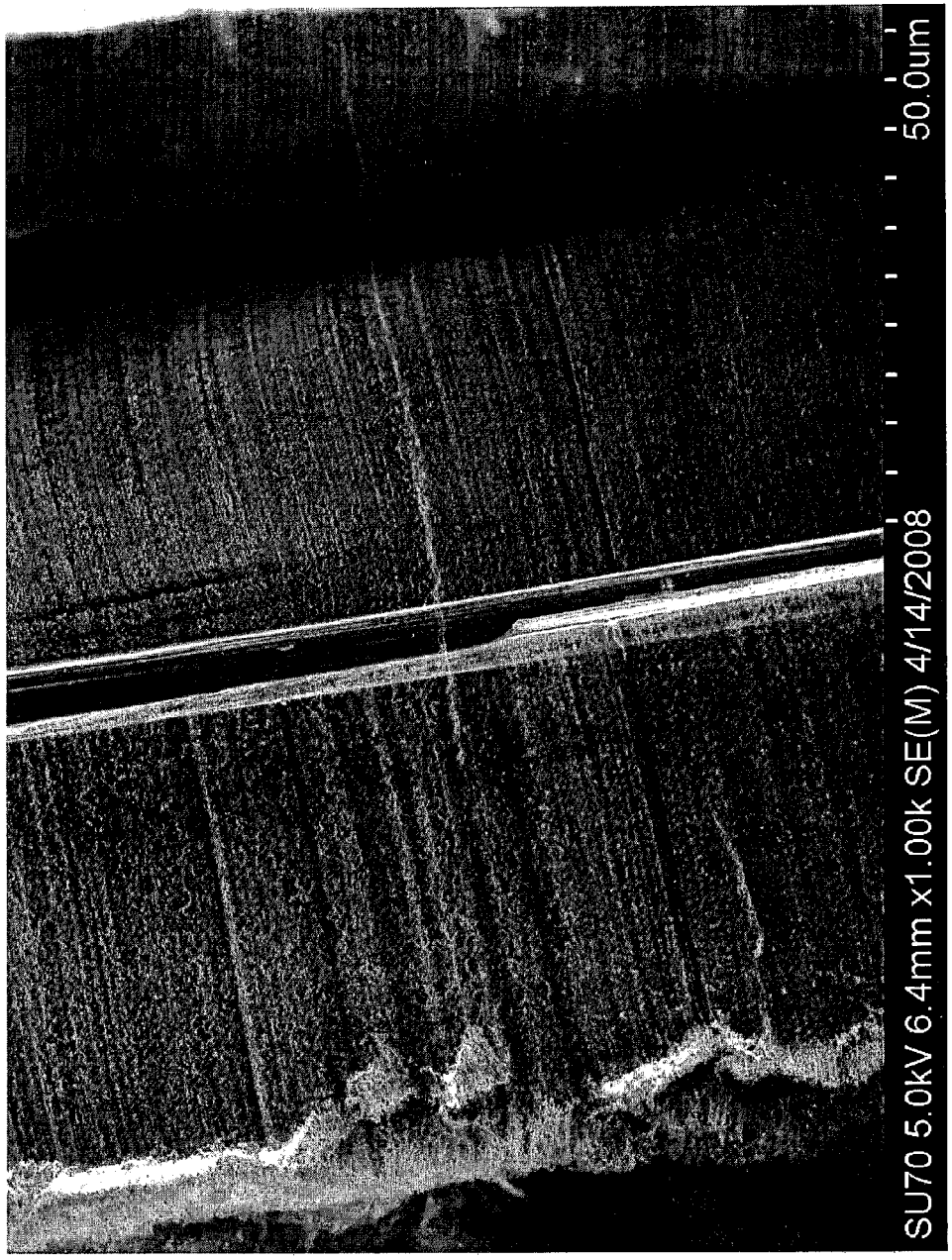
FIG. 5 shows an SEM image demonstrating the effect of a barrier coating on CNT growth. Dense, well aligned CNTs grew where barrier coating was applied and no CNTs grew where barrier coating was absent.
Figure 6:
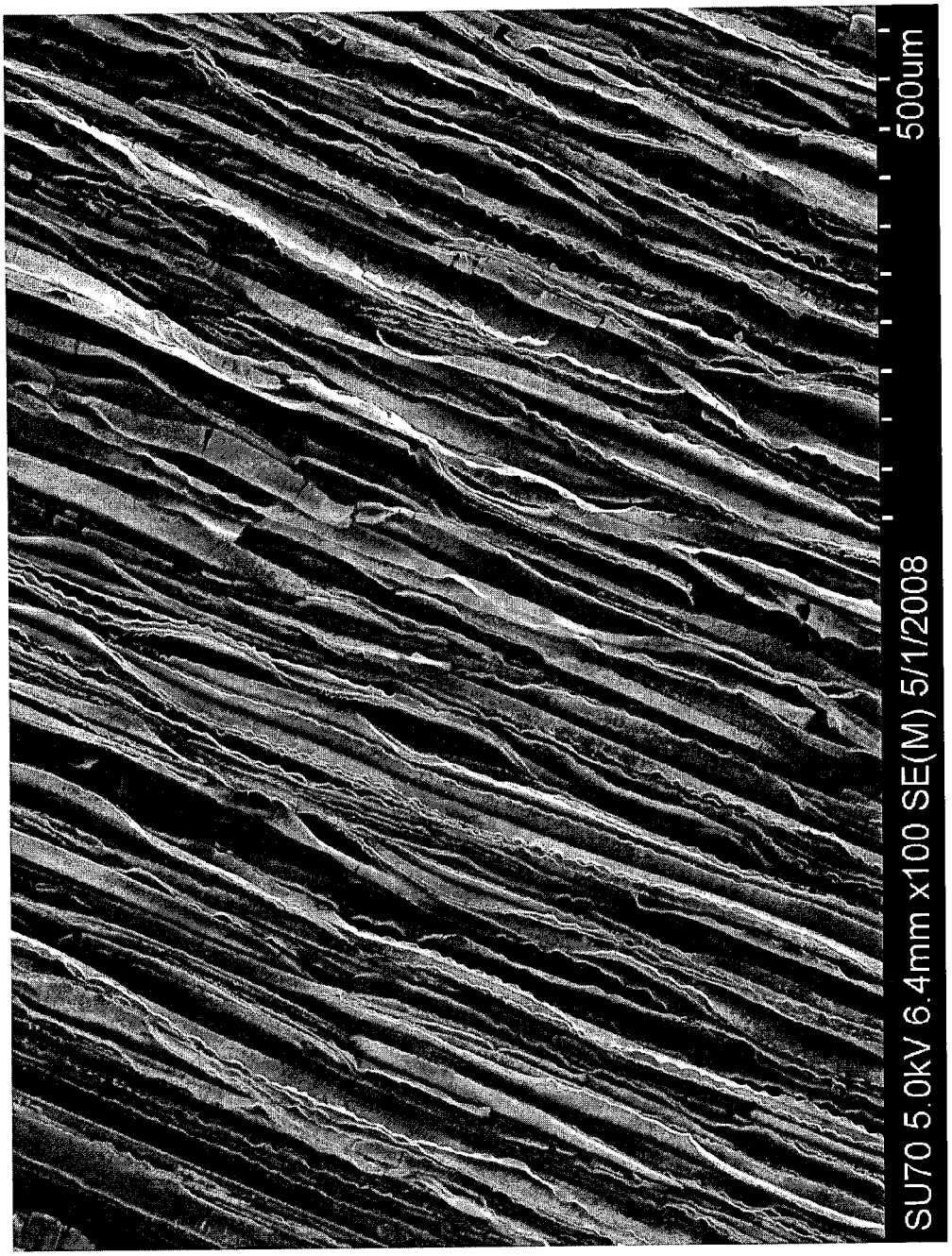
FIG. 6 shows a low magnification SEM of CNTs on carbon fiber demonstrating the uniformity of CNT density across the fibers within about 10%.

FIG. 1-6 shows TEM and SEM images of CNTs prepared on carbon fiber materials prepared by the processes described herein. The procedures for preparing these materials are further detailed below and in Examples I-III. These Figures and procedures exemplify the process for carbon fiber materials, however, one skilled in the art will recognize that other fiber materials can be employed, such as those enumerated above, without significantly departing from these processes. FIGS. 1 and 2 show TEM images of multi-walled and double-walled carbon nanotubes, respectively, that were prepared on an AS4 carbon fiber in a continuous process. FIG. 3 shows a scanning electron microscope (SEM) image of CNTs growing from within the barrier coating after the CNT-forming nanoparticle catalyst was mechanically infused to a carbon fiber material surface. FIG. 4 shows a SEM image demonstrating the consistency in length distribution of CNTs grown on a carbon fiber material to within 20% of a targeted length of about 40 microns. FIG. 5 shows an SEM image demonstrating the effect of a barrier coating on CNT growth. Dense, well aligned CNTs grew where barrier coating was applied and no CNTs grew where barrier coating was absent. FIG. 6 shows a low magnification SEM of CNTs on carbon fiber demonstrating the uniformity of CNT density across the fibers within about 10%.

Figure 7:
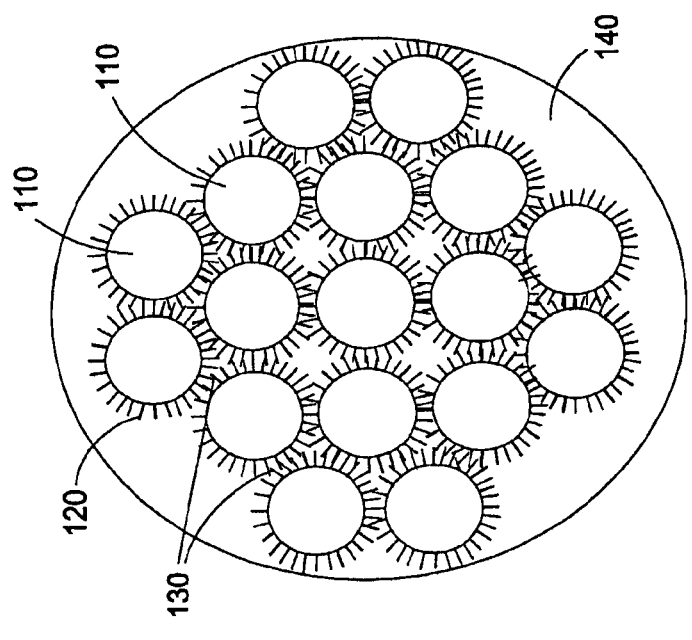
FIG. 7 shows a cross-section of a EMI shielding composite having a carbon nanotube (CNT)-infused fiber material.

Referring now to FIG. 7, there is illustrated schematically a cross-sectional view of a composite 100, according to some embodiments of the invention. Composite 100 is suitable for fabricating EMI shielding structures, for example housing panels for electrical components, having desirable EM radiation shielding characteristics. Composite 100 includes a plurality of fibers or filaments 110, such as in a tow or roving that might be present in a matrix 140. Fibers 110 are infused with carbon nanotubes 120. In an exemplary embodiment, fibers 110 may be glass (e.g., E-glass, S-glass, D-glass) fibers. In another embodiment, fibers 110 may be carbon (graphite) fibers. Other fibers such as polyamide (aromatic polyamide, aramid) (e.g., Kevlar 29 and Kevlar 49), metallic fiber (e.g., steel, aluminum, molybdenum, tantalum, titanium, copper, and tungsten), tungsten monocarbide, ceramic fiber, metallic-ceramic fiber (e.g., aluminum silica), cellulosic fiber, polyester, quartz, and silicon carbide may also be used. CNT synthesis processes described herein with regard to carbon fibers can be used for CNT synthesis on any fiber type. In some embodiments, the metallic fibers can be coated with an appropriate barrier coating before applying the catalyst particles thereto, to prevent undesirable chemical reaction between the catalyst particles and the metallic fibers such as alloying. Thus, when employing metallic fiber materials, the process can parallel that used for carbon fiber materials. Similarly, the thermal sensitive aramid fibers can also employ a barrier coating to protect the fiber material from the typical temperature employed during CNT growth.

In an exemplary embodiment, carbon nanotubes 120 may be grown generally perpendicularly from the outer surface of fiber 110, thereby providing a radial coverage to each individual fiber 110. Carbon nanotubes 120 may be grown in situ on fibers 110. For example, a glass fiber 110 may be fed through a growth chamber maintained at a given temperature of about 500° to 750° C. Carbon containing feed gas can then be introduced into the growth chamber, wherein carbon radicals dissociate and initiate formation of carbon nanotubes on the glass fiber, in presence of the catalyst nanoparticles.

In one configuration, to create composite 100, CNT-infused fiber 110 is delivered to a resin bath. In another configuration, a fabric may be woven from CNTinfused fibers 110 and the fabric subsequently delivered to a resin bath. The resin bath can contain any resin for the production of composite 100 comprising CNT-infused fibers 110 and matrix 140. In one configuration, matrix 140 may take the form of an epoxy resin matrix. In another configuration, matrix 140 may be one of general purpose polyester (such as orthophthalic polyesters), improved polyester (such as isophthalic polyesters), phenolic resin, bismaleimide (BMI) resin, polyurethane, and vinyl ester. Matrix 140 can also take the form of a non-resin matrix (for example, a ceramic matrix) useful for applications requiring performance at higher operational temperatures, such as aerospace and/or military applications. It will be understood that matrix 140 can also take the form of a metal matrix.

Known composite manufacturing methods such as vacuum assisted resin infusion method and resin extrusion method for impregnating CNT-infused fibers 110, or a fabric woven therefrom, with a resin matrix may be applied. For example, CNT-infused fibers 110, or a fabric thereof, may be laid in a mold and resin may be infused therein. In another configuration, CNT-infused fibers 110, or a fabric thereof, may be laid in a mold, which is then evacuated to pull the resin therethrough. In another configuration, CNT-infused fibers 110 may be woven in a "0/90" orientation by winding. This may be accomplished, for example, by winding a first layer or panel of CNT-infused fibers 100 in a first direction, such as the vertical direction, and then winding a second layer or panel of CNT-infused fibers 110 in a second direction, such as the horizontal direction, which is about 90° to the first direction. Such a "0/90" orientation can impart additional structural strength to composite 100.

Fibers 110 infused with carbon nanotubes 120 can be incorporated in a thermoset plastic matrix (e.g., an epoxy resin matrix) 140 to create composite 100. The methods for incorporating fibers in a matrix are well known in the art. In one configuration, CNT-infused fibers 110 can be incorporated in matrix 140 using a high pressure curing method. CNT loading of a composite signifies the weight percentage of carbon nanotubes in a given composite. Processes known in the art for producing CNT-based composites involve direct mixing of loose (i.e. not bound to spoolable length fibers) carbon nanotubes into the resin/matrix of the nascent composite. The composites resulting from such processes are can be limited to a maximum of about five (5) weight percent of carbon nanotubes in the finished composite due to factors such as prohibitive viscosity increases. Composite 100, on the other hand, may have a CNT loading in excess of 25 weight %, as described herein above. Using CNT-infused fibers 110, composites having CNT loading as high as 60 weight percent have been demonstrated. The EM shielding characteristic of a material depends on its electrical conductivity. Overall electrical conductivity of composite 100 is, in part, a function of the CNT loading of composite 100. Thus, shielding effectiveness of composite 100 is, in part, a function of the CNT loading of composite 100.

The above-described composite 100 with CNT-infused fibers incorporated therein is suitable for fabricating components with electromagnetic radiation, including radar shielding characteristics, for numerous EMI shielding applications. It has been demonstrated that composite 100 effectively absorbs and/or reflects electromagnetic radiation in the radar spectrum, including infrared (about 700 nm to about 15 centimeters), visible (about 400 nm to about 700 nm) and ultraviolet (about 10 nm to about 400 nm) radiation.

Composite structures which are desirable, for example, for their weight and strength characteristics, are sometimes not suitable for fabricating electronic device components because of their relatively poor EMI shielding. For example, some fiber composites generally transmit EM radiation and therefore have relatively poor EMI shielding characteristics. Glass fiber composites, for example, are generally transparent across a wide spectrum of EM radiation. They are also dielectric in nature and have poor electrical and thermal conductivities. Incorporation of CNTs in glass fiber composites effectively enhances EM radiation absorptivity of the resulting composites. Carbon fiber composites can benefit from improved EMI shielding by providing good EM radiation reflectance in certain frequency ranges. The incorporation of CNTs on the carbon fiber material can enhance the EMI shielding in carbon fiber composites by additionally providing absorbance or improved reflectance of at least a portion of the EM radiation. In the case of absorbance, the energy can be subsequently transferred to an electrical ground, for example. Composite 100 with CNT-infused fibers 110, thus, enhances EMI shielding characteristics, while retaining the desirable characteristics such as low weight to strength ratio associated with composites. The effectiveness of a composite in EM radiation shielding can be adjusted by tailoring the weight percentage of carbon nanotubes in the composite, as exemplified in FIG. 16 through 18.

Figure 8:
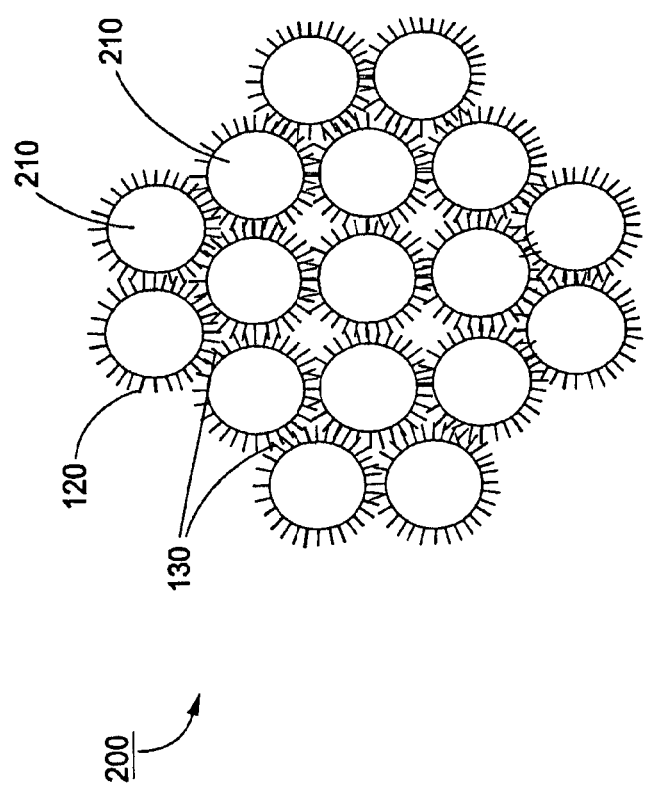
FIG. 8 shows a carbon nanotube-infused fiber tow adapted to be used as a EMI shielding material in a coating on an article such as an EMI shielding panel.

Referring now to FIG. 8, a cross-sectional view of a CNT-infused fiber material 200 is schematically illustrated. Fiber material 200 can optionally include a matrix. Regardless of the existence of a matrix material, CNT-infused fiber material 200 can be applied to a surface of a previously fabricated composite to significantly enhance EM shielding characteristics of the composite. In some embodiments, the pre-fabricated composite, on its own, can exhibit poor EMI sheilding. However, the CNT-infused fiber material disposed on its surface can impart a sufficient degree of EM shielding capacity to provide good EMI shielding. CNT-infused fiber material 200 can be wound or woven about the pre-fabricated composite. In some embodiments, where a matrix material was not previously present with CNT-infused fiber material 200 prior to disposing it on the composite, one can be added after it is disposed thereon. Moreover, the matrix material added thusly, can be of the same matrix as the pre-fabricated material, or of similar characteristics to promote strong bonding.

CNT-infused fiber material 200 includes a plurality of fibers in a fiber material 210, such as a tow or roving. Carbon nanotubes 120 are infused to fiber material 210. Van der Waals forces between closely-situated groups of carbon nanotubes 120 can provide a significant increase in the interaction between CNTs 120. In some embodiments, this can result in CNT "interdigitation" of carbon nanotubes 120, which can provide a filament-to-filament bond or adhesion. In an exemplary embodiment, the interdigitation of carbon nanotubes 120 may be further induced by applying pressure to fiber material 210 in order to consolidate CNT-infused fiber material 200. This filament-to-filament bond can enhance the formation of fiber tows, tapes, and weaves in the absence of a resin matrix. This filament-to-filament bond can also increase shear and tensile strengths, relative to a filament-resin bond as might be employed in conventional fiber tow composites. Composite fiber materials formed from such CNT-infused fiber tows exhibit good EMI shielding characteristics along with increased interlaminar shear strength, tensile strength, and out-of-axis strength.

In some embodiments, the CNTs need not be fully interdigitated specifically to improve EM shielding characteristics. For example, percolation pathways can be created by simple point contact between CNTs. In such embodiments, the "looser" CNT affiliation can provide fewer or sparser electrical pathways, or closed loop pathways which lack specific termination points. This can provide discrete electrical pathways that favor EM absorption characteristics because they provide varying levels of permittivity in the material which is used to trap EM radiation within the overall structure.

In one configuration, CNT-infused fiber materials 200 can be applied as a coating on a surface of a conventional composite, such as a glass fiber composite panel or a carbon fiber composite panel, to impart good EMI shielding characteristics to such conventional composite. In one configuration, CNT-infused fiber materials 200 may be wound around a composite structure to enhance EMI shielding characteristics of the composite structure. A coating of a matrix, such as a resin matrix, can be applied over one or more layers of CNT-infused fiber materials 200, or a fabric woven therefrom, applied to a surface of the composite to protect CNT-infused composite fibers 200 from external environment. Multiple layered CNT-infused fiber materials can be disposed to provide multiple CNT orientations, lengths, and densities to vary the EM radiation absorption characteristics to absorb EM radiation in different frequency bands and to absorb EM radiation from sources that impinge the overall structure from different angles.

Figure 9:
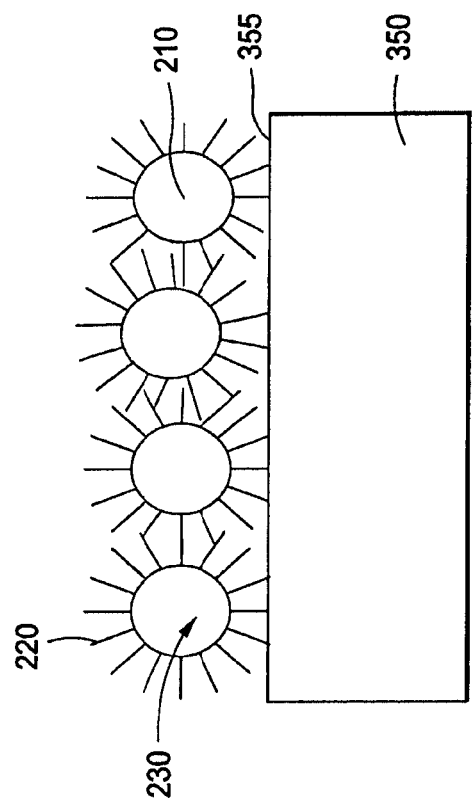
FIG. 9 shows a carbon nanotube-infused fiber tow coating applied on a composite to improve the EM shielding characteristics of the composite.

Referring now to FIG. 9, there is illustrated schematically a coating layer of fiber material 210 with infused CNTs disposed on a top surface 355 of a composite 350. Composite 350 may take the form of a conventional composite glass or glass-reinforced plastic, for example. In another configuration, composite 350 may take the form of a carbon fiber composite structure or a carbon fiber reinforced plastic structure. Composite 350, on its own, is generally not suitable for use in applications requiring good radar absorbing or EMI shielding characteristics. However, by applying a coating or layer 230 of fiber material 210 having CNTs infused thereon, onto surface 355 of composite 350, the combination (i.e., the combination of composite 350 and CNT-infused fibers) exhibits significantly enhanced radar absorbing or EMI shielding characteristics. In an exemplary embodiment, fibers 210 may be a fiber tow infused with carbon nanotubes 220 with a matrix, such as, a resin matrix. In yet another exemplary embodiment, fibers 210 may be woven to form a fabric, which may be applied to top surface 355 of composite 350.

In some embodiments, CNT-infused fiber materials 200 may be woven to form a fabric. In one configuration, a coating of fibers can have a thickness ranging from about 20 nanometers (nm) for a single layer of CNT-infused fibers to about 12.5 mm for multiple layers of CNT-infused fibers. While the illustrated embodiment depicts a single layer of fibers for the sake of simplicity, it will be understood that multiple layers of fibers can be used to form a coating on composite 350.

An advantage of using CNT-infused fiber material 200 is that such a coating can be used in conjunction with conventional composites having poor EMI shielding characteristics while retaining advantages of the composite such as weight to strength ratios and other desirable mechanical and structural characteristics.

A layer or coating of CNT-infused fiber material 200 can be disposed on a surface of a composite structure to enhance EMI shielding characteristics of the composite structure. Such a use of a layer or coating of CNT-infused fiber material 200 applied to a conventional composite facilitates using conventional composites for fabrication, without need for complex processing.

Figure 10:
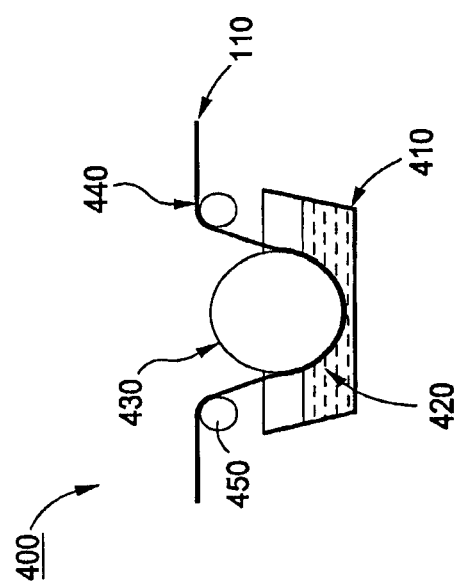
FIG. 10 shows a schematic diagram of a coating system for carbon nanotube-infused fibers.

Referring now to FIG. 10, there is illustrated a coating system 400, according to an exemplary embodiment. System 400 receives CNT-infused fiber 110 from an upstream fiber source. In an exemplary embodiment, CNT-infused fibers can be directed to coating system 400 directly from the growth chamber where carbon nanotubes 120 are infused onto the fiber material. CNT-infused fiber 110 is immersed in a chemical solution 420 contained in a bath 410 to further treat CNT-infused fiber 110. CNT-infused fiber 110 is guided by two guide rollers 440, 450. A bath roller 430 immerses CNT-infused fiber 110 into solution 420. In an exemplary embodiment, solution 420 is an iron-based nanoparticle solution. In one configuration, solution 420 includes 1 part volume iron based solute in 200 parts hexane solvent. Carbon nanotubes 120 on CNT-infused fiber 110 will absorb iron nanoparticles, thereby further enhancing radar absorbing or EMI shielding characteristics of CNT-infused fiber 110 and any composite fabricated therefrom. It will be understood that broad band fabrics fabricated from CNT-infused fibers 110 may similarly be treated to incorporate iron based nanoparticles.

In some embodiments, the EM radiation shielding composite can have CNTs infused on the fiber material in a controlled manner. For example, the CNTs may be grown in a dense radial display about individual fiber elements of the fiber material. In other embodiments, the CNTs can be processed further post growth to align directly along the fiber axis. This can be achieved through mechanical or chemical techniques, or by application of an electric field, for example.

Because the CNTs can have a defined orientation with respect to the fiber axis, the CNTs, in turn can have a controlled orientation within any overall composite structure made therefrom. This can be achieved in any of the winding and/or fabric processes described above, or by controlling orientation of the CNT-infused fiber material in the a resin matrix for curing or the like.

Thus, in some embodiments, the present invention provides a method of manufacturing these EMI shielding composites that includes 1) disposing a CNT-infused fiber material in a portion of a matrix material with a controlled orientation of the CNT-infused fiber material within the matrix material, and 2) curing the matrix material, wherein the controlled orientation of the CNT-infused fiber material controls the relative orientation of CNTs infused thereon. Composite manufacturing processes include, but are not limited to, wet and dry filament winding, fiber placement, hand layup, as well as resin infusion. These processes can be used to create panels, parts, components and/or structures for enhanced EMI SE.

In some embodiments, the present invention provides a panel that includes the EMI shielding composites of the invention. The panel can be made adaptable to interface with an electronic device for use in EMI shielding, in some embodiments. A panel having the CNT infused fiber material has CNTs with a controlled orientation within the composite. The panel can be equipped with a mechanism to adjust its angle with respect to an impinging angle of incidence of a continuous EM radiation transmitting source to maximize EMI shielding. For example, any EM radiation energy absorbed can be converted to an electrical signal which is integrated with a computer system to alter the orientation of the panel to maximize EMI shielding. In some embodiments, the EM shielding material can also be used to absorb EM radiation in detector applications, where a reflected EM radiation signal requires efficient capture.

As described briefly above, the present invention uses on a continuous CNT infusion process to generate CNT-infused fiber materials. The process includes (a) disposing a carbon nanotube-forming catalyst on a surface of a fiber material of spoolable dimensions; and (b) synthesizing carbon nanotubes directly on the carbon fiber material, thereby forming a carbon nanotube-infused fiber material. Additional steps can be employed depending on the type of fiber material ebing used.

For example, when using carbon fiber materials, a step that incorporates a barrier coating can be added to the process.

For a 9 foot long system, the linespeed of the process can range from between about 1.5 ft/min to about 108 ft/min. The linespeeds achieved by the process described herein allow the formation of commercially relevant quantities of CNT-infused fiber materials with short production times. For example, at 36 ft/min linespeed, the quantities of CNT-infused fibers (over 5% infused CNTs on fiber by weight) can exceed over 100 pound or more of material produced per day in a system that is designed to simultaneously process 5 separate tows (20 lb/tow). Systems can be made to produce more tows at once or at faster speeds by repeating growth zones. Moreover, some steps in the fabrication of CNTs, as known in the art, have prohibitively slow rates preventing a continuous mode of operation. For example, in a typical process known in the art, a CNT-forming catalyst reduction step can take 1-12 hours to perform. CNT growth itself can also be time consuming, for example requiring tens of minutes for CNT growth, precluding the rapid linespeeds realized in the present invention. The process described herein overcomes such rate limiting steps.

The CNT-infused carbon fiber material-forming processes of the invention can avoid CNT entanglement that occurs when trying to apply suspensions of pre-formed carbon nanotubes to fiber materials. That is, because pre-formed CNTs are not fused to the carbon fiber material, the CNTs tend to bundle and entangle. The result is a poorly uniform distribution of CNTs that weakly adhere to the carbon fiber material. However, processes of the present invention can provide, if desired, a highly uniform entangled CNT mat on the surface of the carbon fiber material by reducing the growth density. The CNTs grown at low density are infused in the carbon fiber material first. In such embodiments, the fibers do not grow dense enough to induce vertical alignment, the result is entangled mats on the carbon fiber material surfaces. By contrast, manual application of pre-formed CNTs does not insure uniform distribution and density of a CNT mat on the carbon fiber material.

Figure 11:
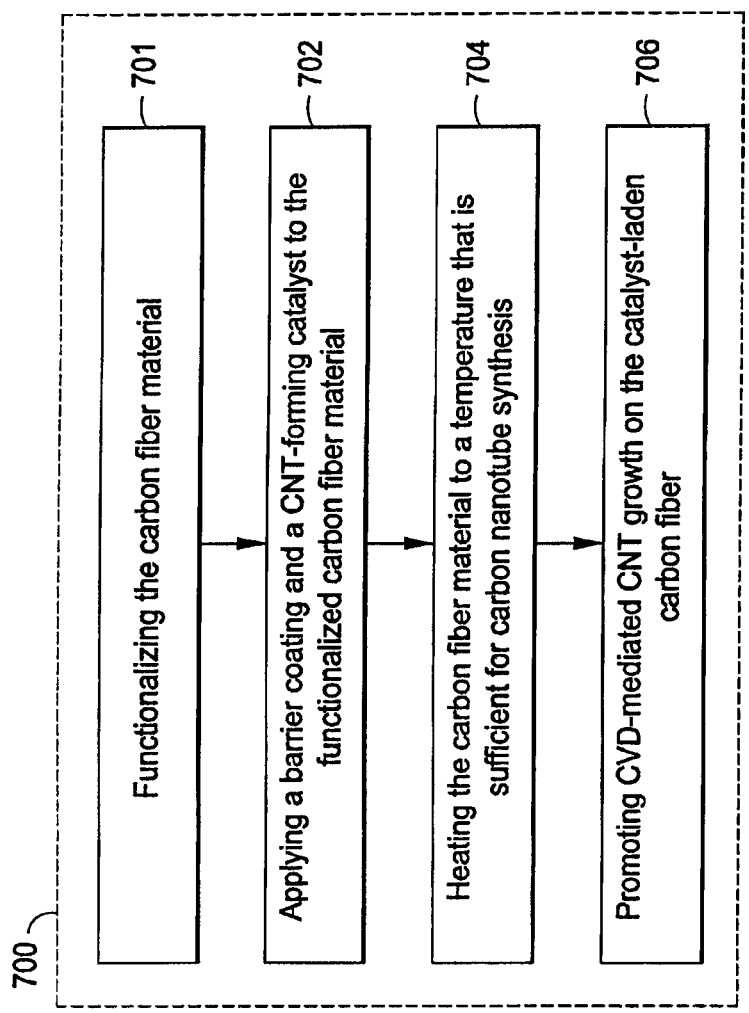
FIG. 11 shows a process for producing CNT-infused carbon fiber material in accordance with the illustrative embodiment of the present invention.

FIG. 11 depicts a flow diagram of process 700 for producing CNT-infused carbon fiber material in accordance with an illustrative embodiment of the present invention. One skilled in the art will recognize that slight variations in this process exemplifying CNT infusion on a carbon fiber material can be altered to provide other CNT-infused fiber materials such as glass or ceramic fibers, for example. Some such alterations in the conditions can include, for example, removing the step of applying a barrier coating, which is optional for glass and ceramics.

Process 700 includes at least the operations of:

701: Functionalizing the carbon fiber material.

702: Applying a barrier coating and a CNT-forming catalyst to the functionalized carbon fiber material.

704: Heating the carbon fiber material to a temperature that is sufficient for carbon nanotube synthesis.

706: Promoting CVD-mediated CNT growth on the catalyst-laden carbon fiber.

In step 701, the carbon fiber material is functionalized to promote surface wetting of the fibers and to improve adhesion of the barrier coating.

To infuse carbon nanotubes into a carbon fiber material, for example, the carbon nanotubes are synthesized on the carbon fiber material which is conformally coated with a barrier coating. In one embodiment, this is accomplished by first conformally coating the carbon fiber material with a barrier coating and then disposing nanotube-forming catalyst on the barrier coating, as per operation 702. In some embodiments, the barrier coating can be partially cured prior to catalyst deposition. This can provide a surface that is receptive to receiving the catalyst and allowing it to embed in the barrier coating, including allowing surface contact between the CNT forming catalyst and the carbon fiber material. In such embodiments, the barrier coating can be fully cured after embedding the catalyst. In some embodiments, the barrier coating is conformally coated over the carbon fiber material simultaneously with deposition of the CNT-form catalyst. Once the CNT-forming catalyst and barrier coating are in place, the barrier coating can be fully cured.

In some embodiments, the barrier coating can be fully cured prior to catalyst deposition. In such embodiments, a fully cured barrier-coated carbon fiber material can be treated with a plasma to prepare the surface to accept the catalyst. For example, a plasma treated carbon fiber material having a cured barrier coating can provide a roughened surface in which the CNT-forming catalyst can be deposited. The plasma process for "roughing" the surface of the barrier thus facilitates catalyst deposition. The roughness is typically on the scale of nanometers. In the plasma treatment process craters or depressions are formed that are nanometers deep and nanometers in diameter. Such surface modification can be achieved using a plasma of any one or more of a variety of different gases, including, without limitation, argon, helium, oxygen, nitrogen, and hydrogen. In some embodiments, plasma roughing can also be performed directly in the carbon fiber material itself. This can facilitate adhesion of the barrier coating to the carbon fiber material.

As described further below and in conjunction with FIG. 11, the catalyst is prepared as a liquid solution that contains CNT-forming catalyst that comprise transition metal nanoparticles. The diameters of the synthesized nanotubes are related to the size of the metal particles as described above. In some embodiments, commercial dispersions of CNT-forming transition metal nanoparticle catalyst are available and are used without dilution, in other embodiments commercial dispersions of catalyst can be diluted. Whether to dilute such solutions can depend on the desired density and length of CNT to be grown as described above.

With reference to the illustrative embodiment of FIG. 11, carbon nanotube synthesis is shown based on a chemical vapor deposition (CVD) process and occurs at elevated temperatures. The specific temperature is a function of catalyst choice, but will typically be in a range of about 500 to 1000° C. Accordingly, operation 704 involves heating the barrier-coated carbon fiber material to a temperature in the aforementioned range to support carbon nanotube synthesis.

In operation 706, CVD-promoted nanotube growth on the catalyst-laden carbon fiber material is then performed. The CVD process can be promoted by, for example, a carbon-containing feedstock gas such as acetylene, ethylene, and/or ethanol. The CNT synthesis processes generally use an inert gas (nitrogen, argon, helium) as a primary carrier gas. The carbon feedstock is provided in a range from between about 0% to about 15% of the total mixture. A substantially inert environment for CVD growth is prepared by removal of moisture and oxygen from the growth chamber.

In the CNT synthesis process, CNTs grow at the sites of a CNT-forming transition metal nanoparticle catalyst. The presence of the strong plasma-creating electric field can be optionally employed to affect nanotube growth. That is, the growth tends to follow the direction of the electric field. By properly adjusting the geometry of the plasma spray and electric field, vertically-aligned CNTs (i.e., perpendicular to the carbon fiber material) can be synthesized. Under certain conditions, even in the absence of a plasma, closely-spaced nanotubes will maintain a vertical growth direction resulting in a dense array of CNTs resembling a carpet or forest. The presence of the barrier coating can also influence the directionality of CNT growth.

The operation of disposing a catalyst on a carbon fiber material can be accomplished by spraying or dip coating a solution or by gas phase deposition via, for example, a plasma process. The choice of techniques can be coordinated with the mode with which the barrier coating is applied. Thus, in some embodiments, after forming a solution of a catalyst in a solvent, catalyst can be applied by spraying or dip coating the barrier coated carbon fiber material with the solution, or combinations of spraying and dip coating. Either technique, used alone or in combination, can be employed once, twice, thrice, four times, up to any number of times to provide a carbon fiber material that is sufficiently uniformly coated with CNT-forming catalyst. When dip coating is employed, for example, a carbon fiber material can be placed in a first dip bath for a first residence time in the first dip bath. When employing a second dip bath, the carbon fiber material can be placed in the second dip bath for a second residence time. For example, carbon fiber materials can be subjected to a solution of CNT-forming catalyst for between about 3 seconds to about 90 seconds depending on the dip configuration and linespeed. Employing spraying or dip coating processes, a carbon fiber material with a surface density of catalyst of less than about 5% surface coverage to as high as about 80% coverage, in which the CNT-forming catalyst nanoparticles are nearly monolayer. In some embodiments, the process of coating the CNT-forming catalyst on the carbon fiber material should produce no more than a monolayer. For example, CNT growth on a stack of CNT-forming catalyst can erode the degree of infusion of the CNT to the carbon fiber material. In other embodiments, the transition metal catalyst can be deposited on the carbon fiber material using evaporation techniques, electrolytic deposition techniques, and other processes known to those skilled in the art, such as addition of the transition metal catalyst to a plasma feedstock gas as a metal organic, metal salt or other composition promoting gas phase transport.

Because processes of the invention are designed to be continuous, a spoolable carbon fiber material can be dip-coated in a series of baths where dip coating baths are spatially separated. In a continuous process in which nascent carbon fibers are being generated de novo, dip bath or spraying of CNT-forming catalyst can be the first step after applying and curing or partially curing a barrier coating to the carbon fiber material. Application of the barrier coating and a CNT-forming catalyst can be performed in lieu of application of a sizing, for newly formed carbon fiber materials. In other embodiments, the CNT-forming catalyst can be applied to newly formed carbon fibers in the presence of other sizing agents after barrier coating. Such simultaneous application of CNT-forming catalyst and other sizing agents can still provide the CNT-forming catalyst in surface contact with the barrier coating of the carbon fiber material to insure CNT infusion.

The catalyst solution employed can be a transition metal nanoparticle which can be any d-block transition metal as described above. In addition, the nanoparticles can include alloys and non-alloy mixtures of d-block metals in elemental form or in salt form, and mixtures thereof. Such salt forms include, without limitation, oxides, carbides, and nitrides. Non-limiting exemplary transition metal NPs include Ni, Fe, Co, Mo, Cu, Pt, Au, and Ag and salts thereof and mixtures thereof. In some embodiments, such CNT-forming catalysts are disposed on the carbon fiber by applying or infusing a CNT-forming catalyst directly to the carbon fiber material simultaneously with barrier coating deposition. Many of these transition metal catalysts are readily commercially available from a variety of suppliers, including, for example, Ferrotec Corporation (Bedford, N.H.).

Catalyst solutions used for applying the CNT-forming catalyst to the carbon fiber material can be in any common solvent that allows the CNT-forming catalyst to be uniformly dispersed throughout. Such solvents can include, without limitation, water, acetone, hexane, isopropyl alcohol, toluene, ethanol, methanol, tetrahydrofuran (THF), cyclohexane or any other solvent with controlled polarity to create an appropriate dispersion of the CNT-forming catalyst nanoparticles. Concentrations of CNT-forming catalyst can be in a range from about 1:1 to 1:10000 catalyst to solvent. Such concentrations can be used when the barrier coating and CNT-forming catalyst is applied simultaneously as well.

In some embodiments heating of the carbon fiber material can be at a temperature that is between about 500° C. and 1000° C. to synthesize carbon nanotubes after deposition of the CNT-forming catalyst. Heating at these temperatures can be performed prior to or substantially simultaneously with introduction of a carbon feedstock for CNT growth.

In some embodiments, the present invention provides a process that includes removing sizing agents from a carbon fiber material, applying a barrier coating conformally over the carbon fiber material, applying a CNT-forming catalyst to the carbon fiber material, heating the carbon fiber material to at least 500° C., and synthesizing carbon nanotubes on the carbon fiber material. In some embodiments, operations of the CNT-infusion process include removing sizing from a carbon fiber material, applying a barrier coating to the carbon fiber material, applying a CNT-forming catalyst to the carbon fiber, heating the fiber to CNT-synthesis temperature and CVD-promoted CNT growth the catalyst-laden carbon fiber material. Thus, where commercial carbon fiber materials are employed, processes for constructing CNT-infused carbon fibers can include a discrete step of removing sizing from the carbon fiber material before disposing barrier coating and the catalyst on the carbon fiber material.

The step of synthesizing carbon nanotubes can include numerous techniques for forming carbon nanotubes, including those disclosed in co-pending U.S. Patent Application No. US 2004/0245088 which is incorporated herein by reference. The CNTs grown on fibers of the present invention can be accomplished by techniques known in the art including, without limitation, micro-cavity, thermal or plasma-enhanced CVD techniques, laser ablation, arc discharge, and high pressure carbon monoxide (HiPCO). During CVD, in particular, a barrier coated carbon fiber material with CNT-forming catalyst disposed thereon, can be used directly. In some embodiments, any conventional sizing agents can be removed prior CNT synthesis. In some embodiments, acetylene gas is ionized to create a jet of cold carbon plasma for CNT synthesis. The plasma is directed toward the catalyst-bearing carbon fiber material. Thus, in some embodiments synthesizing CNTs on a carbon fiber material includes (a) forming a carbon plasma; and (b) directing the carbon plasma onto the catalyst disposed on the carbon fiber material. The diameters of the CNTs that are grown are dictated by the size of the CNT-forming catalyst as described above. In some embodiments, the sized fiber substrate is heated to between about 550 to about 800° C. to facilitate CNT synthesis. To initiate the growth of CNTs, two gases are bled into the reactor: a process gas such as argon, helium, or nitrogen, and a carbon-containing gas, such as acetylene, ethylene, ethanol or methane. CNTs grow at the sites of the CNT-forming catalyst.

In some embodiments, the CVD growth is plasma-enhanced. A plasma can be generated by providing an electric field during the growth process. CNTs grown under these conditions can follow the direction of the electric field. Thus, by adjusting the geometry of the reactor vertically aligned carbon nanotubes can be grown radially about a cylindrical fiber. In some embodiments, a plasma is not required for radial growth about the fiber. For carbon fiber materials that have distinct sides such as tapes, mats, fabrics, plies, and the like, catalyst can be disposed on one or both sides and correspondingly, CNTs can be grown on one or both sides as well.

As described above, CNT-synthesis is performed at a rate sufficient to provide a continuous process for functionalizing spoolable carbon fiber materials. Numerous apparatus configurations faciliate such continuous synthesis as exemplified below.

In some embodiments, CNT-infused carbon fiber materials can be constructed in an "all plasma" process. An all plasma process can being with roughing the carbon fiber material with a plasma as described above to improve fiber surface wetting characteristics and provide a more conformal barrier coating, as well as improve coating adhesion via mechanical interlocking and chemical adhesion through the use of functionalization of the carbon fiber material by using specific reactive gas species, such as oxygen, nitrogen, hydrogen in argon or helium based plasmas.

Barrier coated carbon fiber materials pass through numerous further plasma-mediated steps to form the final CNT-infused product. In some embodiments, the all plasma process can include a second surface modification after the barrier coating is cured. This is a plasma process for "roughing" the surface of the barrier coating on the carbon fiber material to facilitate catalyst deposition. As described above, surface modification can be achieved using a plasma of any one or more of a variety of different gases, including, without limitation, argon, helium, oxygen, ammonia, hydrogen, and nitrogen.

After surface modification, the barrier coated carbon fiber material proceeds to catalyst application. This is a plasma process for depositing the CNT-forming catalyst on the fibers. The CNT-forming catalyst is typically a transition metal as described above. The transition metal catalyst can be added to a plasma feedstock gas as a precursor in the form of a ferrofluid, a metal organic, metal salt or other composition for promoting gas phase transport. The catalyst can be applied at room temperature in the ambient environment with neither vacuum nor an inert atmosphere being required. In some embodiments, the carbon fiber material is cooled prior to catalyst application.

Continuing the all-plasma process, carbon nanotube synthesis occurs in a CNT-growth reactor. This can be achieved through the use of plasma-enhanced chemical vapor deposition, wherein carbon plasma is sprayed onto the catalyst-laden fibers. Since carbon nanotube growth occurs at elevated temperatures (typically in a range of about 500 to 1000° C. depending on the catalyst), the catalyst-laden fibers can be heated prior to exposing to the carbon plasma. For the infusion process, the carbon fiber material can be optionally heated until it softens. After heating, the carbon fiber material is ready to receive the carbon plasma. The carbon plasma is generated, for example, by passing a carbon containing gas such as acetylene, ethylene, ethanol, and the like, through an electric field that is capable of ionizing the gas. This cold carbon plasma is directed, via spray nozzles, to the carbon fiber material. The carbon fiber material can be in close proximity to the spray nozzles, such as within about 1 centimeter of the spray nozzles, to receive the plasma. In some embodiments, heaters are disposed above the carbon fiber material at the plasma sprayers to maintain the elevated temperature of the carbon fiber material.

Another configuration for continuous carbon nanotube synthesis involves a special rectangular reactor for the synthesis and growth of carbon nanotubes directly on carbon fiber materials. The reactor can be designed for use in a continuous in-line process for producing carbon-nanotube bearing fibers. In some embodiments, CNTs are grown via a chemical vapor deposition ("CVD") process at atmospheric pressure and at elevated temperature in the range of about 550° C. to about 800° C. in a multi-zone reactor. The fact that the synthesis occurs at atmospheric pressure is one factor that facilitates the incorporation of the reactor into a continuous processing line for CNT-on-fiber synthesis. Another advantage consistent with in-line continuous processing using such a zone reactor is that CNT growth occurs in a seconds, as opposed to minutes (or longer) as in other procedures and apparatus configurations typical in the art.

CNT synthesis reactors in accordance with the various embodiments include the following features:

Rectangular Configured Synthesis Reactors:

The cross section of a typical CNT synthesis reactor known in the art is circular. There are a number of reasons for this including, for example, historical reasons (cylindrical reactors are often used in laboratories) and convenience (flow dynamics are easy to model in cylindrical reactors, heater systems readily accept circular tubes (quartz, etc.), and ease of manufacturing. Departing from the cylindrical convention, the present invention provides a CNT synthesis reactor having a rectangular cross section. The reasons for the departure are as follows: 1. Since many carbon fiber materials that can be processed by the reactor are relatively planar such as flat tape or sheet-like in form, a circular cross section is an inefficient use of the reactor volume. This inefficiency results in several drawbacks for cylindrical CNT synthesis reactors including, for example, a) maintaining a sufficient system purge; increased reactor volume requires increased gas flow rates to maintain the same level of gas purge. This results in a system that is inefficient for high volume production of CNTs in an open environment; b) increased carbon feedstock gas flow; the relative increase in inert gas flow, as per a) above, requires increased carbon feedstock gas flows. Consider that the volume of a 12K carbon fiber tow is 2000 times less than the total volume of a synthesis reactor having a rectangular cross section. In an equivalent growth cylindrical reactor (i.e., a cylindrical reactor that has a width that accommodates the same planarized carbon fiber material as the rectangular cross-section reactor), the volume of the carbon fiber material is 17,500 times less than the volume of the chamber. Although gas deposition processes, such as CVD, are typically governed by pressure and temperature alone, volume has a significant impact on the efficiency of deposition. With a rectangular reactor there is a still excess volume. This excess volume facilitates unwanted reactions; yet a cylindrical reactor has about eight times that volume. Due to this greater opportunity for competing reactions to occur, the desired reactions effectively occur more slowly in a cylindrical reactor chamber. Such a slow down in CNT growth, is problematic for the development of a continuous process. One benefit of a rectangular reactor configuration is that the reactor volume can be decreased by using a small height for the rectangular chamber to make this volume ratio better and reactions more efficient. In some embodiments of the present invention, the total volume of a rectangular synthesis reactor is no more than about 3000 times greater than the total volume of a carbon fiber material being passed through the synthesis reactor. In some further embodiments, the total volume of the rectangular synthesis reactor is no more than about 4000 times greater than the total volume of the carbon fiber material being passed through the synthesis reactor. In some still further embodiments, the total volume of the rectangular synthesis reactor is less than about 10,000 times greater than the total volume of the carbon fiber material being passed through the synthesis reactor. Additionally, it is notable that when using a cylindrical reactor, more carbon feedstock gas is required to provide the same flow percent as compared to reactors having a rectangular cross section. It should be appreciated that in some other embodiments, the synthesis reactor has a cross section that is described by polygonal forms that are not rectangular, but are relatively similar thereto and provide a similar reduction in reactor volume relative to a reactor having a circular cross section; c) problematic temperature distribution; when a relatively small-diameter reactor is used, the temperature gradient from the center of the chamber to the walls thereof is minimal. But with increased size, such as would be used for commercial-scale production, the temperature gradient increases. Such temperature gradients result in product quality variations across a carbon fiber material substrate (i.e., product quality varies as a function of radial position). This problem is substantially avoided when using a reactor having a rectangular cross section. In particular, when a planar substrate is used, reactor height can be maintained constant as the size of the substrate scales upward. Temperature gradients between the top and bottom of the reactor are essentially negligible and, as a consequence, thermal issues and the product-quality variations that result are avoided. 2. Gas introduction: Because tubular furnaces are normally employed in the art, typical CNT synthesis reactors introduce gas at one end and draw it through the reactor to the other end. In some embodiments disclosed herein, gas can be introduced at the center of the reactor or within a target growth zone, symmetrically, either through the sides or through the top and bottom plates of the reactor. This improves the overall CNT growth rate because the incoming feedstock gas is continuously replenishing at the hottest portion of the system, which is where CNT growth is most active. This constant gas replenishment is an important aspect to the increased growth rate exhibited by the rectangular CNT reactors.

Zoning.

Chambers that provide a relatively cool purge zone depend from both ends of the rectangular synthesis reactor. Applicants have determined that if hot gas were to mix with the external environment (i.e., outside of the reactor), there would be an increase in degradation of the carbon fiber material. The cool purge zones provide a buffer between the internal system and external environments. Typical CNT synthesis reactor configurations known in the art typically require that the substrate is carefully (and slowly) cooled. The cool purge zone at the exit of the present rectangular CNT growth reactor achieves the cooling in a short period of time, as required for the continuous in-line processing.

Non-Contact, Hot-Walled, Metallic Reactor.

In some embodiments, a hot-walled reactor is made of metal is employed, in particular stainless steel. This may appear counterintuitive because metal, and stainless steel in particular, is more susceptible to carbon deposition (i.e., soot and by-product formation). Thus, most CNT reactor configurations use quartz reactors because there is less carbon deposited, quartz is easier to clean, and quartz facilitates sample observation. However, Applicants have observed that the increased soot and carbon deposition on stainless steel results in more consistent, faster, more efficient, and more stable CNT growth. Without being bound by theory it has been indicated that, in conjunction with atmospheric operation, the CVD process occurring in the reactor is diffusion limited. That is, the catalyst is "overfed;" too much carbon is available in the reactor system due to its relatively higher partial pressure (than if the reactor was operating under partial vacuum). As a consequence, in an open system—especially a clean one—too much carbon can adhere to catalyst particles, compromising their ability to synthesize CNTs. In some embodiments, the rectangular reactor is intentionally run when the reactor is "dirty," that is with soot deposited on the metallic reactor walls. Once carbon deposits to a monolayer on the walls of the reactor, carbon will readily deposit over itself. Since some of the available carbon is "withdrawn" due to this mechanism, the remaining carbon feedstock, in the form of radicals, react with the catalyst at a rate that does not poison the catalyst. Existing systems run "cleanly" which, if they were open for continuous processing, would produced a much lower yield of CNTs at reduced growth rates.

Although it is generally beneficial to perform CNT synthesis "dirty" as described above, certain portions of the apparatus, such as gas manifolds and inlets, can nonetheless negatively impact the CNT growth process when soot created blockages. In order to combat this problem, such areas of the CNT growth reaction chamber can be protected with soot inhibiting coatings such as silica, alumina, or MgO. In practice, these portions of the apparatus can be dip-coated in these soot inhibiting coatings. Metals such as INVAR® can be used with these coatings as INVAR has a similar CTE (coefficient of thermal expansion) ensuring proper adhesion of the coating at higher temperatures, preventing the soot from significantly building up in critical zones.

Combined Catalyst Reduction and CNT Synthesis.

In the CNT synthesis reactor disclosed herein, both catalyst reduction and CNT growth occur within the reactor. This is significant because the reduction step cannot be accomplished timely enough for use in a continuous process if performed as a discrete operation. In a typical process known in the art, a reduction step typically takes 1-12 hours to perform. Both operations occur in a reactor in accordance with the present invention due, at least in part, to the fact that carbon feedstock gas is introduced at the center of the reactor, not the end as would be typical in the art using cylindrical reactors. The reduction process occurs as the fibers enter the heated zone; by this point, the gas has had time to react with the walls and cool off prior to reacting with the catalyst and causing the oxidation reduction (via hydrogen radical interactions). It is this transition region where the reduction occurs. At the hottest isothermal zone in the system, the CNT growth occurs, with the greatest growth rate occurring proximal to the gas inlets near the center of the reactor.

In some embodiments, when loosely affiliated carbon fiber materials, such as carbon tow are employed, the continuous process can include steps that spreads out the strands and/or filaments of the tow. Thus, as a tow is unspooled it can be spread using a vacuum-based fiber spreading system, for example. When employing sized carbon fibers, which can be relatively stiff, additional heating can be employed in order to "soften" the tow to facilitate fiber spreading. The spread fibers which comprise individual filaments can be spread apart sufficiently to expose an entire surface area of the filaments, thus allowing the tow to more efficiently react in subsequent process steps. Such spreading can approach between about 4 inches to about 6 inches across for a 3 k tow. The spread carbon tow can pass through a surface treatment step that is composed of a plasma system as described above. After a barrier coating is applied and roughened, spread fibers then can pass through a CNT-forming catalyst dip bath. The result is fibers of the carbon tow that have catalyst particles distributed radially on their surface. The catalyzed-laden fibers of the tow then enter an appropriate CNT growth chamber, such as the rectangular chamber described above, where a flow through atmospheric pressure CVD or PE-CVD process is used to synthesize the CNTs at rates as high as several microns per second. The fibers of the tow, now with radially aligned CNTs, exit the CNT growth reactor.

In some embodiments, CNT-infused carbon fiber materials can pass through yet another treatment process that, in some embodiments is a plasma process used to functionalize the CNTs. Additional functionalization of CNTs can be used to promote their adhesion to particular resins. Thus, in some embodiments, the present invention provides CNT-infused carbon fiber materials having functionalized CNTs.

As part of the continuous processing of spoolable carbon fiber materials, the a CNT-infused carbon fiber material can further pass through a sizing dip bath to apply any additional sizing agents which can be beneficial in a final product. Finally if wet winding is desired, the CNT-infused carbon fiber materials can be passed through a resin bath and wound on a mandrel or spool. The resulting carbon fiber material/resin combination locks the CNTs on the carbon fiber material allowing for easier handling and composite fabrication. In some embodiments, CNT infusion is used to provide improved filament winding. Thus, CNTs formed on carbon fibers such as carbon tow, are passed through a resin bath to produce resin-impregnated, CNT-infused carbon tow. After resin impregnation, the carbon tow can be positioned on the surface of a rotating mandrel by a delivery head. The tow can then be wound onto the mandrel in a precise geometric pattern in known fashion.

The winding process described above provides pipes, tubes, or other forms as are characteristically produced via a male mold. But the forms made from the winding process disclosed herein differ from those produced via conventional filament winding processes. Specifically, in the process disclosed herein, the forms are made from composites that include CNT-infused tow. Such forms will therefore benefit from enhanced strength and the like, as provided by the CNT-infused tow.

In some embodiments, a continuous process for infusion of CNTs on spoolable carbon fiber materials can achieve a linespeed between about 0.5 ft/min to about 36 ft/min. In this embodiment where the CNT growth chamber is 3 feet long and operating at a 750° C. growth temperature, the process can be run with a linespeed of about 6 ft/min to about 36 ft/min to produce, for example, CNTs having a length between about 1 micron to about 10 microns. The process can also be run with a linespeed of about 1 ft/min to about 6 ft/min to produce, for example, CNTs having a length between about 10 microns to about 100 microns. The process can be run with a linespeed of about 0.5 ft/min to about 1 ft/min to produce, for example, CNTs having a length between about 100 microns to about 200 microns. The CNT length is not tied only to linespeed and growth temperature, however, the flow rate of both the carbon feedstock and the inert carrier gases can also influence CNT length. For example, a flow rate consisting of less than 1% carbon feedstock in inert gas at high linespeeds (6 ft/min to 36 ft/min) will result in CNTs having a length between 1 micron to about 5 microns. A flow rate consisting of more than 1% carbon feedstock in inert gas at high linespeeds (6 ft/min to 36 ft/min) will result in CNTs having length between 5 microns to about 10 microns.

In some embodiments, more than one carbon material can be run simultaneously through the process. For example, multiple tapes tows, filaments, strand and the like can be run through the process in parallel. Thus, any number of prefabricated spools of carbon fiber material can be run in parallel through the process and re-spooled at the end of the process. The number of spooled carbon fiber materials that can be run in parallel can include one, two, three, four, five, six, up to any number that can be accommodated by the width of the CNT-growth reaction chamber. Moreover, when multiple carbon fiber materials are run through the process, the number of collection spools can be less than the number of spools at the start of the process. In such embodiments, carbon strands, tows, or the like can be sent through a further process of combining such carbon fiber materials into higher ordered carbon fiber materials such as woven fabrics or the like. The continuous process can also incorporate a post processing chopper that facilitates the formation CNT-infused chopped fiber mats, for example.

Processes of the invention for CNT infusion to fiber materials allow control of the CNT lengths with uniformity and in a continuous process allowing spoolable fiber materials to be functionalized with CNTs at high rates. With material residence times between 5 to 300 seconds, linespeeds in a continuous process for a system that is 3 feet long can be in a range anywhere from about 0.5 ft/min to about 36 ft/min and greater. The speed selected depends on various parameters as explained further below.

In some embodiments, a material residence time of about 5 to about 30 seconds can produce CNTs having a length between about 1 micron to about 10 microns. In some embodiments, a material residence time of about 30 to about 180 seconds can produce CNTs having a length between about 10 microns to about 100 microns. In still further embodiments, a material residence time of about 180 to about 300 seconds can produce CNTs having a length between about 100 microns to about 500 microns. One skilled in the art will recognize that these ranges are approximate and that CNT length can also be modulated by reaction temperatures, and carrier and carbon feedstock concentrations and flow rates.

In some embodiments, the present invention provides a shielded wire comprising a carbon nanostructure (CNS)-shielding layer comprising a CNS material in a matrix material, the CNS-shielding layer being monolithic and disposed about a dielectric layer and a conducting wire, wherein the dielectric layer is disposed between the CNS-shielding layer and the conducting wire. In some embodiments, the CNS-shielding layer is provided as a replacement for metal foils and/or braids typically employed in the art as an EMI shield.

Typical braided shields, such as those found in coaxial cables, while effective in providing EMI shielding at lower frequency ranges, are less and less effective as the frequency increases. The decreased effectiveness is due, at least in part, to gaps in the weave that allows RF energy to leak through the braided shield. The gaps left in the weave are typically described by percentage of optical coverage. The better the braid, the better the optical coverage.

Figure 21:
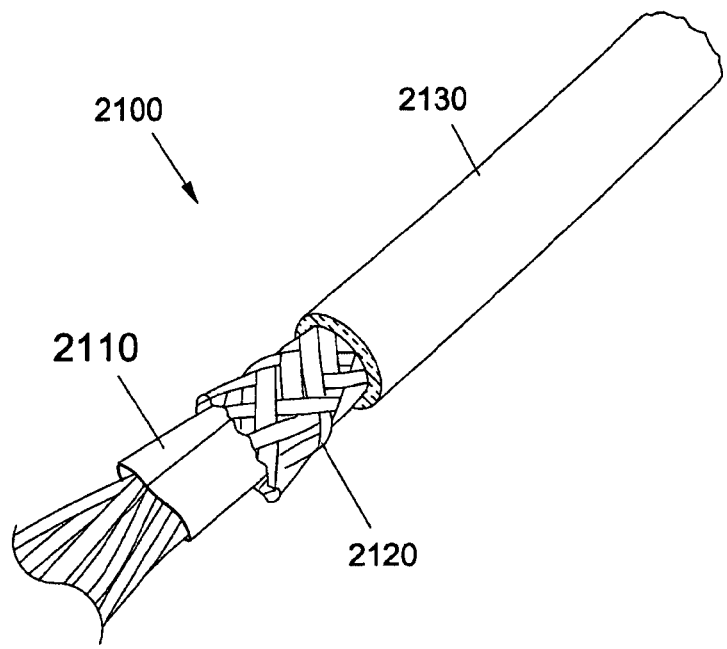
FIG. 21 shows a typical wire bundle 2100 with a foil 2110 that can be replaced with a CNS-shielding layer, in accordance with embodiments disclosed herein.
Figure 22:
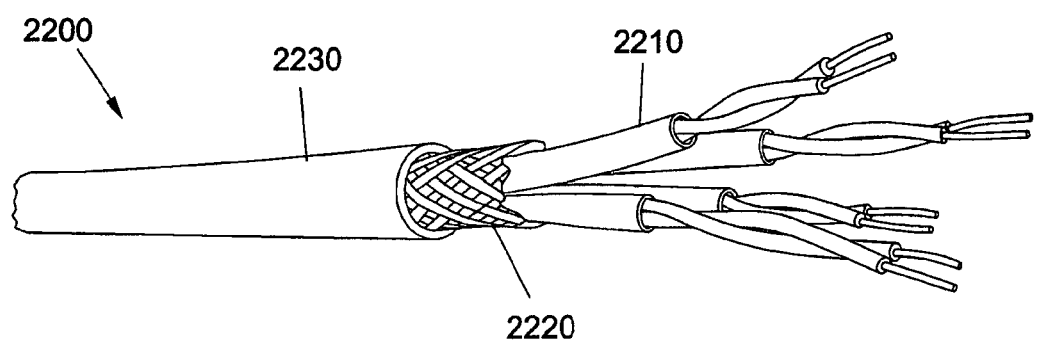
FIG. 22 shows a typical wire bundle 2200 with a foil 2210 that can be replaced with a CNS-shielding layer, in accordance with embodiments disclosed herein.

In order to mitigate the decreased effectiveness at higher frequencies, high-end cables typically metal foils or an aluminized Mylar are used as a supplement to the braided shield. Tapes of the foil materials are generally used to provide nearly 100% optical coverage. The tapes are twisted on, consequently resulting in a seam that provides less than 100% coverage. Foil layers can be either monolithic, such as shown in FIG. 21, or cover individual wire pairs, such as shown in FIG. 22. Use of these materials adds complexity and cost to the cable manufacture.

By placing CNS material into a polymer, such as PTFE, PVC and Mylar, it is possible to create an EMI shield that is integral to a cable jacket or an easily applied inner layer, to streamline manufacturing and reduce costs. Use of the CNS-laden thermoplastic resins can completely replace the use of foils and metalized tapes for high frequency shielding. Among other advantages, replacing metal foils can help reduce cable weight. In some embodiments, the use of foils can be completely eliminated and the CNS-laden thermoplastic resin can be used in existing extruded outer jackets by adding a thin inner layer to the insulative outer jacket, providing a new class of cable. In some embodiments, the present disclosure provides a method of manufacturing cable jackets with duel use. For example, by adding CNSs to water blocking thermoplastic resins, a wire cable can be both EMI-shielding and water resistant.

Figure 19:
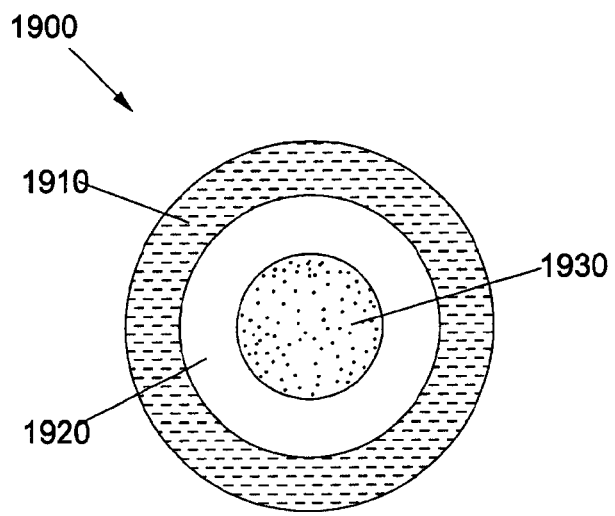
FIG. 19 shows a diagram of a conducting wire shielded with a CNS-shielding layer, in accordance with embodiments disclosed herein.
Figure 20:
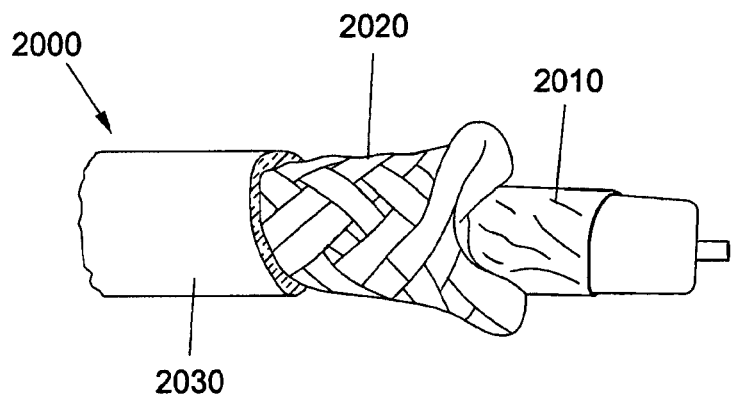
FIG. 20 shows a typical coaxial cable 2000 with a foil 2010 that can be replaced with a CNS-shielding layer, in accordance with embodiments disclosed herein.

Referring now to FIG. 19, there is shown a shielded wire 1900 in accordance with one exemplary embodiment. Shielded wire 1900 includes a carbon nanostructure (CNS)-shielding layer 1910 disposed about an optional dielectric layer 1920 and a conducting wire 1930. FIG. 20 shows a typical coaxial cable 2000 having a metal foil 2010 which is in an analogous configuration to CNS-shielding layer 1910 of FIG. 19. In accordance with embodiments disclosed herein, metal foil 2010 of coaxial cable 2000 can be replaced with CNS-shielding layer 1910, as in FIG. 19. Moreover, the location of the substituted CNS-shielding layer 1910 need not be limited to where metal foil 2010 appears in FIG. 20. In some embodiments, the CNS-shielding layer can be a separate layer disposed about braid 2020. In some embodiments, the CNS-shielding layer can be integrated as a layer on the inner surface of outer jacket 2030. In some embodiments, the CNS-shielding layer can be outer jacket 2030, i.e. the outer jacket can be directly extruded with CNS materials disclosed herein. In yet further embodiments, more than one CNS-shielding layer may be employed. For example, in some embodiments, outer jacket 2030 and replaced metal foil 2010 can both comprise a CNS-shielding layer. In yet still further embodiments, braid 2020 may also comprise CNSs.

While FIG. 19 shows just a single conducting wire 1930, one skilled in the art will recognize that CNS-shielding layer 1910 may encompass any number of wires. For example, as shown in FIG. 21, a wire bundle 2100 can include metal foil 2110, the metal foil being replaceable with CNS-shielding layer 1910 as in FIG. 19. Again, the location of the CNS-shielding layer in FIG. 21 need be limited to where metal foil 2110 is shown. In some embodiments, the CNS-shielding layer can be a separate layer disposed about braid 2120. In some embodiments, the CNS-shielding layer can be integrated as a layer on the inner surface of outer jacket 2130. In some embodiments, the CNS-shielding layer can be outer jacket 2130, i.e. the outer jacket can be directly extruded with CNS materials disclosed herein. In yet further embodiments, more than one CNS-shielding layer may be employed. For example, in some embodiments, outer jacket 2130 and replaced metal foil 2110 can both comprise a CNS-shielding layer. In yet still further embodiments, braid 2120 may also comprise CNSs.

In yet a further example, FIG. 22 shows a cable 2200 which has paired wires each wrapped with metal foil 2210. Metal foil 2210 can be replaced with a CNS-shielding layer consistent with embodiments disclosed herein above. Thus, the location of the CNS-shielding layer in FIG. 22 need be limited to where metal foil 2210 is shown. In some embodiments, the CNS-shielding layer can be a separate layer disposed about braid 2220. In some embodiments, the CNS-shielding layer can be integrated as a layer on the inner surface of outer jacket 2230. In some embodiments, the CNS-shielding layer can be outer jacket 2230, i.e. the outer jacket can be directly extruded with CNS materials disclosed herein. In yet further embodiments, more than one CNS-shielding layer may be employed. For example, in some embodiments, outer jacket 2230 and replaced metal foil 2210 can both comprise a CNS-shielding layer. In yet still further embodiments, braid 2220 may also comprise CNSs. In some embodiments, the present invention provides a cable system comprising a CNS-infused layer disposed about a twisted wire pair.

In some embodiments, shielded wires disclosed herein can further comprise a braided shield as shown in FIGS. 20-22. In some such embodiments, the braided shield can disposed about the CNS-shielding layer. In other embodiments, the braided shield can be disposed between the CNS-shielding layer and the dielectric layer. In still further embodiments, the braided shield further comprises a second CNS material. In some embodiments, a CNS-shielding layer can replace a braided shield.

In some embodiments, shielded wires disclosed herein may employ a CNS material that comprises a CNS-infused fiber material. In some such embodiments, the CNS-infused fiber material comprises glass or carbon fiber. In some embodiments, the CNS-infused fiber material comprises a chopped fiber. In other embodiments, the CNS-infused fiber material comprises a continuous fiber. In yet further embodiments, harvested CNSs may be compounded into a thermoplastic resin to form a CNS-shielding layer. In such embodiments, the CNSs should be considered distinct from loose CNTs and are characterized by the complex morphology described herein above. Moreover, in some embodiments, the CNSs employed herein can comprise elements of single-walled carbon nanotubes, double-walled carbon nanotubes, multi-walled carbon nanotubes, or mixtures thereof. Although the CNS structure comprises elements of CNTs in various forms, it is distinct from arrays of individual CNTs by way of the complex morphology including shared walls, crosslinking, branching, and combinations thereof.

CNSs of the CNS-shielding layers disclosed herein can come in numerous lengths consistent with embodiments disclosed herein for both mechanical and electrical and thermal conductivity applications. Thus, CNSs can vary in length ranging from about 1 micron to about 500 microns, including 1 micron, 2 microns, 3 microns, 4 micron, 5, microns, 6, microns, 7 microns, 8 microns, 9 microns, 10 microns, 15 microns, 20 microns, 25 microns, 30 microns, 35 microns, 40 microns, 45 microns, 50 microns, 60 microns, 70 microns, 80 microns, 90 microns, 100 microns, 150 microns, 200 microns, 250 microns, 300 microns, 350 microns, 400 microns, 450 microns, 500 microns, and all values in between. CNTs can also be less than about 1 micron in length, including about 0.5 microns, for example. CNTs can also be greater than 500 microns, including for example, 510 microns, 520 microns, 550 microns, 600 microns, 700 microns and all values in between and fractions thereof.

In some embodiments, CNSs employed in CNS-shielding layers may be functionalized. In some such embodiments, functionalization can serve as means by which the CNS structure can be covalently bonded to the thermoplastic resin in which it is incorporated.

In some embodiments, the shielded wires disclosed herein may employ a matrix material that comprises a thermoplastic or thermoset resin, as disclosed herein. In some embodiments, the matrix material can be a polyolefins. In some embodiments, the matrix material can be polyvinyl Chloride (PVC), polyethylene, polypropylene, neoprene, chlorosulphonated polyethylene, thermoplastic CPE, low smoke zero halogen, plenum, a thermoplastic elastomer, ethylene chlorotrifluoroethylene (ECTFE), polyvinylidene fluoride (PVDF), ethylene tetrafluoroethylene (ETFE), fluoropolymer Resin—FEP/PFA, ethylene-propylene-diene monomer rubber (EPDM), nylon, silicone, rubber, polyurethane, cellular polyolefins, fluorocarbons, ethylene propylene rubber, cross-linked polyethylene insulation (XLPE), or combinations thereof. In some such combinations, the matrix materials may be, for example, co-extruded. In some embodiments, any of the aforementioned materials may also be cross-linked to a desired degree as understood by those skilled in the art. Such degree of cross-linking may be selected based on targeted properties. By way of a non-limiting example, a matrix material may be beneficially flexibile and deformable. In some embodiments, the resin is melt processed, although any standard technique for processing may be employed.

In some embodiments, the matrix material comprises a thermoplastic resin that is shrinkable, either with heat or UV irradiation. In some embodiments, the shrinkable thermoplastic is cold shrinkable. Shrinkable thermoplastic resins may be based on, for example, fluoropolymers such as PTFE, Viton, polyvinylidene fluoride (PVDF), fluorinated ethylene propylene (FEP), silicone rubber, PVC, and other polyolefin materials. In some embodiments, a shrinkable material may be based on an elastomer. In some such embodiments, the elastomer may be selected from natural polyisoprene: cis-1, 4-polyisoprene natural rubber (NR) and trans-1,4-polyisoprene gutta-percha, Synthetic polyisoprene (IR for Isoprene Rubber), polybutadiene (BR-butadiene rubber), chloroprene rubber (CR), polychloroprene, neoprene, Baypren, butyl rubber (copolymer of isobutylene and isoprene, IIR), halogenated butyl rubbers (chloro butyl rubber: CIIR; bromo butyl rubber: BIIR), styrene-butadiene rubber (copolymer of styrene and butadiene, SBR), nitrile rubber (copolymer of butadiene and acrylonitrile, NBR), also called Buna N rubbers, hydrogenated nitrile rubbers (HNBR) Therban and Zetpol, EPM (ethylene propylene rubber, a copolymer of ethylene and propylene) and EPDM rubber (ethylene propylene diene rubber, a terpolymer of ethylene, propylene and a diene-component) epichlorohydrin rubber (ECO), polyacrylic rubber (ACM, ABR), silicone rubber (SI, Q, VMQ), fluorosilicone rubber (FVMQ), fluoroelastomers (FKM, and FEPM) Viton, Tecnoflon, Fluorel, Aflas and Dai-El, perfluoroelastomers (FFKM) Tecnoflon PFR, Kalrez, Chemraz, Perlast, polyether block amides (PEBA), chlorosulfonated polyethylene (CSM), (Hypalon), ethylene-vinyl acetate (EVA), thermoplastic elastomers (TPE), resilin, elastin, and polysulfide rubber.

In some such embodiments, the matrix material comprises a polymer selected from the group consisting of polyethylene terephthalate (PET, Mylar), polytetrafluoroethylene (PTFE), and polyvinyl chloride (PVC). Other resins will be recognized by those skilled in the art as appropriate for use in various cable applications disclosed herein. In some embodiments, the shielded wires disclosed herein may employ a (CNS)-shielding layer that includes in the matrix material a water blocking material. In some such embodiments, the matrix material itself is water blocking, or a water blocking additive may be included with the matrix material. One such exemplary water blocking material is poly latex. Other water blocking additives will be apparent to the skilled artisan and include various polymers and homopolymers, polyesters, Thixotropic P-90-Gel, MP Silicone, propylene thermafill, amorphous polyalpha olefins copolymers, Nylon, butyl buffer, polyisobutylene, bitumen, and other synthetic resins, synthetic polymers, and highly refined mineral oil, in any combination.

In some embodiments, the present invention provides an extruded thermoplastic jacket comprising a CNS material, the extruded thermoplastic jacket being configured to protect at least one wire. Extruded thermoplastic jackets of the invention are used in wire protection applications described herein, such as for EMI shielding, or dual function water resistance and EMI shielding. In some embodiments, extruded thermoplastic jackets disclosed herein may employ a CNS material that is harvested from a substrate on which the CNS material is fabricated. In other embodiments, the CNS material is infused on a chopped fiber. In some such embodiments, the chopped fiber comprises glass or carbon. In some embodiments, the extruded thermoplastic jackets disclosed herein further comprise a water blocking additive. In some embodiments, extruded thermoplastic jackets can be of a size appropriate for single wires, wire bundles, wire bundles comprising a dielectric coating, and the like.

In some embodiments, extruded thermoplastic jackets can provided in shapes configured to provide EMI shielding for non-wire articles. Thus, in some embodiments, the present invention provides a thermoplastic article comprising a CNS-infused fiber material and a flexible thermoplastic resin comprising at least one selected from the group consisting of polyethylene terephthalate (PET, Mylar), polytetrafluoroethylene (PTFE), and polyvinyl chloride (PVC). Because these thermoplastic resins are highly flexible articles other than shielded wires are readily accessible such as computer components. Articles of the invention can also be included in items such as clothing or at flexible mechanical joints. In some embodiments, such thermoplastic articles can further comprise a water blocking additive, again providing a dual role to the CNS-laden thermoplastic resin.

Example I

This example shows how a carbon fiber material can be infused with CNTs in a continuous process to target enhanced EMI shielding characterisitics.

In this example, the maximum loading of CNTs on fibers is targeted. 34-700 12 k carbon fiber tow with a tex value of 800 (Grafil Inc., Sacramento, Calif.) is implemented as the carbon fiber substrate. The individual filaments in this carbon fiber tow have a diameter of approximately 7 μm.

Figure 12:
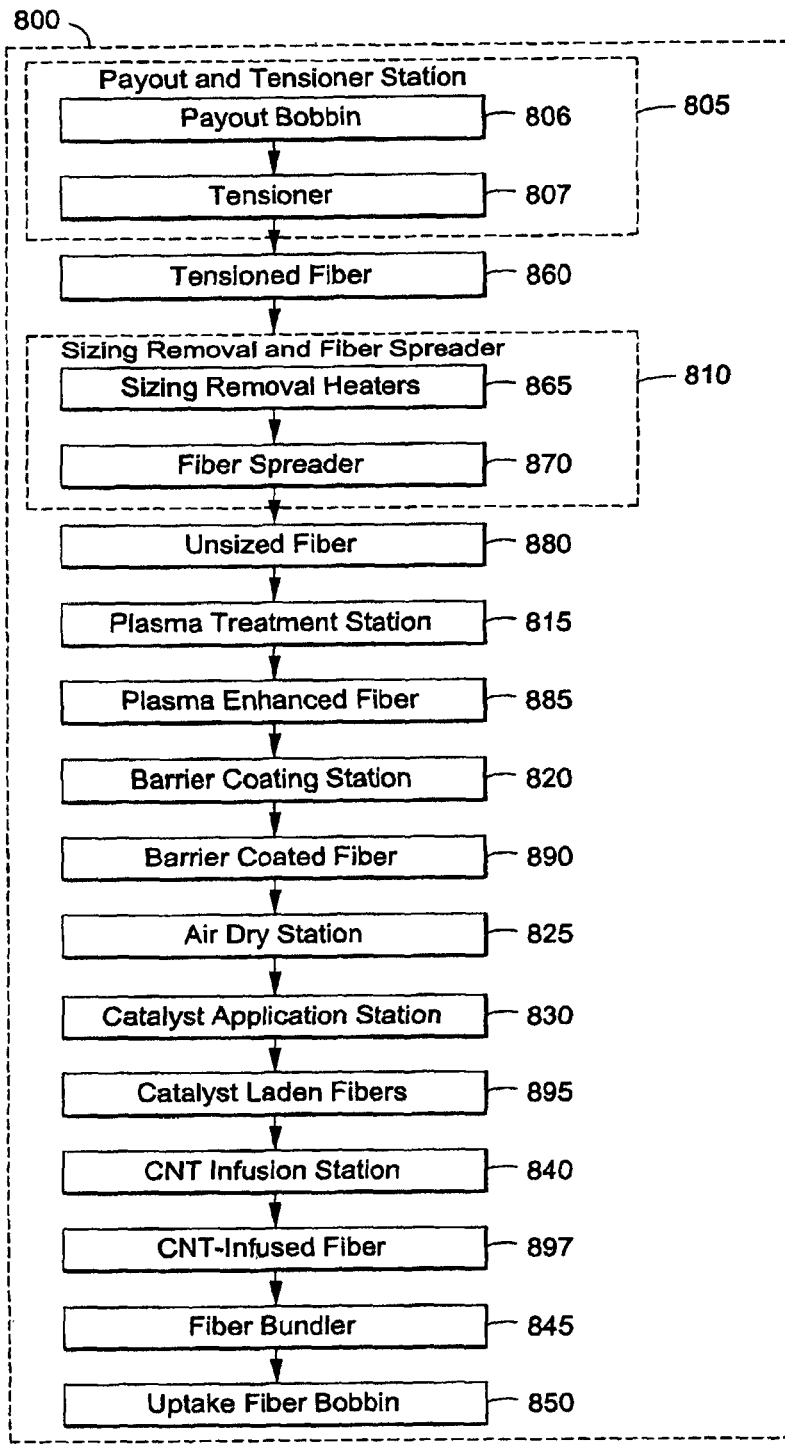
FIG. 12 shows how a carbon fiber material can be infused with CNTs in a continuous process to target thermal and electrical conductivity improvements, including EMI shielding.

FIG. 12 depicts system 800 for producing CNT-infused fiber in accordance with the illustrative embodiment of the present invention. System 800 includes a carbon fiber material payout and tensioner station 805, sizing removal and fiber spreader station 810, plasma treatment station 815, barrier coating application station 820, air dry station 825, catalyst application station 830, solvent flash-off station 835, CNT-infusion station 840, fiber bundler station 845, and carbon fiber material uptake bobbin 850, interrelated as shown.

Payout and tension station 805 includes payout bobbin 806 and tensioner 807. The payout bobbin delivers carbon fiber material 860 to the process; the fiber is tensioned via tensioner 807. For this example, the carbon fiber is processed at a linespeed of 2 ft/min.

Fiber material 860 is delivered to sizing removal and fiber spreader station 810 which includes sizing removal heaters 865 and fiber spreader 870. At this station, any "sizing" that is on fiber 860 is removed. Typically, removal is accomplished by burning the sizing off of the fiber. Any of a variety of heating means can be used for this purpose, including, for example, an infrared heater, a muffle furnace, and other non-contact heating processes. Sizing removal can also be accomplished chemically. The fiber spreader separates the individual elements of the fiber. Various techniques and apparatuses can be used to spread fiber, such as pulling the fiber over and under flat, uniform-diameter bars, or over and under variable-diameter bars, or over bars with radially-expanding grooves and a kneading roller, over a vibratory bar, etc. Spreading the fiber enhances the effectiveness of downstream operations, such as plasma application, barrier coating application, and catalyst application, by exposing more fiber surface area.

Multiple sizing removal heaters 865 can be placed throughout the fiber spreader 870 which allows for gradual, simultaneous desizing and spreading of the fibers. Payout and tension station 805 and sizing removal and fiber spreader station 810 are routinely used in the fiber industry; those skilled in the art will be familiar with their design and use.

The temperature and time required for burning off the sizing vary as a function of (1) the sizing material and (2) the commercial source/identity of carbon fiber material 860. A conventional sizing on a carbon fiber material can be removed at about 650° C. At this temperature, it can take as long as 15 minutes to ensure a complete burn off of the sizing. Increasing the temperature above this burn temperature can reduce burn-off time. Thermogravimetric analysis is used to determine minimum burn-off temperature for sizing for a particular commercial product.

Depending on the timing required for sizing removal, sizing removal heaters may not necessarily be included in the CNT-infusion process proper; rather, removal can be performed separately (e.g., in parallel, etc.). In this way, an inventory of sizing-free carbon fiber material can be accumulated and spooled for use in a CNT-infused fiber production line that does not include fiber removal heaters. The sizing-free fiber is then spooled in payout and tension station 805. This production line can be operated at higher speed than one that includes sizing removal.

Unsized fiber 880 is delivered to plasma treatment station 815. For this example, atmospheric plasma treatment is utilized in a 'downstream' manner from a distance of 1 mm from the spread carbon fiber material. The gaseous feedstock is comprised of 100% helium.

Plasma enhanced fiber 885 is delivered to barrier coating station 820. In this illustrative example, a siloxane-based barrier coating solution is employed in a dip coating configuration. The solution is 'Accuglass T-11 Spin-On Glass' (Honeywell International Inc., Morristown, N.J.) diluted in isopropyl alcohol by a dilution rate of 40 to 1 by volume. The resulting barrier coating thickness on the carbon fiber material is approximately 40 nm. The barrier coating can be applied at room temperature in the ambient environment.

Barrier coated carbon fiber 890 is delivered to air dry station 825 for partial curing of the nanoscale barrier coating. The air dry station sends a stream of heated air across the entire carbon fiber spread. Temperatures employed can be in the range of 100° C. to about 500° C.

After air drying, barrier coated carbon fiber 890 is delivered to catalyst application station 830. In this example, an iron oxide-based CNT forming catalyst solution is employed in a dip coating configuration. The solution is 'EFH-1' (Ferrotec Corporation, Bedford, N.H.) diluted in hexane by a dilution rate of 200 to 1 by volume. A monolayer of catalyst coating is achieved on the carbon fiber material. 'EFH-1' prior to dilution has a nanoparticle concentration ranging from 3-15% by volume. The iron oxide nanoparticles are of composition $Fe_2O_3$ and $Fe_3O_4$ and are approximately 8 nm in diameter.

Catalyst-laden carbon fiber material 895 is delivered to solvent flash-off station 835. The solvent flash-off station sends a stream of air across the entire carbon fiber spread. In this example, room temperature air can be employed in order to flash-off all hexane left on the catalyst-laden carbon fiber material.

After solvent flash-off, catalyst-laden fiber 895 is finally advanced to CNT-infusion station 840. In this example, a rectangular reactor with a 12 inch growth zone is used to employ CVD growth at atmospheric pressure. 97.6% of the total gas flow is inert gas (Nitrogen) and the other 2.4% is the carbon feedstock (acetylene). The growth zone is held at 750° C. For the rectangular reactor mentioned above, 750° C. is a relatively high growth temperature, which allows for the highest growth rates possible.

After CNT-infusion, CNT-infused fiber 897 is re-bundled at fiber bundler station 845. This operation recombines the individual strands of the fiber, effectively reversing the spreading operation that was conducted at station 810.

The bundled, CNT-infused fiber 897 is wound about uptake fiber bobbin 850 for storage. CNT-infused fiber 897 is loaded with CNTs approximately 60 μm in length and is then ready for use in composites with enhanced EMI shielding capabilities.

CNT infused fiber 897 on fiber bobbin 850 is rewound into a panel and infused with epoxy resin. The infused composite structure is then cured in an autoclave at a pressure of 100 psi temperatures above 250° F. at a specific profile required for the selected epoxy resin system. The resulting CNT-infused composite panel exhibits an average EMI SE of 83 dB from 2-18 GHz as represented by Panel #132 in FIG. 14.

It is noteworthy that some of the operations described above can be conducted under inert atmosphere or vacuum for environmental isolation. For example, if sizing is being burned off of a carbon fiber material, the fiber can be environmentally isolated to contain off-gassing and prevent damage from moisture. For convenience, in system 800, environmental isolation is provided for all operations, with the exception of carbon fiber material payout and tensioning, at the beginning of the production line, and fiber uptake, at the end of the production line.

Example II

This example shows how a nascent glass fiber material can be infused with CNTs in a continuous process for applications requiring enhanced EMI shielding characteristics.

Figure 13:
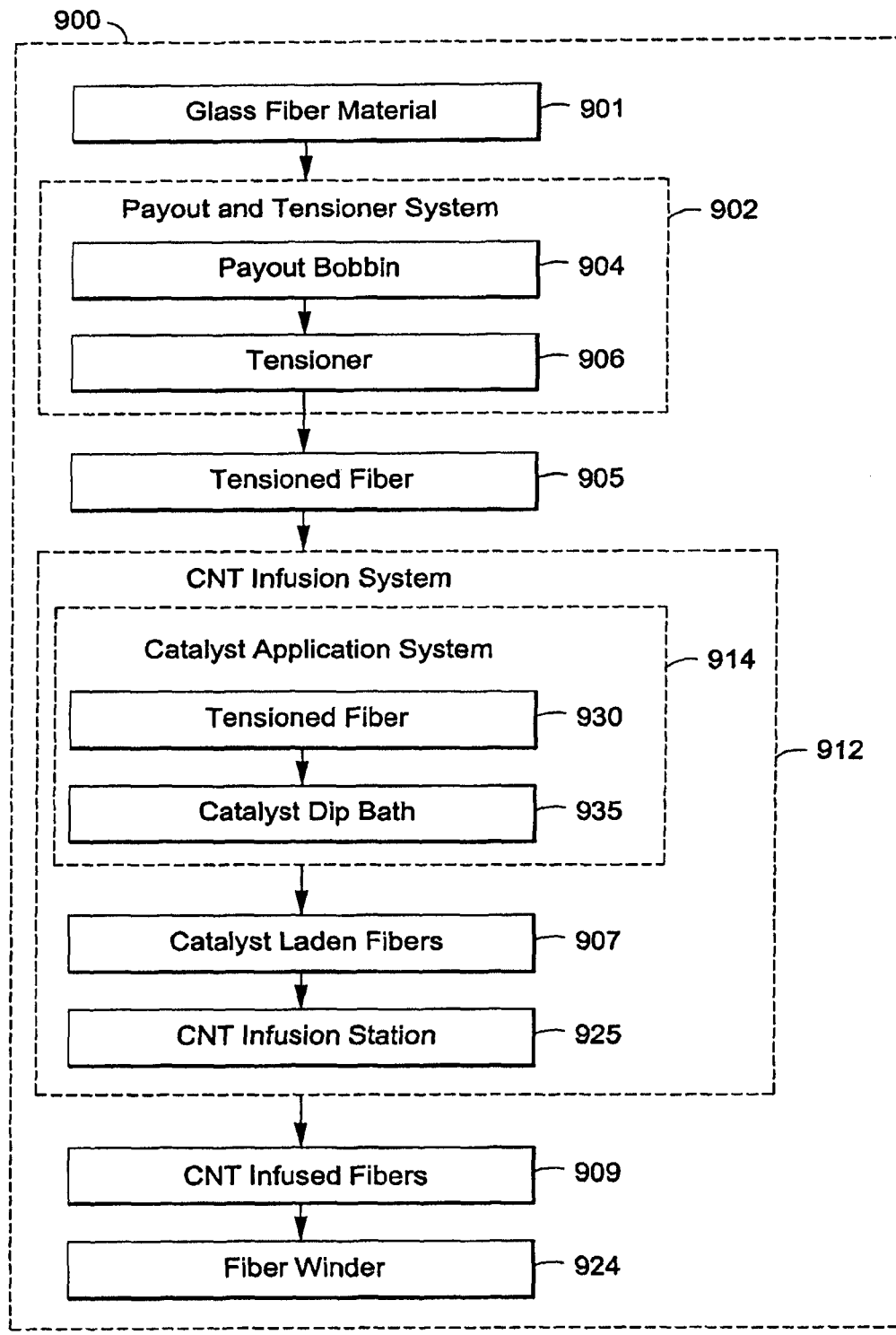
FIG. 13 shows how a glass fiber material can be infused with CNTs in a continuous process to target thermal and electrical conductivity improvements, including EMI shielding.

FIG. 13 depicts system 900 for producing CNT-infused fiber in accordance with the illustrative embodiment of the present invention. System 900 includes a glass fiber material payout and tensioner system 902, CNT-infusion system 912, and fiber winder 924, interrelated as shown.

Payout and tension system 902 includes payout bobbin 904 and tensioner 906. The payout bobbin holds fiber spools and delivers glass fiber material 901 to the process at a linespeed of 1 ft/min; the fiber tension is maintained within 1-5 lbs via tensioner 906. Payout and tension station 902 is routinely used in the fiber industry; those skilled in the art will be familiar with their design and use.

Tensioned fiber 905 is delivered to CNT-infusion system 912. Station 912 includes catalyst application system 914 and micro-cavity CVD based CNT infusion station 925.

In this illustrative example, the catalyst solution is applied via a dip process, such as by passing tensioned fiber 930 through a dip bath 935. In this example, a catalyst solution consisting of a volumetric ratio of 1 part ferrofluid nanoparticle solution and 200 parts hexane is used. At the process linespeed for CNT-infused fiber targeted at improving ILSS, the fiber will remain in the dip bath for 30 seconds. The catalyst can be applied at room temperature in the ambient environment with neither vacuum nor an inert atmosphere required.

Catalyst laden glass fiber 907 is then advanced to the CNT infusion station 925 consisting of a pre-growth cool inert gas purge zone, a CNT growth zone, and a post-growth gas purge zone. Room temperature nitrogen gas is introduced to the pre-growth purge zone in order to cool exiting gas from the CNT growth zone as described above. The exiting gas is cooled to below 350° C. via the rapid nitrogen purge to prevent fiber oxidation. Fibers enter the CNT growth zone where elevated temperatures heat a mixture of 98% mass flow inert gas (nitrogen) and 2% mass flow carbon containing feedstock gas (acetylene) which is introduced centrally via a gas manifold. In this example the length of the system is 2.5 feet long and the temperature in the CNT growth zone is 750° C. Catalyst laden fibers are exposed to the CNT growth environment for 60 seconds in this example, resulting in 60 micron long with a 2.5% volume percentage CNTs infused to the glass fiber surface. The CNT-infused glass fibers finally pass through the post-growth purge zone which at 350° C. cools the fiber as well as the exiting gas to prevent oxidation to the fiber surface and CNTs.

CNT-infused fiber 909 is collected on fiber winder 924 and then ready for use in any of a variety of applications which require improved EMI shielding capability.

CNT infused fiber 909 is wet wound on a frame using an epoxy resin. The frame is used to align the fibers in a 0° and 90° orientation for the resulting panel. When the fibers are wound on the panel, the composite is cured in a heated cavity press at pressure of 200 psi and temperatures above 250° F. at a temperature profile specific to the epoxy resin system used. The resulting panel yield improved average EMI SE of 92 dB between 2-18 GHz, with a CNT weight % of more than 6.5% in composite as shown by panel #220 in FIG. 15.

It is to be understood that the above-described embodiments are merely illustrative of the present invention and that many variations of the above-described embodiments can be devised by those skilled in the art without departing from the scope of the invention. For example, in this Specification, numerous specific details are provided in order to provide a thorough description and understanding of the illustrative embodiments of the present invention. Those skilled in the art will recognize, however, that the invention can be practiced without one or more of those details, or with other processes, materials, components, etc.

Furthermore, in some instances, well-known structures, materials, or operations are not shown or described in detail to avoid obscuring aspects of the illustrative embodiments. It is understood that the various embodiments shown in the Figures are illustrative, and are not necessarily drawn to scale. Reference throughout the specification to "one embodiment" or "an embodiment" or "some embodiments" means that a particular feature, structure, material, or characteristic described in connection with the embodiment(s) is included in at least one embodiment of the present invention, but not necessarily all embodiments. Consequently, the appearances of the phrase "in one embodiment," "in an embodiment," or "in some embodiments" in various places throughout the Specification are not necessarily all referring to the same embodiment. Furthermore, the particular features, structures, materials, or characteristics can be combined in any suitable manner in one or more embodiments. It is therefore intended that such variations be included within the scope of the following claims and their equivalents.

What is claimed is:

1. A shielded wire comprising:
    a carbon nanostructure (CNS)-shielding layer comprising a CNS material in a matrix material, the CNS-shielding layer being monolithic and disposed about a conducting wire and an optional dielectric layer, wherein when the dielectric layer is present, it is disposed between the CNS-shielding layer and the conducting wire;
        wherein the CNS material comprises individual carbon nanotubes, shared-wall carbon nanotubes, branched carbon nanotubes, and crosslinked carbon nanotubes in a random distribution; and
    a braided shield comprising a second CNS material;
        wherein the second CNS material comprises individual carbon nanotubes, shared-wall carbon nanotubes, branched carbon nanotubes, and crosslinked carbon nanotubes in a random distribution.

2. The shielded wire of claim 1, wherein the braided shield is disposed about the CNS-shielding layer.

3. The shielded wire of claim 1, wherein the braided shield is disposed between the CNS-shielding layer and the dielectric layer.

4. The shielded wire of claim 1, wherein the CNS material comprises a CNS-infused fiber material.

5. The shielded wire of claim 4, wherein the CNS-infused fiber material comprises glass or carbon fiber.

6. The shielded wire of claim 4, wherein the CNS-infused fiber material comprises a chopped fiber.

7. The shielded wire of claim 4, wherein the CNS-infused fiber material comprises a continuous fiber.

8. The shielded wire of claim 1, wherein the matrix material comprises a thermoplastic or thermoset resin.

9. The shielded wire of claim 1, wherein the matrix material comprises a polymer selected from the group consisting of polyethylene terephthalate (PET), polytetrafluoroethylene (PTFE), and polyvinyl chloride (PVC).

10. The shielded wire of claim 1, wherein the shielded wire is configured as a coaxial cable.

11. The shielded wire of claim 1, wherein the CNS-shielding layer further comprises a water blocking material.

* * * * *